(12) United States Patent
Sonohara et al.

(10) Patent No.: US 12,127,391 B2
(45) Date of Patent: Oct. 22, 2024

(54) SEMICONDUCTOR MEMORY DEVICE

(71) Applicant: Kioxia Corporation, Tokyo (JP)

(72) Inventors: Teruhisa Sonohara, Yokkaichi Mie (JP); Shunichi Seno, Yokkaichi Mie (JP); Hiroki Tokuhira, Kawasaki Kanagawa (JP); Fumitaka Arai, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/458,054

(22) Filed: Aug. 29, 2023

(65) Prior Publication Data

US 2023/0413516 A1 Dec. 21, 2023

Related U.S. Application Data

(62) Division of application No. 17/472,902, filed on Sep. 13, 2021, now Pat. No. 11,778,808.

(30) Foreign Application Priority Data

Apr. 5, 2021 (JP) ................................. 2021-064476

(51) Int. Cl.
*G11C 11/24* (2006.01)
*G11C 11/406* (2006.01)
(Continued)

(52) U.S. Cl.
CPC ........ *H10B 12/30* (2023.02); *G11C 11/40615* (2013.01); *G11C 11/4076* (2013.01);
(Continued)

(58) Field of Classification Search
CPC ........ H10B 12/30; H10B 12/05; H10B 12/03; G11C 11/40615; G11C 11/4076;
(Continued)

(56) References Cited

U.S. PATENT DOCUMENTS 1,148,974 A * 8/1915 Kuhn et al. .......... B23D 45/024
198/515
5,418,742 A 5/1995 Asano
(Continued)

FOREIGN PATENT DOCUMENTS

JP H07-045716 A 2/1995
JP 2624864 B2 6/1997
(Continued)

OTHER PUBLICATIONS

Hideto Horii, et al., "Thyristor Operation for High Speed Read / Program Performance in 3D Flash Memory with Highly Stacked WL-Layers", 2020 IEEE International Memory Workshop (IMW), May 17-20, 2020 (4 pages).
(Continued)

*Primary Examiner* — Viet Q Nguyen
(74) *Attorney, Agent, or Firm* — Foley & Lardner LLP

(57) ABSTRACT

A semiconductor memory device includes: a first wiring; a first semiconductor layer connected to the first wiring, the first semiconductor layer; a first electrode, the first electrode being connected to the first semiconductor layer; a second electrode disposed between the first electrode and the first wiring, the second electrode being opposed to the first semiconductor layer; a third electrode disposed between the second electrode and the first wiring, the third electrode; a second semiconductor layer disposed between the third electrode and the first semiconductor layer, the second semiconductor layer being opposed to the third electrode; and an electric charge accumulating layer electrically connected to the first wiring via the second semiconductor layer, the electric charge accumulating layer being opposed to the first semiconductor layer.

20 Claims, 34 Drawing Sheets

(51) Int. Cl.
  *G11C 11/4076* (2006.01)
  *G11C 11/4096* (2006.01)
  *H01L 21/02* (2006.01)
  *H01L 29/66* (2006.01)
  *H01L 29/786* (2006.01)
  *H10B 12/00* (2023.01)

(52) U.S. Cl.
  CPC .... *G11C 11/4096* (2013.01); *H01L 21/02565* (2013.01); *H01L 29/66969* (2013.01); *H01L 29/7869* (2013.01); *H10B 12/03* (2023.02); *H10B 12/05* (2023.02)

(58) Field of Classification Search
  CPC .......... G11C 11/4096; H01L 21/02565; H01L 29/66969; H01L 29/7869
  USPC ........................................................ 365/149
  See application file for complete search history.

(56) References Cited

U.S. PATENT DOCUMENTS

| | | | |
|---|---|---|---|
| 6,888,755 B2 | 5/2005 | Harari | |
| 7,847,342 B2* | 12/2010 | Fukuzumi | H10B 41/27 257/326 |
| 8,450,783 B2 | 5/2013 | Yamazaki et al. | |
| 9,018,696 B2* | 4/2015 | Wada | H10B 41/20 257/314 |
| 9,196,345 B2 | 11/2015 | Inoue et al. | |
| 10,043,808 B1 | 8/2018 | Tezuka et al. | |
| 10,211,223 B2* | 2/2019 | Van Houdt | H10B 51/30 |
| 10,312,239 B2* | 6/2019 | Tezuka | H01L 29/7869 |
| 10,607,995 B2 | 3/2020 | Roberts et al. | |
| 11,428,974 B2 | 8/2022 | Shishido et al. | |
| 2006/0018161 A1 | 1/2006 | Chen et al. | |
| 2007/0247906 A1 | 10/2007 | Watanabe et al. | |
| 2014/0319518 A1 | 10/2014 | Furutani et al. | |
| 2017/0148517 A1 | 5/2017 | Harari | |
| 2019/0296155 A1 | 9/2019 | Sawabe et al. | |
| 2019/0371821 A1 | 12/2019 | Yamazaki et al. | |
| 2020/0091236 A1* | 3/2020 | Hokazono | H10N 70/20 |
| 2020/0126991 A1* | 4/2020 | Yamazaki | H01L 29/7869 |
| 2020/0161309 A1* | 5/2020 | Asami | H01L 29/24 |

FOREIGN PATENT DOCUMENTS

| | | |
|---|---|---|
| JP | 4791868 B2 | 10/2011 |
| JP | 4933048 B2 | 5/2012 |
| JP | 5604291 B2 | 10/2014 |
| JP | 2015-008030 A | 1/2015 |
| JP | 2018-157205 A | 10/2018 |
| JP | 2018-157208 A | 10/2018 |

OTHER PUBLICATIONS

Jing Wan, et al., "Z2-FET Used as 1-Transistor High-Speed DRAM", 2012 Proceedings of the European Solid-State Device Research Conference (ESSDERC), Sep. 17-21, 2012 (pp. 197-200).

Sung-Min Joe, et al., "Diode-Type NAND Flash Memory Cell String Having Super-Steep Switching Slope Based on Positive Feedback", IEEE Transactions on Electron Devices, Apr. 2016, vol. 63, No. 4 (pp. 1533-1538).

US Notice of Allowance on U.S. Appl. No. 17/472,902 dated May 24, 2023 (9 pages).

* cited by examiner

SEMICONDUCTOR MEMORY DEVICE

CROSS-REFERENCE TO RELATED APPLICATIONS

This application is a division of U.S. patent application Ser. No. 17/472,902, filed on Sep. 13, 2021, which is based upon and claims the benefit of Japanese Patent Application No. 2021-064476, filed on Apr. 5, 2021, the entire contents of which are incorporated herein by reference.

FIELD

Background

Embodiments described herein relate generally to a semiconductor memory device.

Description of the Related Art

There has been known a semiconductor memory device where a plurality of memory cells are stacked in a direction intersecting with a surface of a substrate.

DETAILED DESCRIPTION

Figure 1:
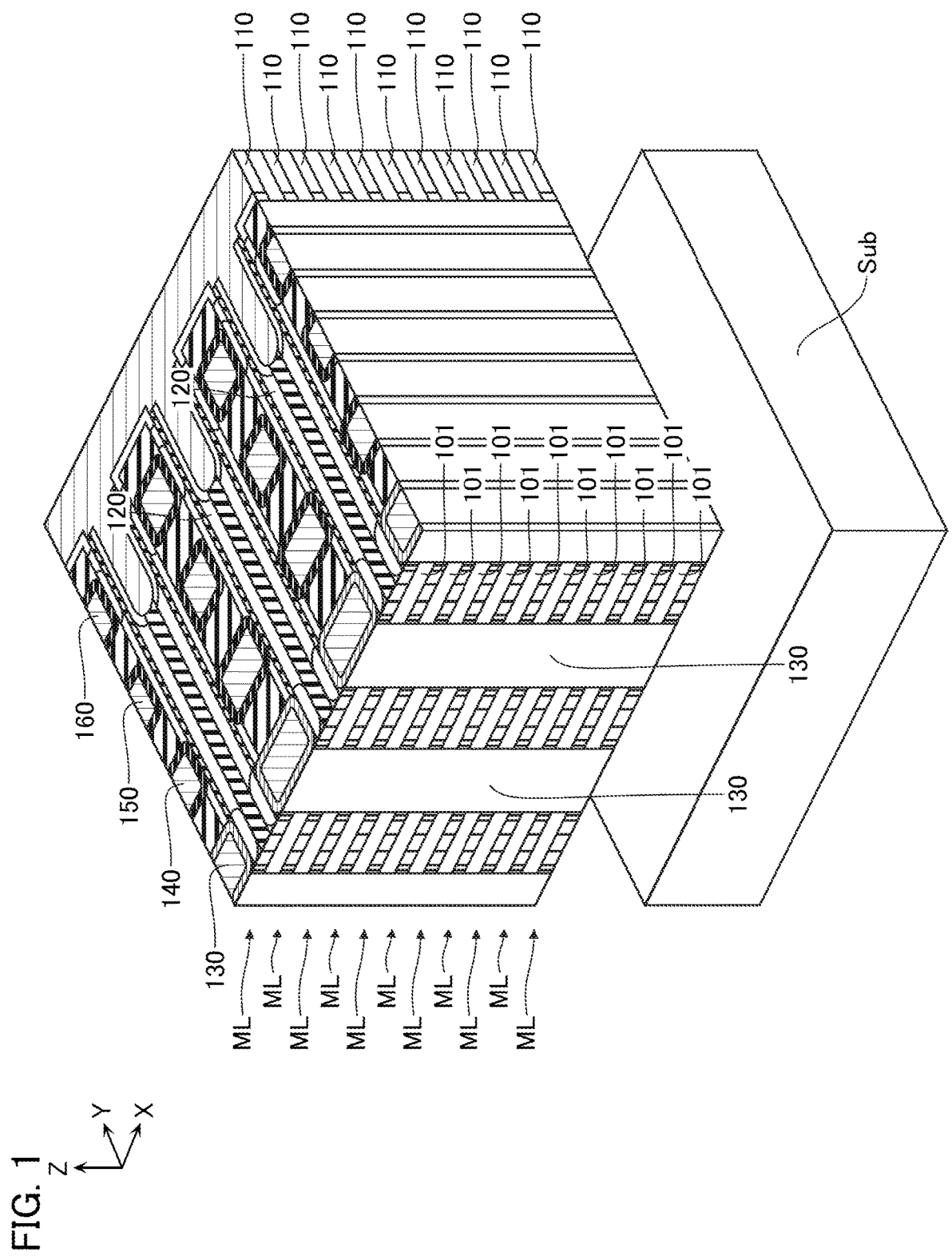
FIG. 1 is a schematic perspective view illustrating a part of a configuration of a semiconductor memory device according to a first embodiment.

A semiconductor memory device according to one embodiment comprises: a first wiring extending in a first direction; a first semiconductor layer connected to the first wiring, the first semiconductor layer extending in a second direction intersecting with the first direction; a first electrode extending in a third direction intersecting with the first direction and the second direction, the first electrode being connected to the first semiconductor layer; a second electrode disposed between the first electrode and the first wiring, the second electrode extending in the third direction and being opposed to the first semiconductor layer; a third electrode disposed between the second electrode and the first wiring, the third electrode extending in the third direction; a second semiconductor layer disposed between the third electrode and the first semiconductor layer, the second semiconductor layer being opposed to the third electrode; and an electric charge accumulating layer electrically connected to the first wiring via the second semiconductor layer, the electric charge accumulating layer being opposed to the first semiconductor layer.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the second configuration is connected to the third configuration via the first configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Configuration]

Figure 2:
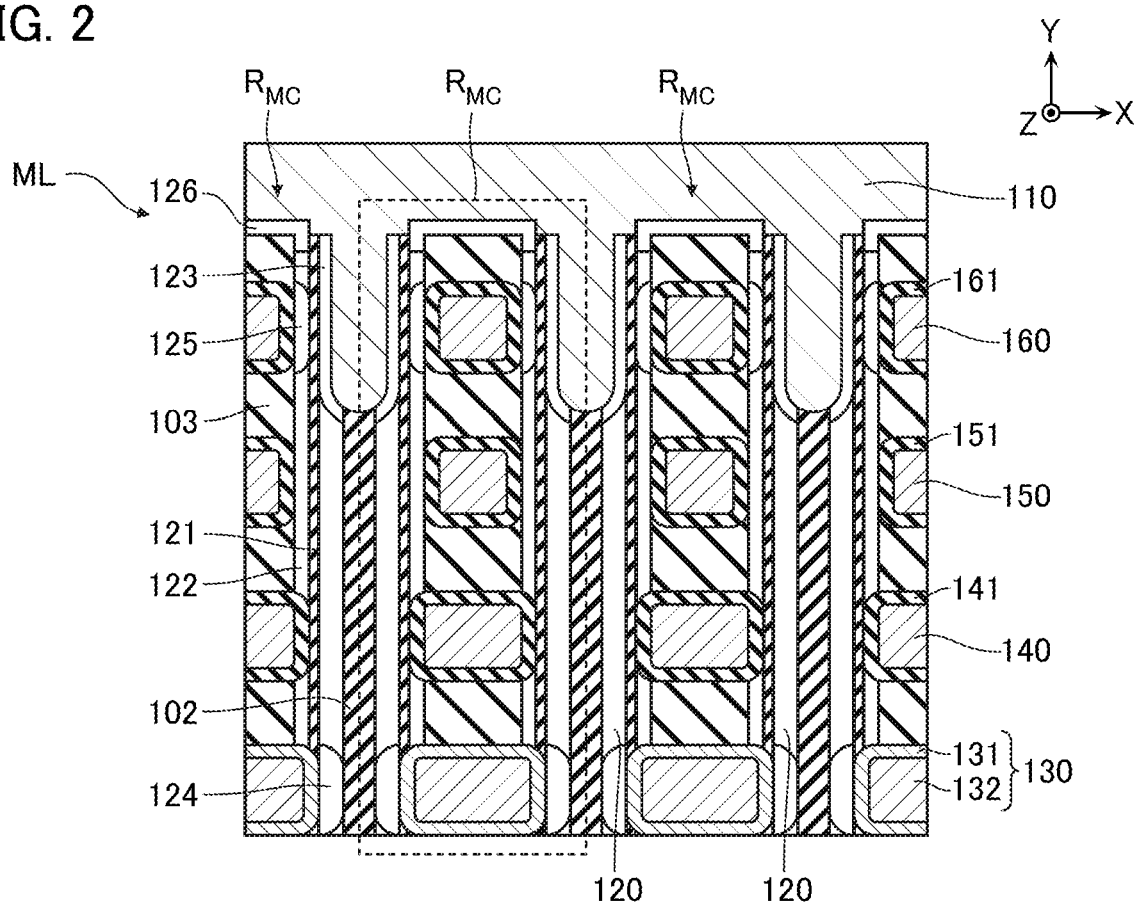
FIG. 2 is a schematic plan view illustrating a part of the configuration of the semiconductor memory device according to the embodiment.
Figure 3:
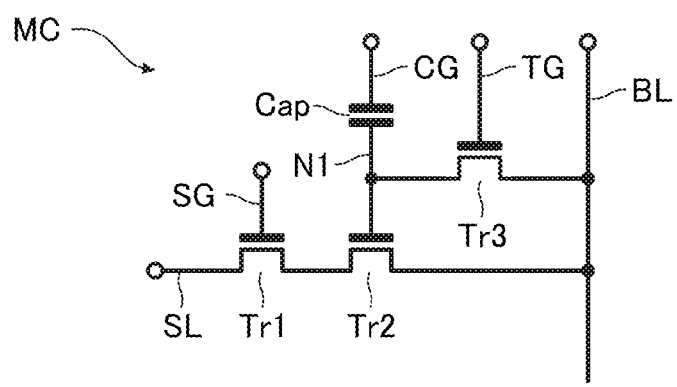
FIG. 3 is a schematic circuit diagram illustrating a part of the configuration of the semiconductor memory device according to the embodiment.

FIG. 1 is a schematic perspective view illustrating a part of a configuration of a semiconductor memory device according to the first embodiment. FIG. 2 is a schematic plan view illustrating a part of the configuration of the semiconductor memory device according to the embodiment. FIG. 3 is a schematic circuit diagram illustrating a part of the configuration of the semiconductor memory device according to the embodiment.

As illustrated in FIG. 1, the semiconductor memory device according to the embodiment includes a semiconductor substrate Sub. The semiconductor substrate Sub is, for example, a semiconductor substrate of silicon (Si) containing P-type impurities such a boron (B), or the like. The semiconductor memory device according to the embodiment includes a plurality of memory layers ML arranged in a Z direction. Between two memory layers ML mutually adjacent in the Z direction, an insulating layer 101 of silicon oxide ($SiO_2$) or the like is disposed.

As illustrated in FIG. 2, the memory layer ML includes a plurality of memory cell regions $R_{MC}$ arranged in an X direction and a conductive layer 110 extending in the X direction along the plurality of memory cell regions $R_{MC}$. Between two memory cell regions $R_{MC}$ mutually adjacent in the X direction, an insulating layer 102 of silicon nitride ($Si_3N_4$) or the like is disposed.

In the memory cell region $R_{MC}$, the memory layer ML includes two semiconductor layers 120 that are mutually spaced in the X direction. The memory layer ML includes an insulating layer 121 disposed on a side surface in the X direction of the semiconductor layer 120 and a semiconductor layer 122 disposed on a side surface in the X direction of the insulating layer 121. Between the two semiconductor layers 120, four electrodes 130, 140, 150, and 160 arranged in a Y direction are disposed. The electrode 140 is closer to the conductive layer 110 than the electrode 130. The electrode 150 is closer to the conductive layer 110 than the electrode 140. The electrode 160 is closer to the conductive layer 110 than the electrode 150. These four electrodes 130, 140, 150, and 160, for example, as illustrated in FIG. 1, penetrate the plurality of memory layers ML to extend in the Z direction. Insulating layers 141, 151, and 161 are disposed on outer peripheral surfaces of the three electrodes 140, 150, and 160, respectively. Between each of the four electrodes 130, 140, 150, and 160, an insulating layer 103 of silicon oxide ($SiO_2$) or the like is disposed.

Each configuration in the memory cell region $R_{MC}$ constitutes the memory cell MC as illustrated in FIG. 3. The memory cell MC includes transistors Tr1 and Tr2 connected in series between a bit line BL and a source line SL. The transistors Tr1 and Tr2 are N-channel type field effect transistors. A gate electrode of the transistor Tr1 is connected to a select gate line SG. A gate electrode of the transistor Tr2 is connected to a control gate line CG via a node N1 and a capacitor Cap. The memory cell MC includes a transistor Tr3 connected between the node N1 and the bit line BL. The transistor Tr3 is an N-channel type field effect transistor. A gate electrode of the transistor Tr3 is connected to a transfer gate line TG.

The conductive layer 110 functions as the bit line BL. The conductive layer 110 may include, for example, a conductive layer of titanium nitride (TiN) or the like.

The semiconductor layer 120 functions as channel regions of the transistors Tr1 and Tr2. The semiconductor layer 120 includes, for example, a semiconductor layer of polycrystalline silicon (Si) or the like. The semiconductor layer 120 extends in the Y direction and is connected to the conductive layer 110 at its one end portion in the Y direction. A part of a side surface on one side in the X direction of the semiconductor layer 120 is connected to the electrode 130, and the other part is covered by the insulating layer 121.

At a connecting portion with the conductive layer 110 of the semiconductor layer 120, an impurity region 123 is disposed. At a connecting portion with the electrode 130 of the semiconductor layer 120, an impurity region 124 is disposed. The impurity regions 123 and 124 contain, for example, N-type impurities such as phosphorus (P).

The insulating layer 121 functions as gate insulating layers of the transistors Tr1 and Tr2. The insulating layer 121 includes, for example, an insulating layer of silicon oxide ($SiO_2$) or the like. A part of a side surface on one side in the X direction of the insulating layer 121 is connected to an insulating layer 141, and the other part is covered by the semiconductor layer 122.

The semiconductor layer 122 functions as the gate electrode of the transistor Tr2, the node N1, and one electrode of the capacitor Cap. The semiconductor layer 122 functions as an electric charge accumulating layer that can accumulate electric charge. The semiconductor layer 122 may include, for example, a semiconductor layer of polycrystalline silicon (Si) containing N-type impurities such as phosphorus (P) or P-type impurities such as boron (B), or the like, or may include a metal such as tungsten (W). The semiconductor layer 122 extends in the Y direction. One end portion in the Y direction of the semiconductor layer 122 is electrically connected to the conductive layer 110 via a semiconductor layer 125 and an impurity region 126. A part of a side surface on one side in the X direction of the semiconductor layer 122 is connected to an insulating layer 151 and the other part is covered by the insulating layer 103.

The semiconductor layer 125 functions as the channel region of the transistor Tr3. The semiconductor layer 125 is opposed to the electrode 160.

The semiconductor layer 125 may include, for example, metal oxide (oxide semiconductor) that functions as a semiconductor. The semiconductor layer 125 may include, for example, indium gallium zinc oxide (InGaZnO), indium oxide (InO), indium zinc oxide (InZnO), zinc oxide (ZnO), indium gallium silicon oxide (InGaSiO), indium aluminum zinc oxide (InAlZnO), indium tungsten oxide (InWO), indium tin oxide (InSnO), tin oxide (SnO), copper oxide (CuO), titanium oxide (TiO), or tungsten oxide (WO). Furthermore, the semiconductor layer 125 may include a stacked film made of them.

The impurity region 126 includes, for example, a semiconductor layer of polycrystalline silicon (Si) containing N-type impurities such as phosphorus (P), or the like.

The electrode 130 functions as the source line SL. The electrode 130 includes, for example, a conductive layer 131 of titanium nitride (TiN) or the like and a conductive layer 132 of tungsten (W) or the like.

The electrode 140 functions as the gate electrode of the transistor Tr1 and the select gate line SG. The electrode 140 includes, for example, a conductive layer of titanium nitride (TiN) or the like and a conductive layer of tungsten (W) or the like. The electrode 140 is opposed to the semiconductor layer 120 via the insulating layers 121 and 141.

The insulating layer 141, for example, functions as the gate insulating layer of the transistor Tr1. The insulating layer 141 includes, for example, an insulating layer of silicon oxide ($SiO_2$).

The electrode 150 functions as the other electrode of the capacitor Cap and the control gate line CG. The electrode 150 includes, for example, the conductive layer of titanium nitride (TiN) or the like and the conductive layer of tungsten (W) or the like. The electrode 150 is opposed to the semiconductor layer 122 via the insulating layer 151.

The insulating layer 151 functions, for example, as the insulating layer between the electrodes of the capacitor Cap. The insulating layer 151 includes, for example, the insulating layer of silicon oxide ($SiO_2$) or the like.

The electrode 160 functions as the gate electrode of the transistor Tr3 and the transfer gate line TG. The electrode 160 includes, for example, a conductive layer of titanium nitride (TiN) or the like and a conductive layer of tungsten (W) or the like. The electrode 160 is opposed to the semiconductor layer 125 via the insulating layer 161.

The insulating layer 161 functions, for example, as a gate insulating layer of the transistor Tr3. The insulating layer 161 includes, for example, an insulating layer of silicon oxide ($SiO_2$).

Manufacturing Method

FIG. 4 to FIG. 40 are schematic cross-sectional views for describing a manufacturing method of the semiconductor memory device according to the first embodiment. FIGS. 5, 7, 9, 11, 13, 15, 17, 19, 21, 23, 25, 27, 29, 31, 33, 35, 37, and 39 illustrate XY cross-sectional surfaces corresponding to FIG. 2. FIGS. 4, 6, 8, 10, 12, 14, 16, 22, and 24 illustrate XZ cross-sectional surfaces at a position corresponding to the electrode 130. FIG. 18 illustrates YZ cross-sectional surface at a position corresponding to the insulating layer 102. FIGS. 26, 28, and 30 illustrate XZ cross-sectional surfaces at a position corresponding to the electrode 140. FIGS. 32 and 34 illustrate XZ cross-sectional surfaces at a position corresponding to the electrode 150. FIGS. 36, 38, and 40 illustrate XZ cross-sectional surfaces at a position corresponding to the electrode 160.

Figure 4:
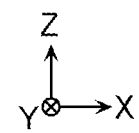
FIG. 4 is a schematic cross-sectional view for describing a manufacturing method of the semiconductor memory device according to the first embodiment.
Figure 4:
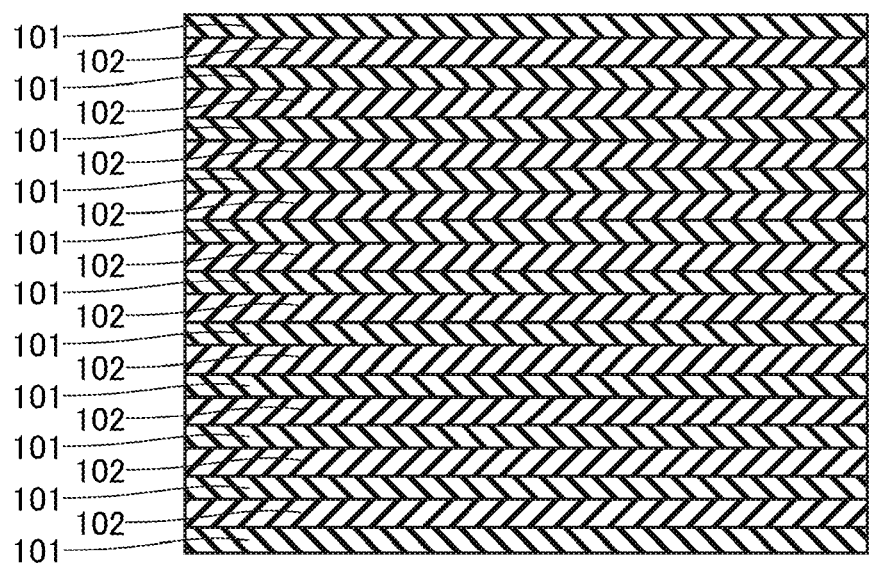

In the manufacturing method, for example, as illustrated in FIG. 4, a plurality of the insulating layers 101 and a plurality of the insulating layers 102 are alternately formed. This process is performed, for example, by Chemical Vapor Deposition (CVD) or the like.

Figure 5:
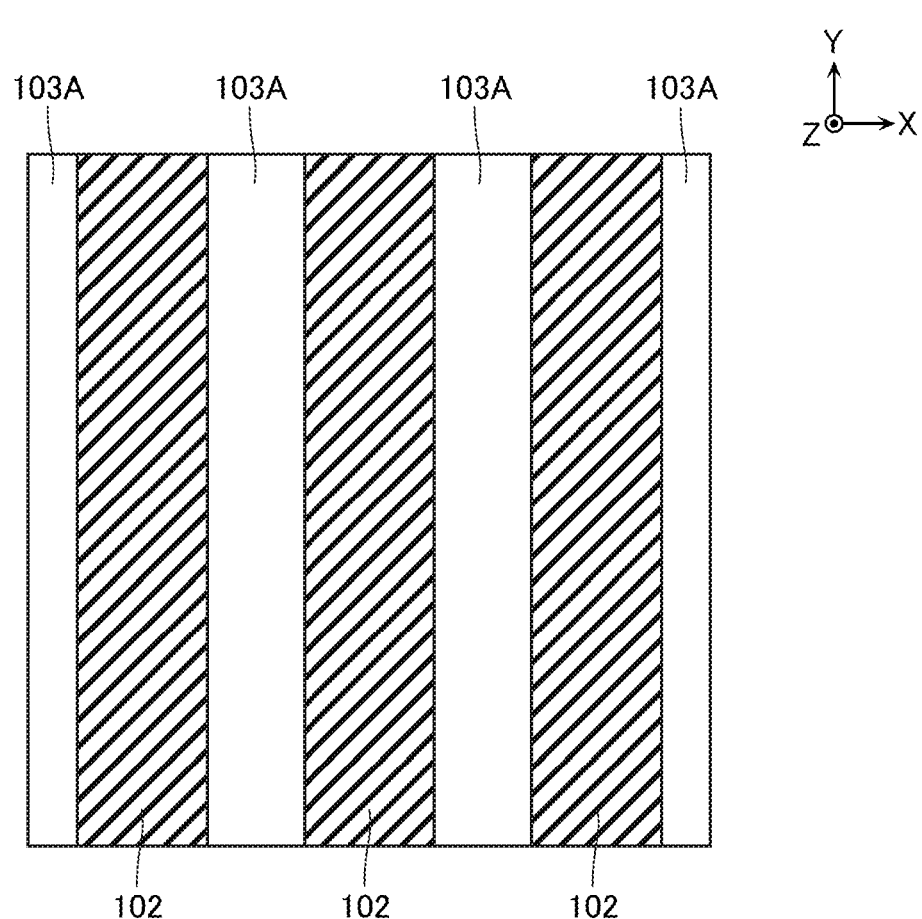
FIG. 5 is a schematic cross-sectional for describing the manufacturing method.
Figure 6:
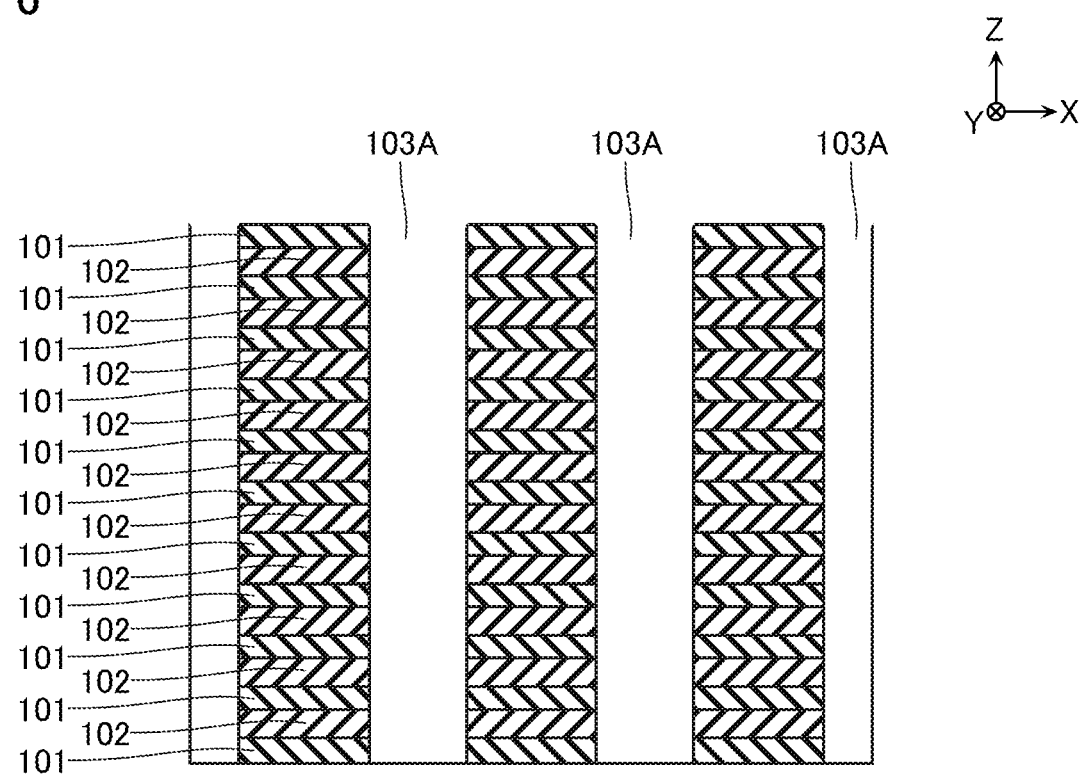
FIG. 6 is a schematic cross-sectional for describing the manufacturing method.

Next, for example, as illustrated in FIGS. 5 and 6, openings 103A are formed. As illustrated in FIG. 5, the openings 103A extend in the Y direction and are arranged in the X direction. As illustrated in FIG. 6, the openings 103A extend in the Z direction and penetrate the plurality of insulating layers 101 and the plurality of insulating layers 102, which are arranged in the Z direction. This process is performed, for example, by Reactive Ion Etching (RIE) or the like.

Figure 7:
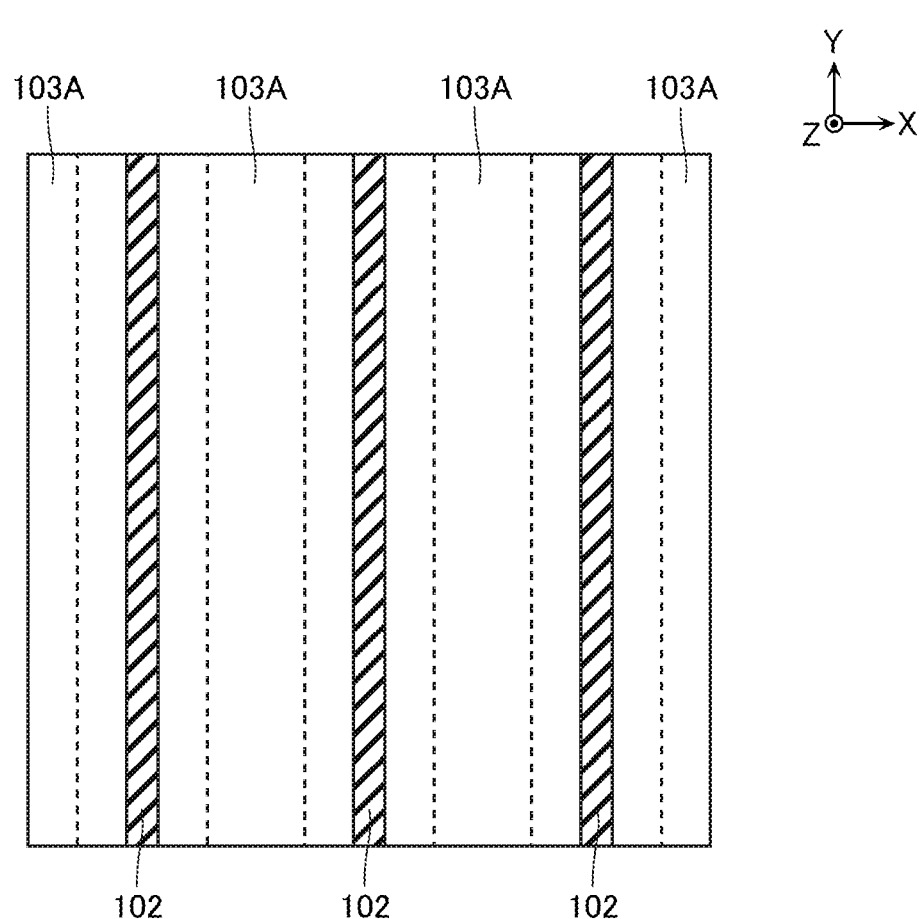
FIG. 7 is a schematic cross-sectional for describing the manufacturing method.
Figure 8:
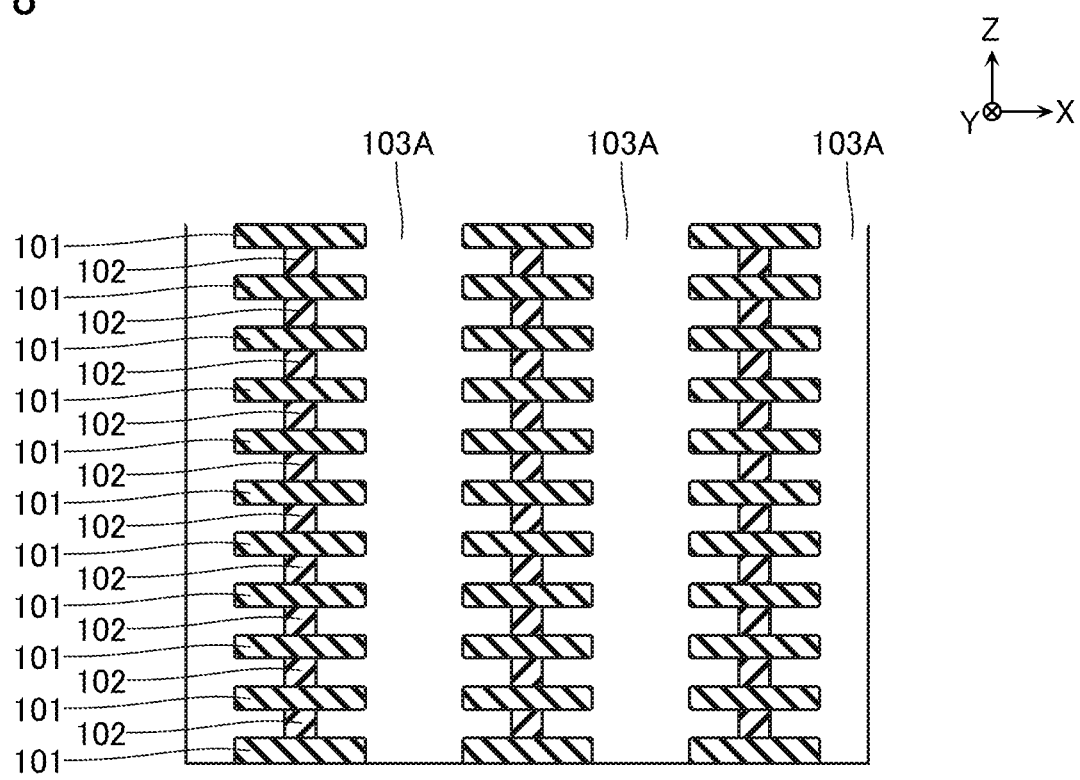
FIG. 8 is a schematic cross-sectional for describing the manufacturing method.

Next, for example, as illustrated in FIGS. 7 and 8, a part of the insulating layer 102 is removed, and parts of an upper surface and a lower surface of the insulating layer 101 are exposed. This process is performed, for example, by wet etching or the like.

Figure 9:
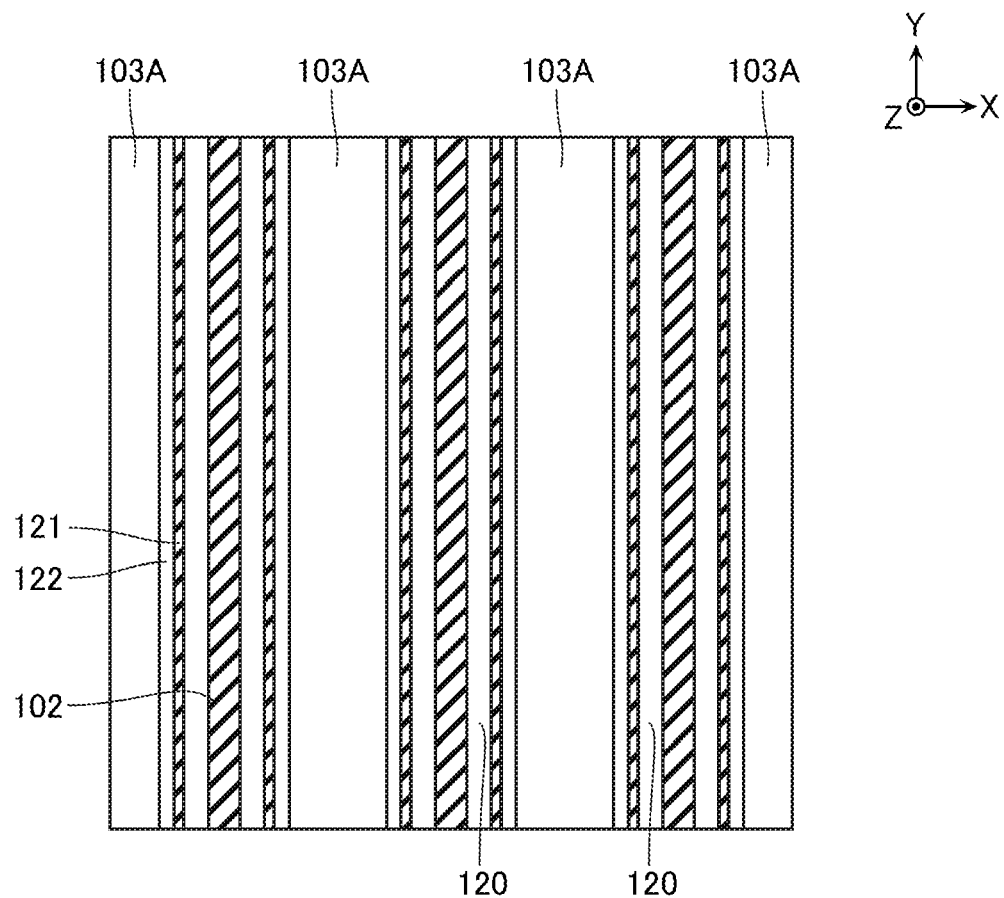
FIG. 9 is a schematic cross-sectional for describing the manufacturing method.
Figure 10:
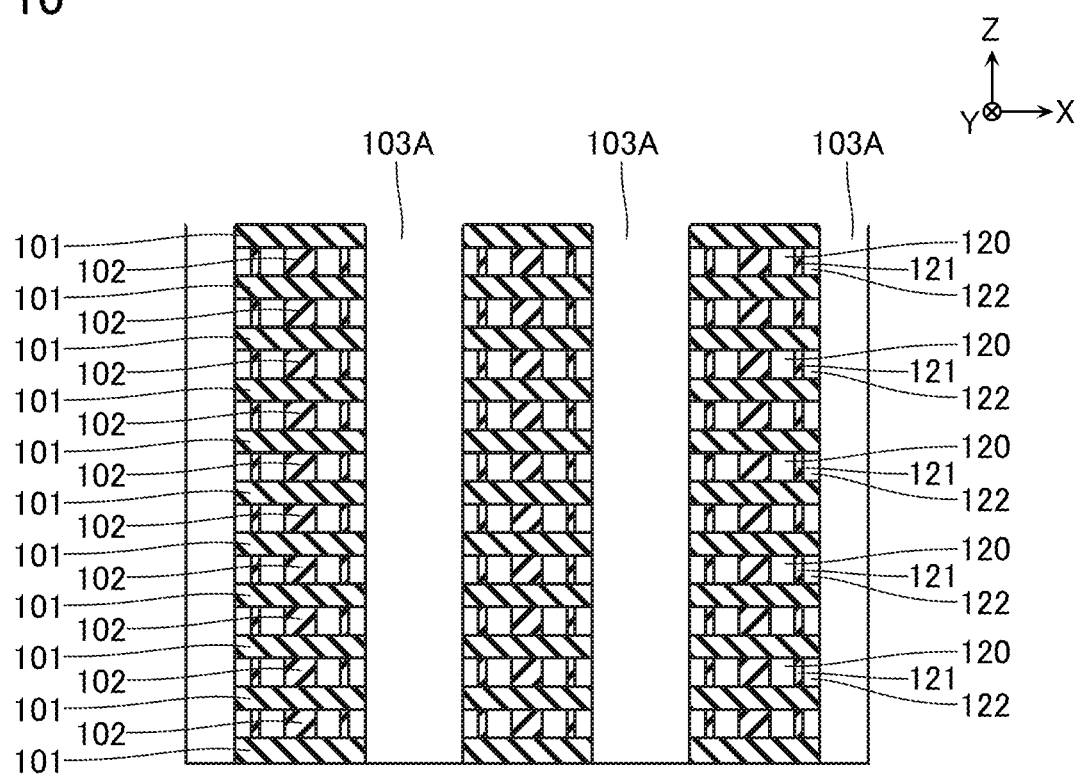
FIG. 10 is a schematic cross-sectional for describing the manufacturing method.

Next, for example, as illustrated in FIGS. 9 and 10, the semiconductor layer 120, the insulating layer 121, and the semiconductor layer 122 are formed. This process is performed, for example, by CVD, wet etching, oxidation treatment, or the like.

Figure 11:
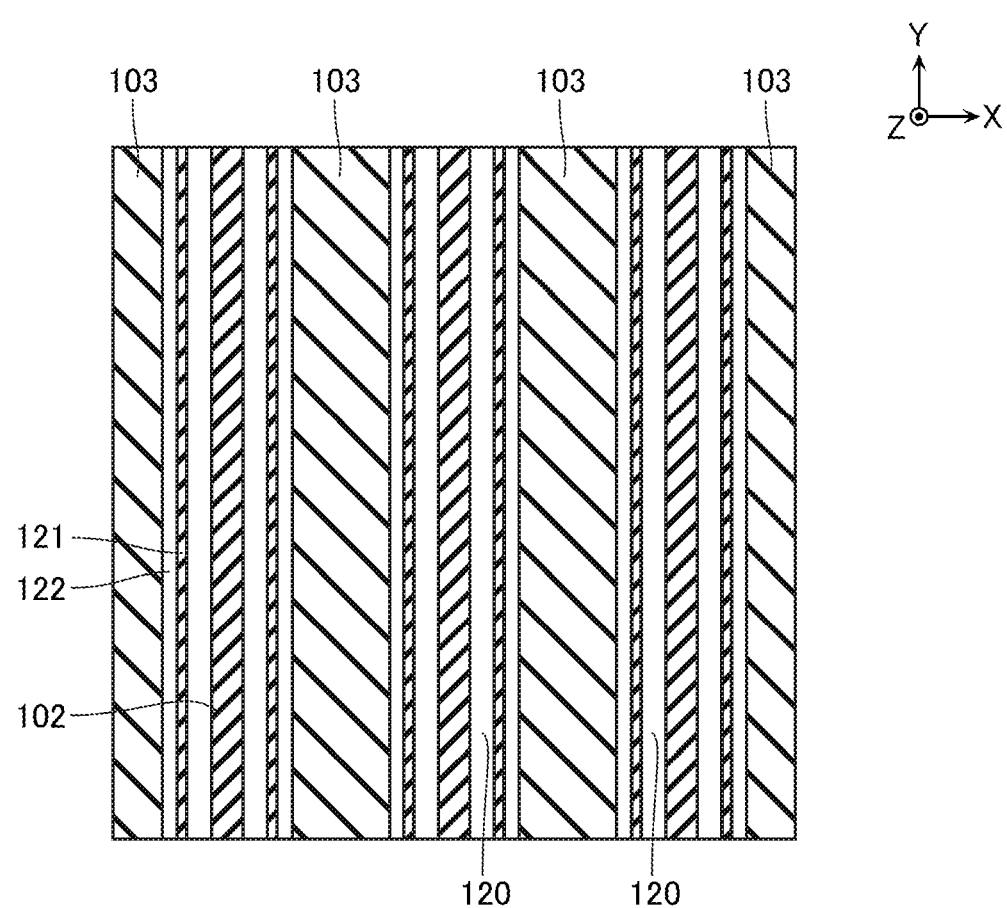
FIG. 11 is a schematic cross-sectional for describing the manufacturing method.
Figure 12:
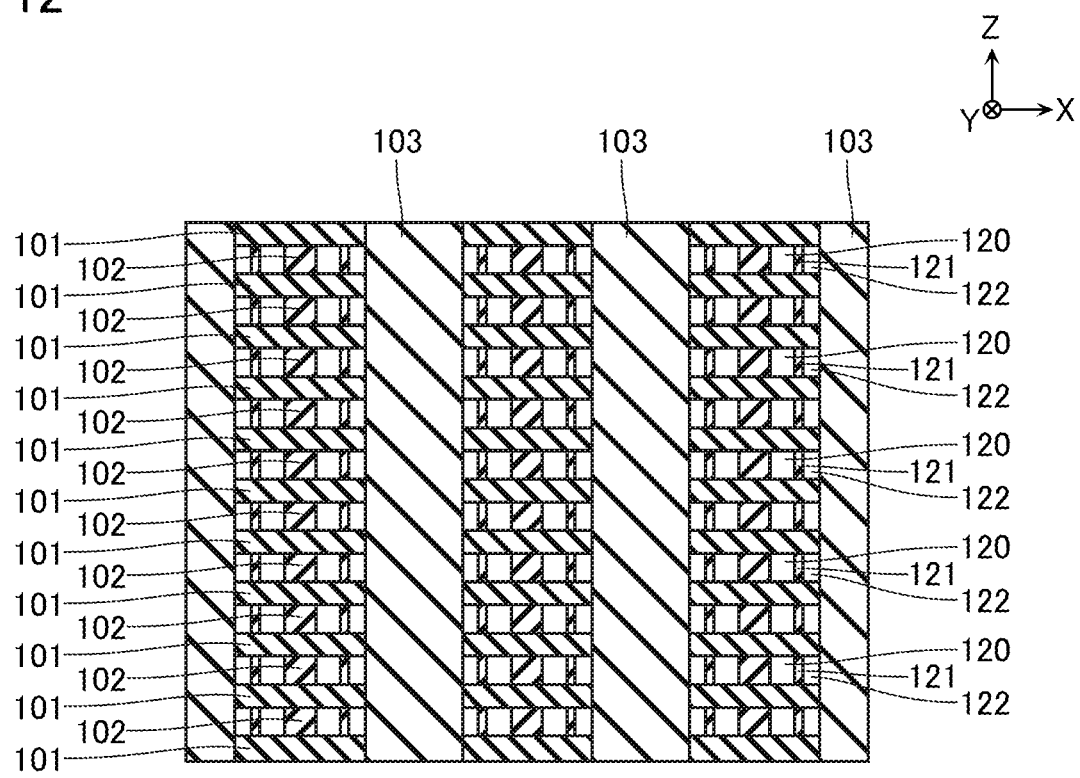
FIG. 12 is a schematic cross-sectional for describing the manufacturing method.

Next, for example, as illustrated in FIGS. 11 and 12, the insulating layer 103 is formed inside the opening 103A. This process is performed, for example, by CVD or the like.

Figure 13:
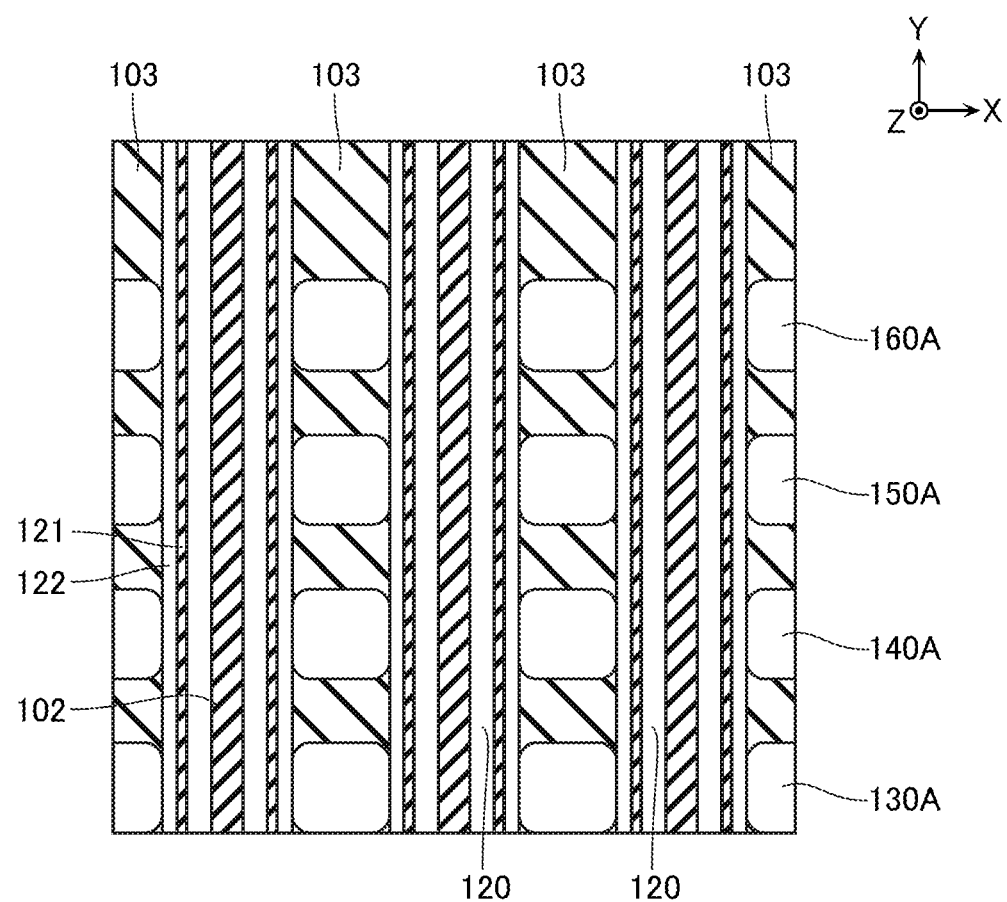
FIG. 13 is a schematic cross-sectional for describing the manufacturing method.
Figure 14:
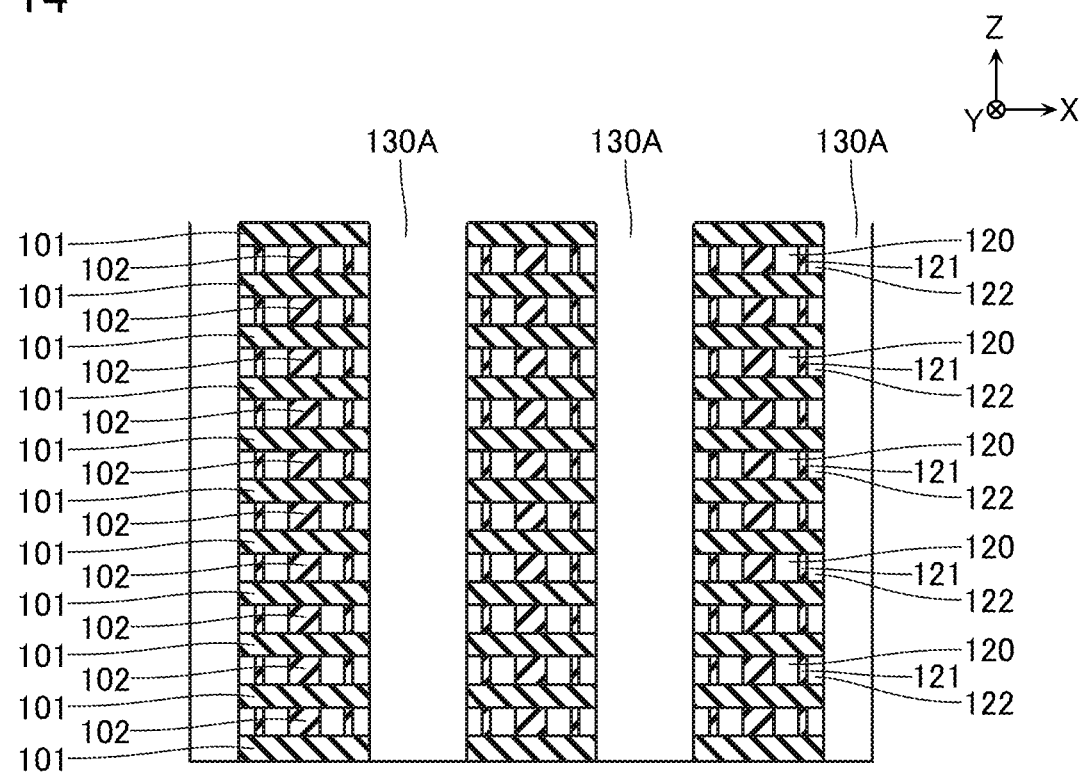
FIG. 14 is a schematic cross-sectional for describing the manufacturing method.

Next, for example, as illustrated in FIGS. 13 and 14, an opening 130A is formed at the position corresponding to the electrode 130. An opening 140A is formed at the position corresponding to the electrode 140. An opening 150A is formed at the position corresponding to the electrode 150. An opening 160A is formed at the position corresponding to the electrode 160. As illustrated in FIG. 14, these openings 130A, 140A, 150A, and 160A extend in the Z direction, and the side surfaces in the X direction of the plurality of insulating layers 101 and the plurality of semiconductor layers 122, which are arranged in the Z direction, are exposed. This process is performed, for example, by RIE or the like.

Figure 15:
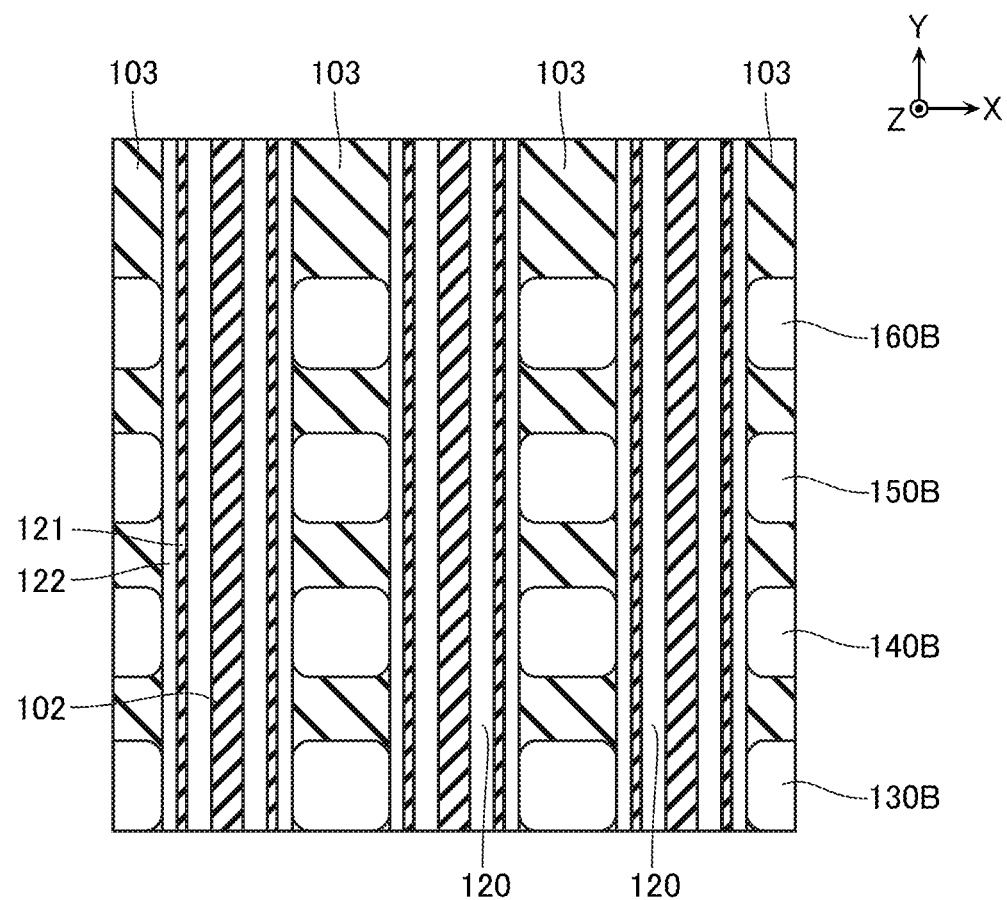
FIG. 15 is a schematic cross-sectional for describing the manufacturing method.
Figure 16:
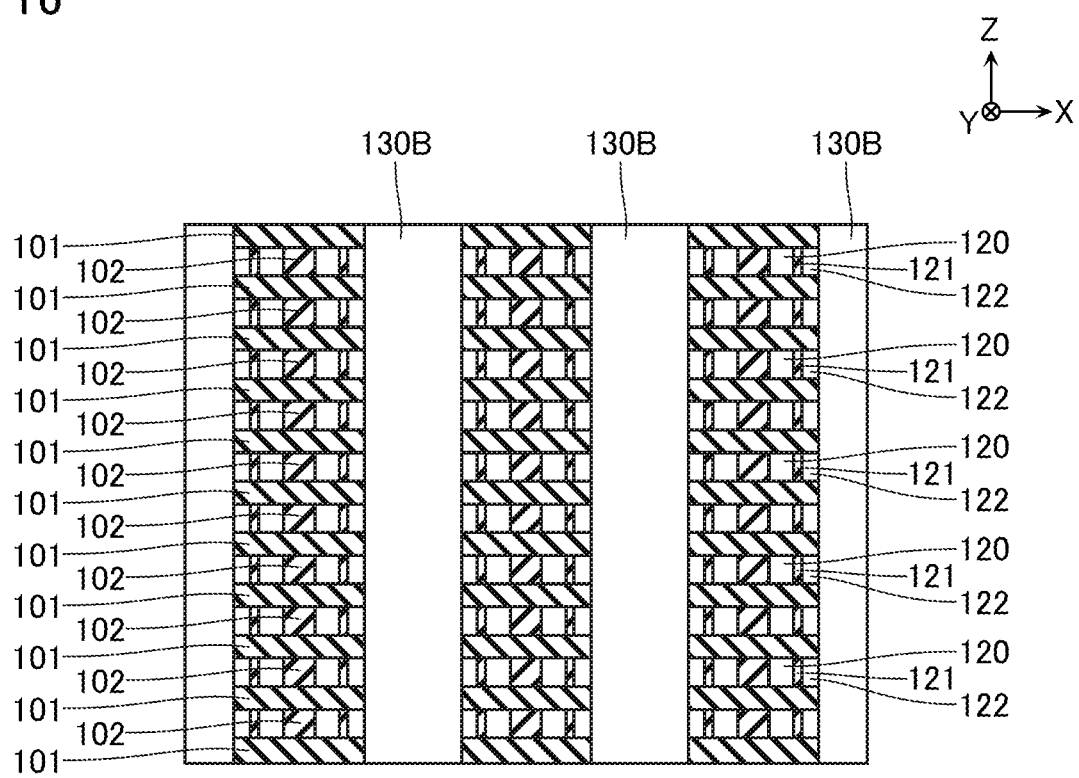
FIG. 16 is a schematic cross-sectional for describing the manufacturing method.

Next, for example, as illustrated in FIGS. 15 and 16, sacrifice layers 130B, 140B, 150B, and 160B each are formed inside the respective openings 130A, 140A, 150A, and 160A. This process is performed, for example, by CVD or the like.

Figure 17:
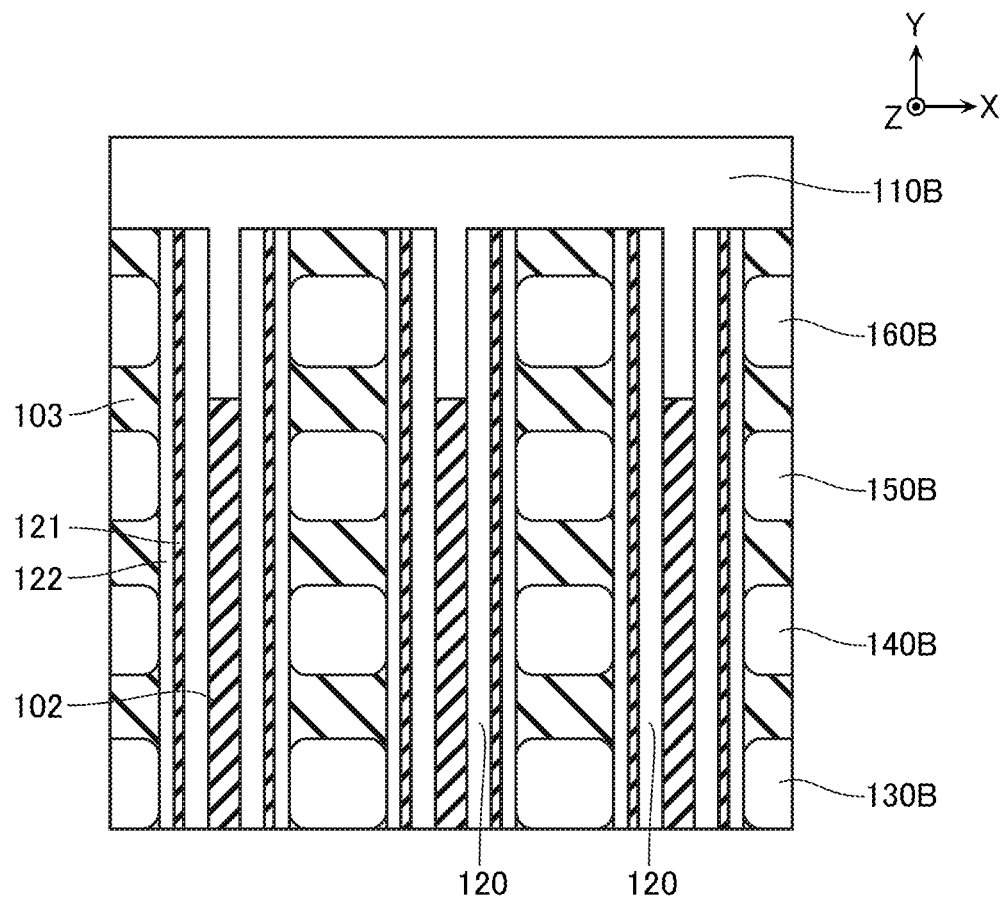
FIG. 17 is a schematic cross-sectional for describing the manufacturing method.
Figure 18:
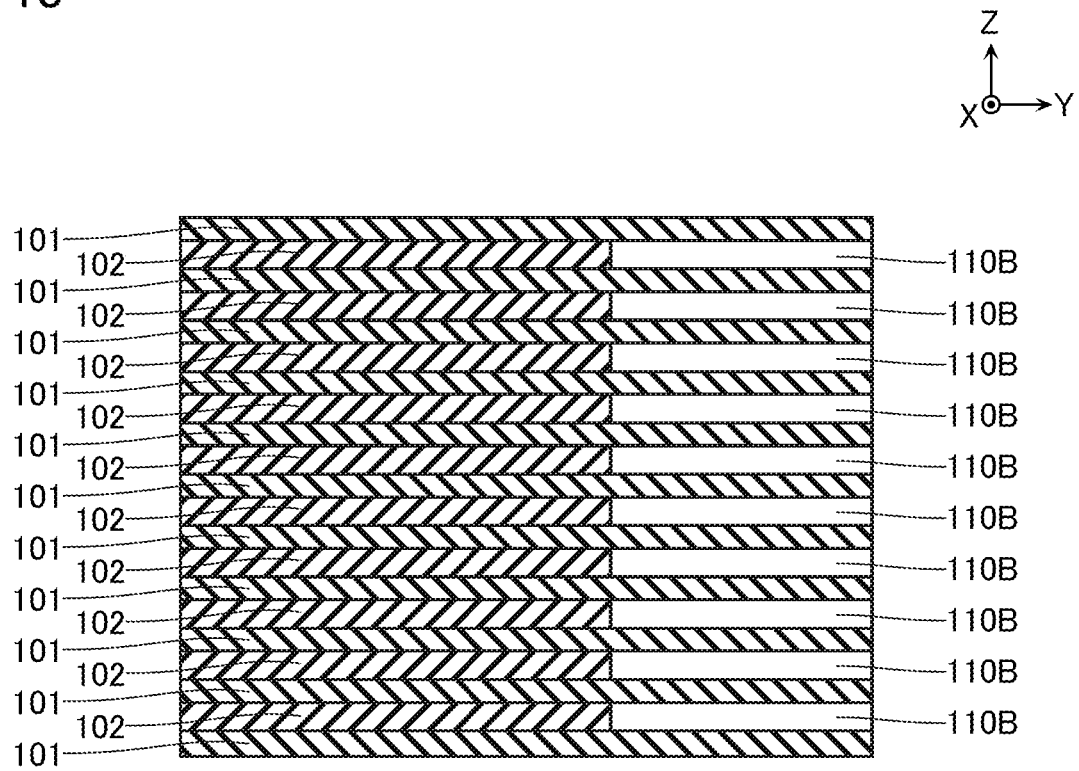
FIG. 18 is a schematic cross-sectional for describing the manufacturing method.

Next, for example, as illustrated in FIGS. 17 and 18, a sacrifice layer 110B is formed at the position corresponding to the conductive layer 110. In this process, for example, an opening extending in the X direction is formed. A part of the insulating layer 102 is removed by a method such as wet etching. The sacrifice layer 110B is formed by a method such as CVD.

Figure 19:
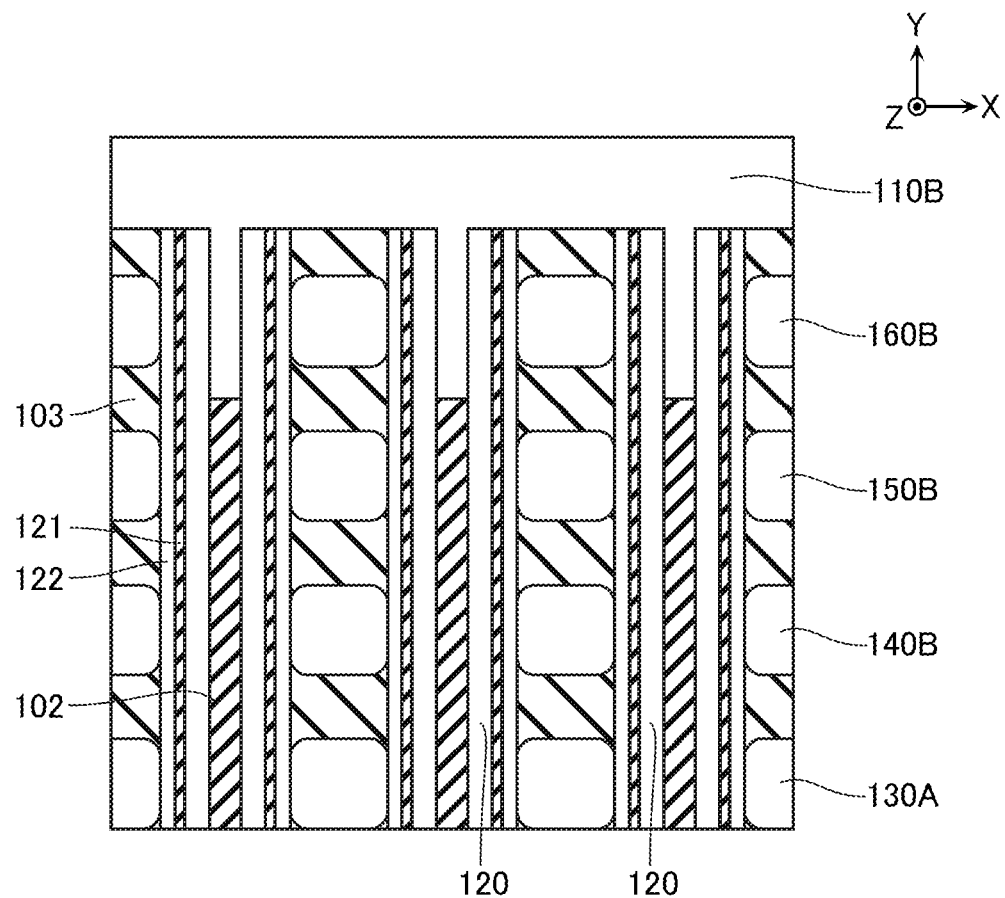
FIG. 19 is a schematic cross-sectional for describing the manufacturing method.
Figure 20:
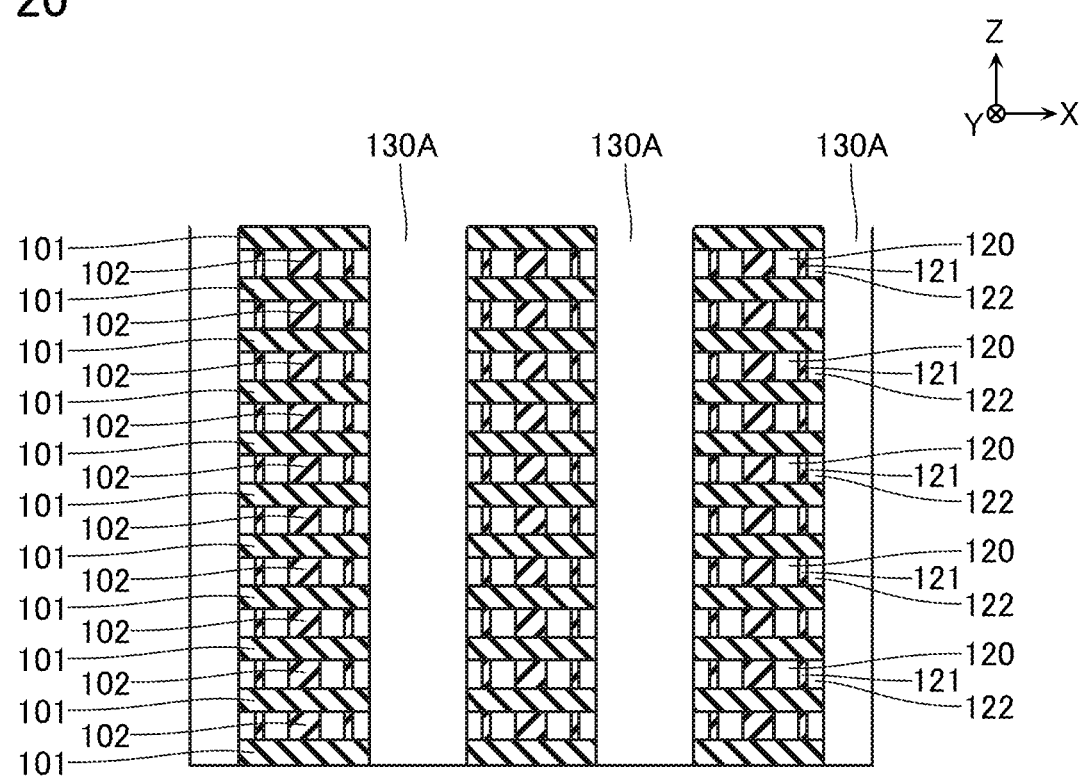
FIG. 20 is a schematic cross-sectional for describing the manufacturing method.

Next, for example, as illustrated in FIGS. 19 and 20, the sacrifice layer 130B is removed. This process is performed, for example, by wet etching or the like.

Figure 21:
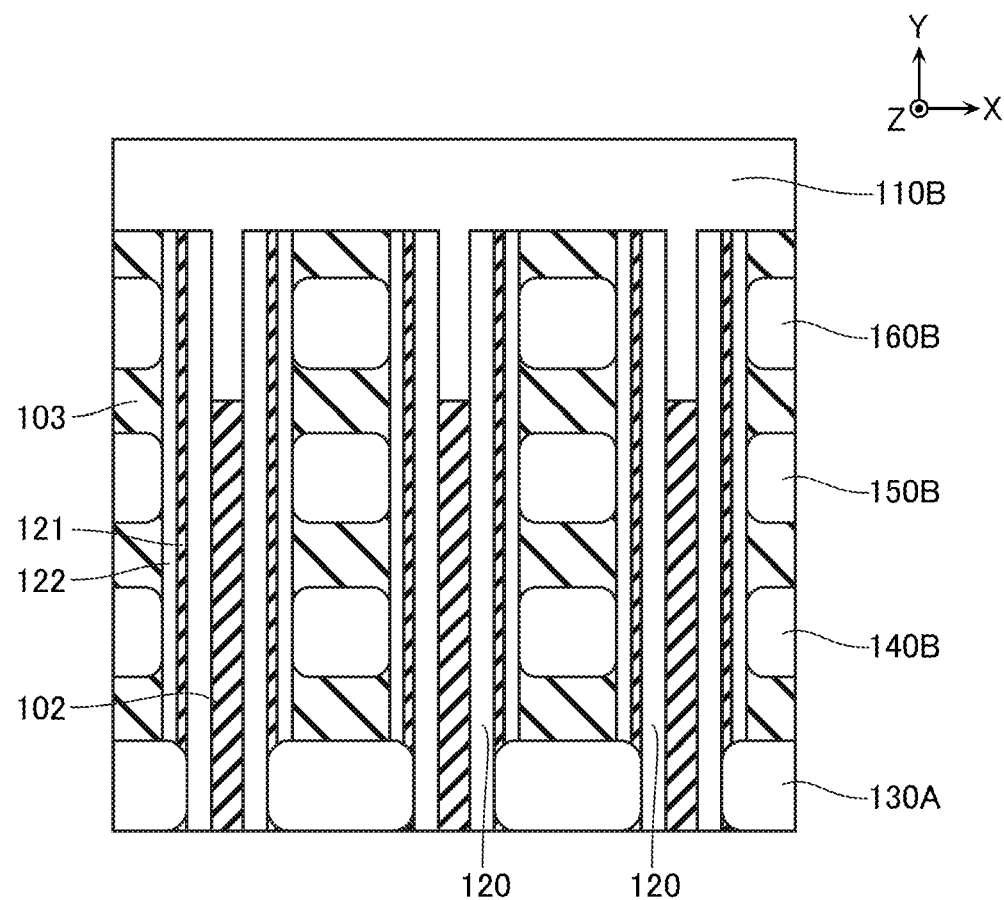
FIG. 21 is a schematic cross-sectional for describing the manufacturing method.
Figure 22:
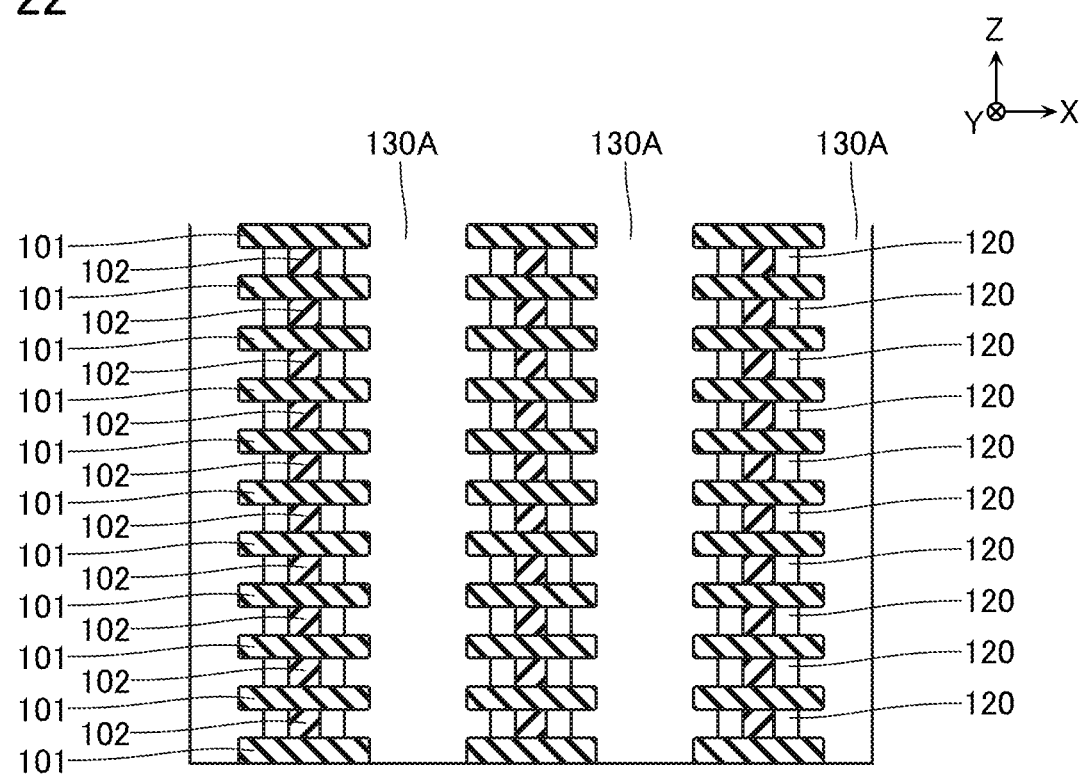
FIG. 22 is a schematic cross-sectional for describing the manufacturing method.

Next, for example, as illustrated in FIGS. 21 and 22, parts of the semiconductor layer 122 and the insulating layer 121 are removed, and parts of the upper surface and the lower surface of the insulating layer 101 and the side surface in the X direction of the semiconductor layer 120 are exposed. This process is performed, for example, by wet etching or the like.

Figure 23:
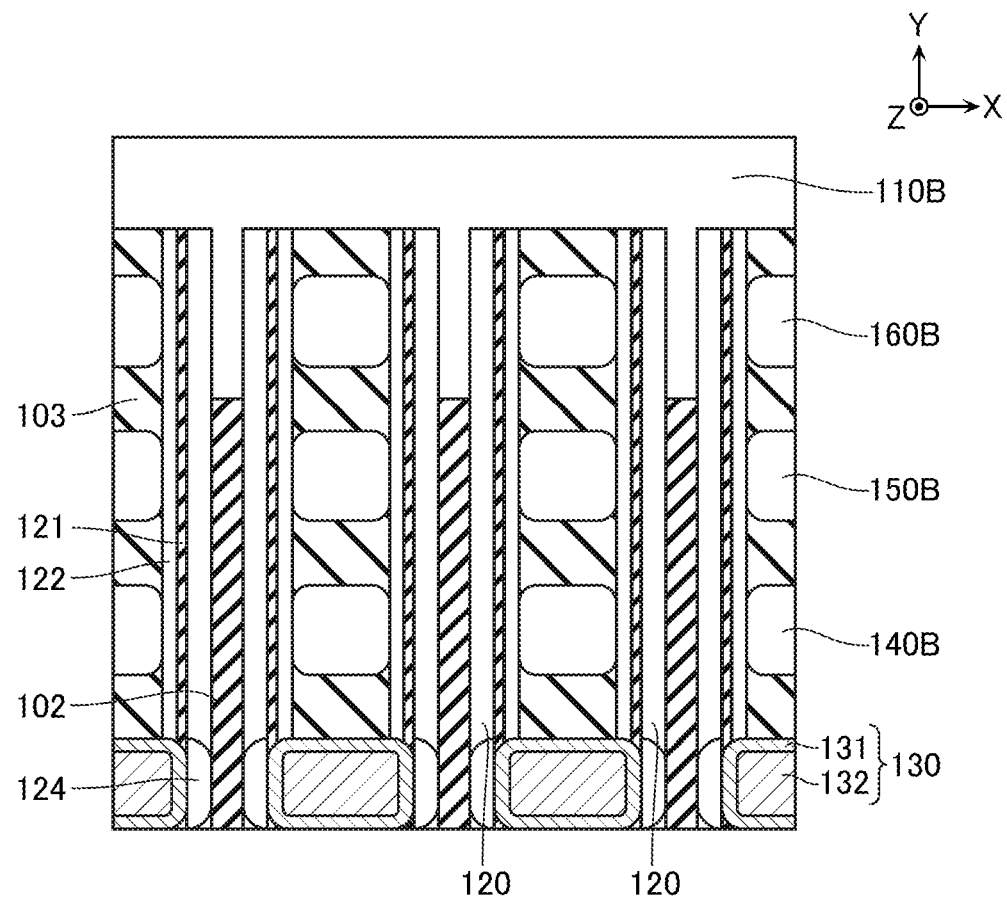
FIG. 23 is a schematic cross-sectional for describing the manufacturing method.
Figure 24:
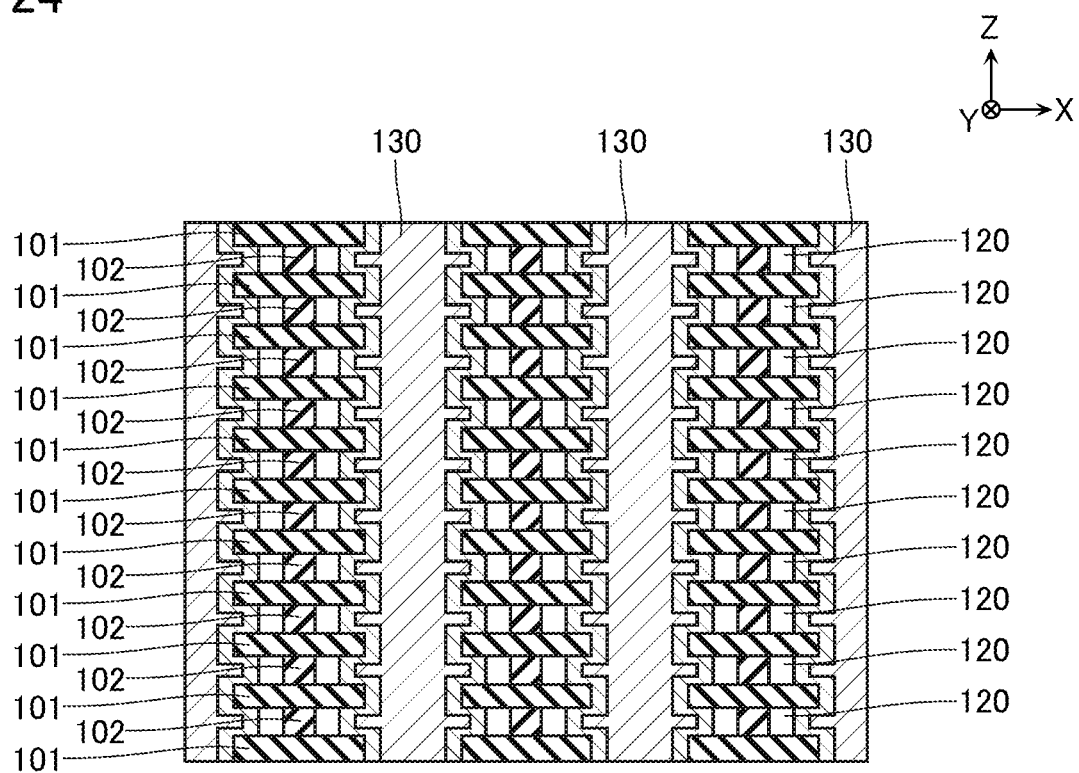
FIG. 24 is a schematic cross-sectional for describing the manufacturing method.

Next, for example, as illustrated in FIGS. 23 and 24, the impurity region 124 and the electrode 130 are formed. This process is performed, for example, by CVD or the like.

Figure 25:
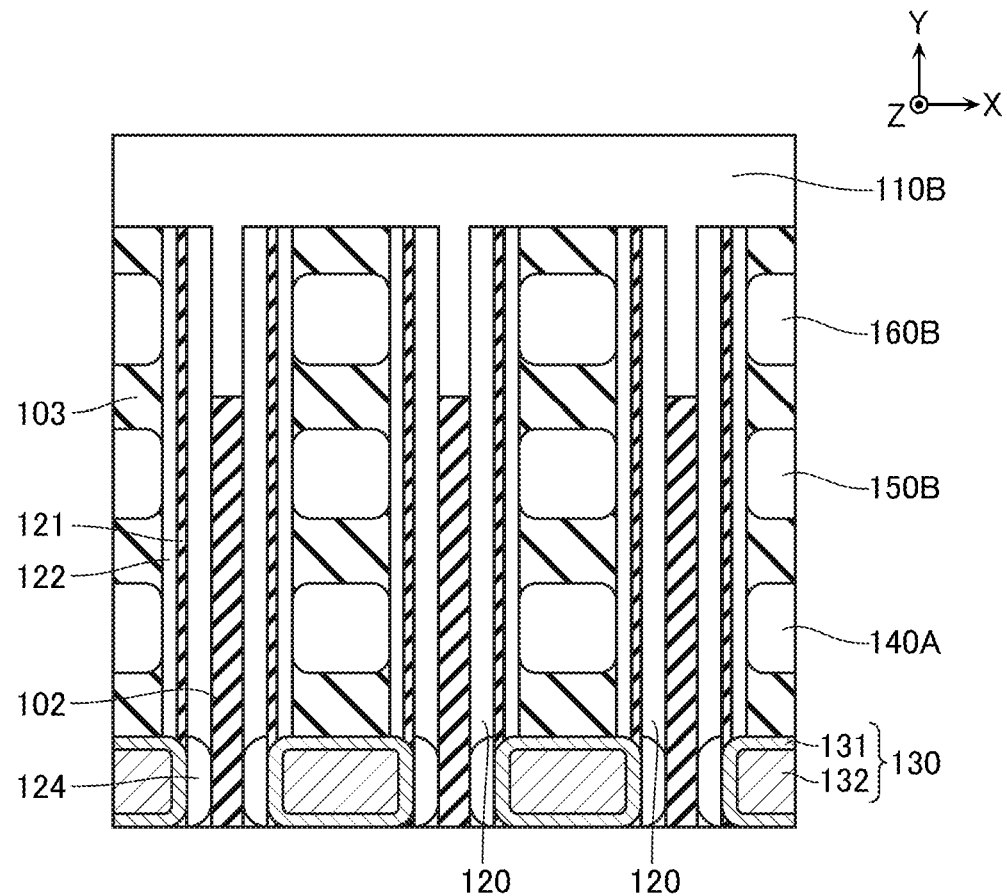
FIG. 25 is a schematic cross-sectional for describing the manufacturing method.
Figure 26:
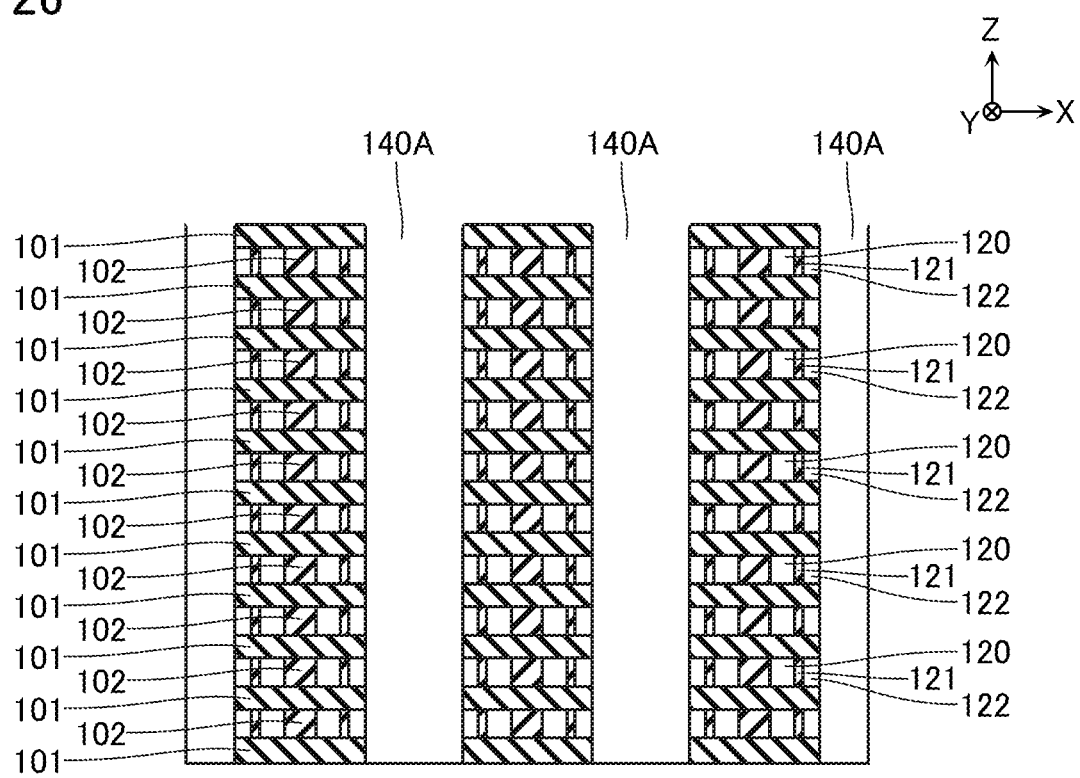
FIG. 26 is a schematic cross-sectional for describing the manufacturing method.

Next, for example, as illustrated in FIGS. 25 and 26, the sacrifice layer 140B is removed. This process is performed, for example, by wet etching or the like.

Figure 27:
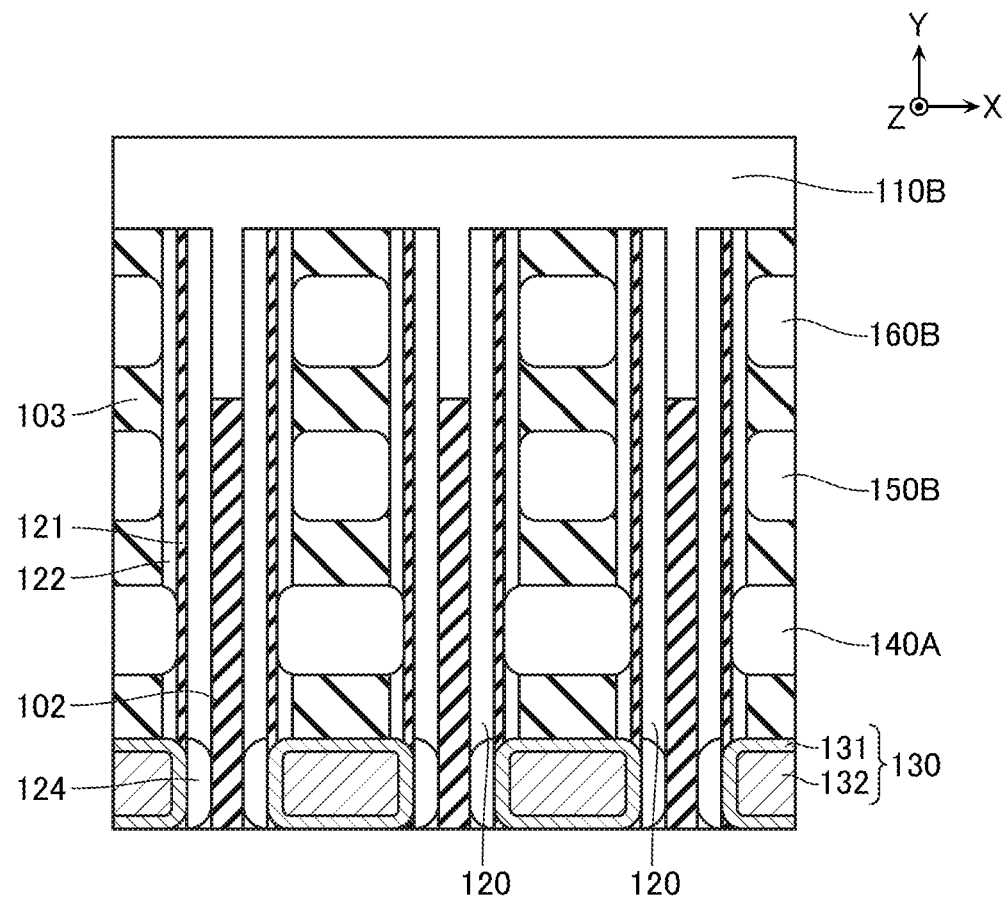
FIG. 27 is a schematic cross-sectional for describing the manufacturing method.
Figure 28:
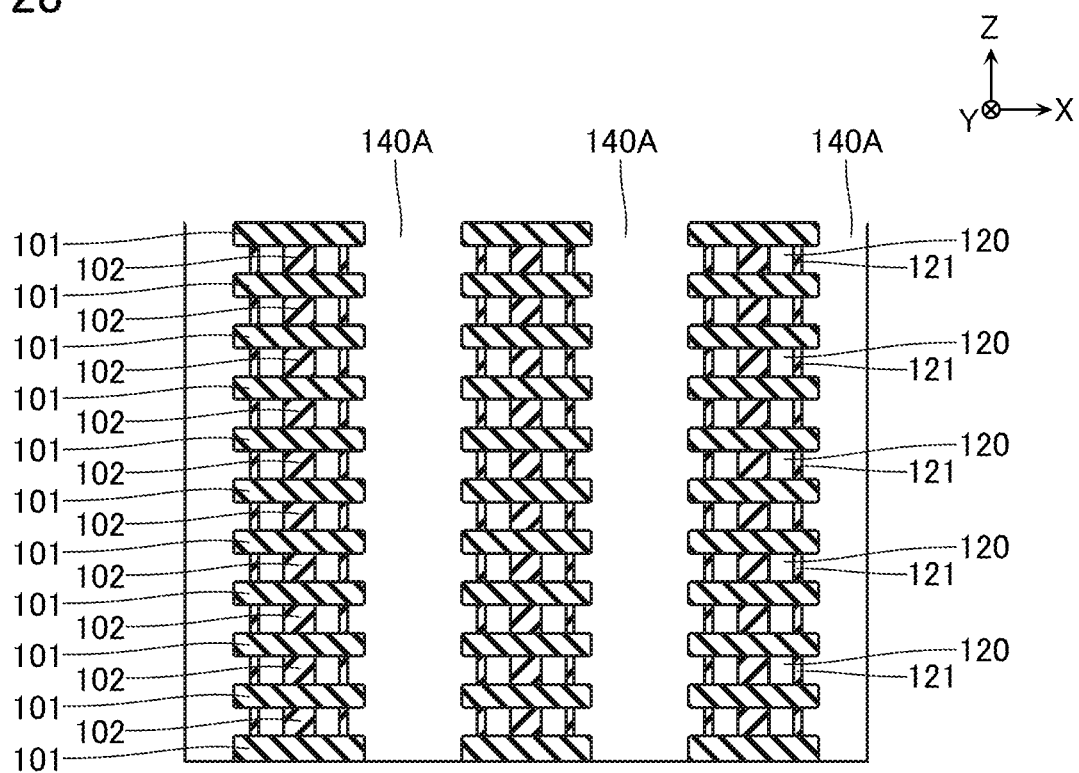
FIG. 28 is a schematic cross-sectional for describing the manufacturing method.

Next, for example, as illustrated in FIGS. 27 and 28, a part of the semiconductor layer 122 is removed, and parts of the upper surface and the lower surface of the insulating layer 101 and the side surface in the X direction of the insulating layer 121 are exposed. This process is performed, for example, by wet etching or the like.

Figure 29:
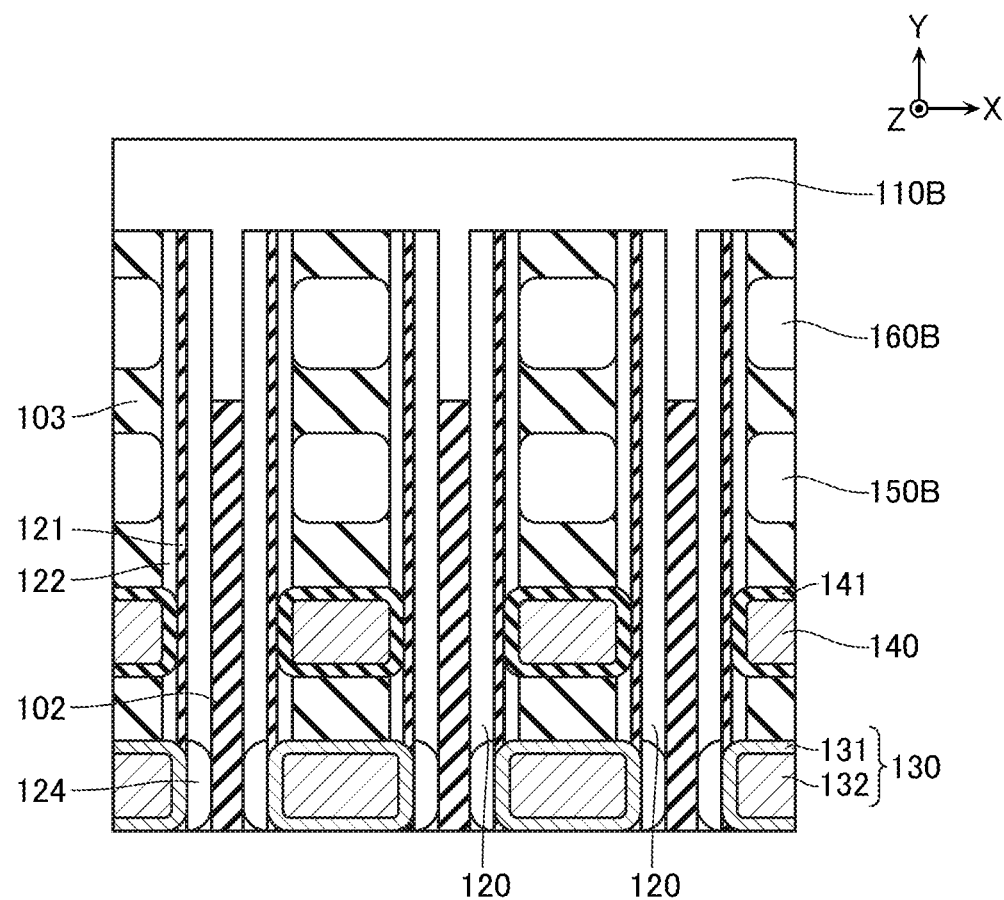
FIG. 29 is a schematic cross-sectional for describing the manufacturing method.
Figure 30:
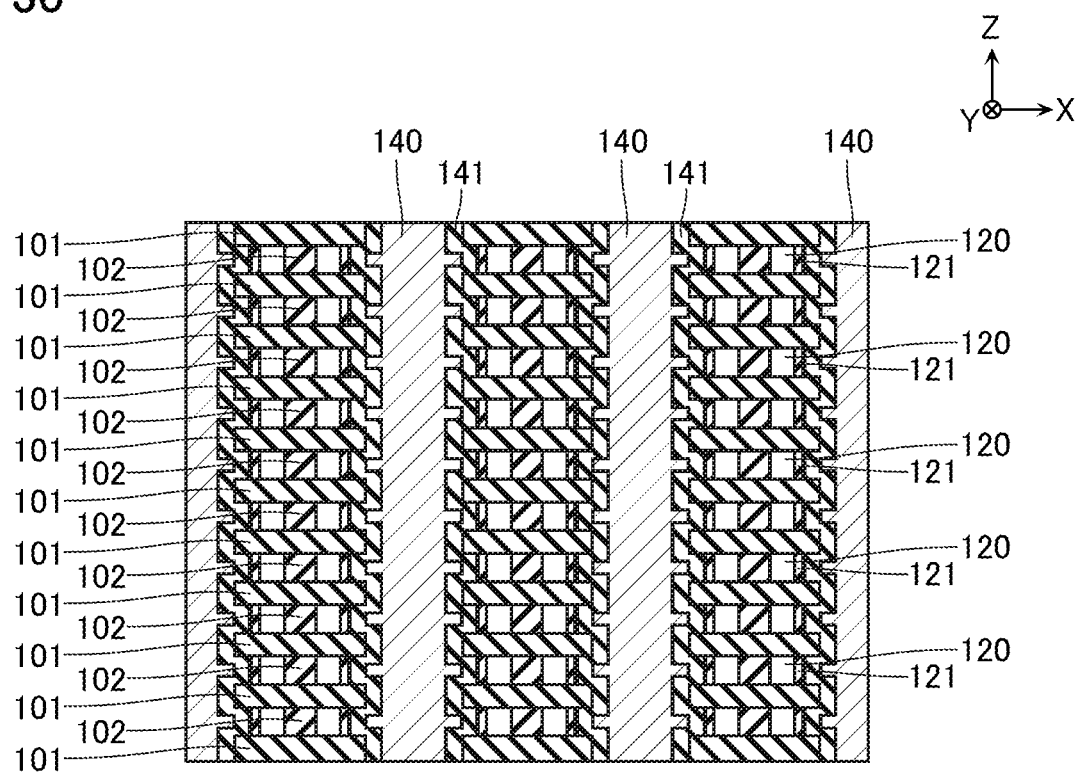
FIG. 30 is a schematic cross-sectional for describing the manufacturing method.

Next, for example, as illustrated in FIGS. 29 and 30, the insulating layer 141 and the electrode 140 are formed. This process is performed, for example, by CVD or the like.

Figure 31:
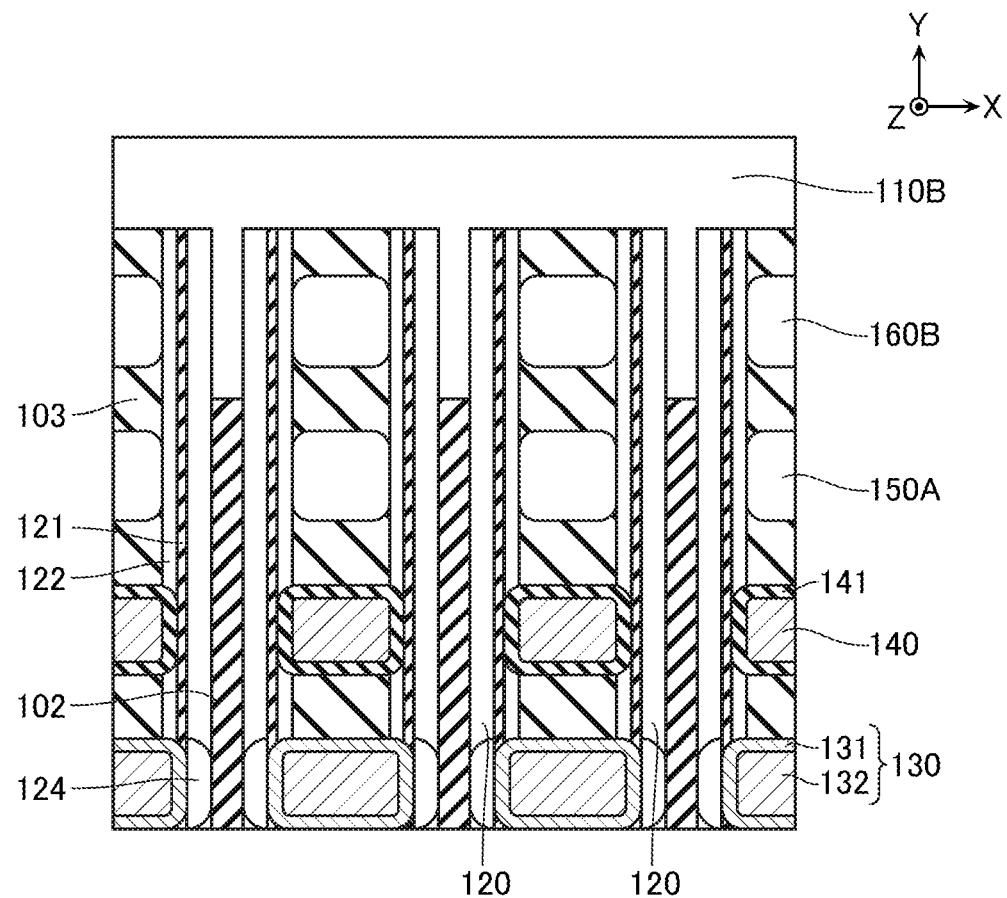
FIG. 31 is a schematic cross-sectional for describing the manufacturing method.
Figure 32:
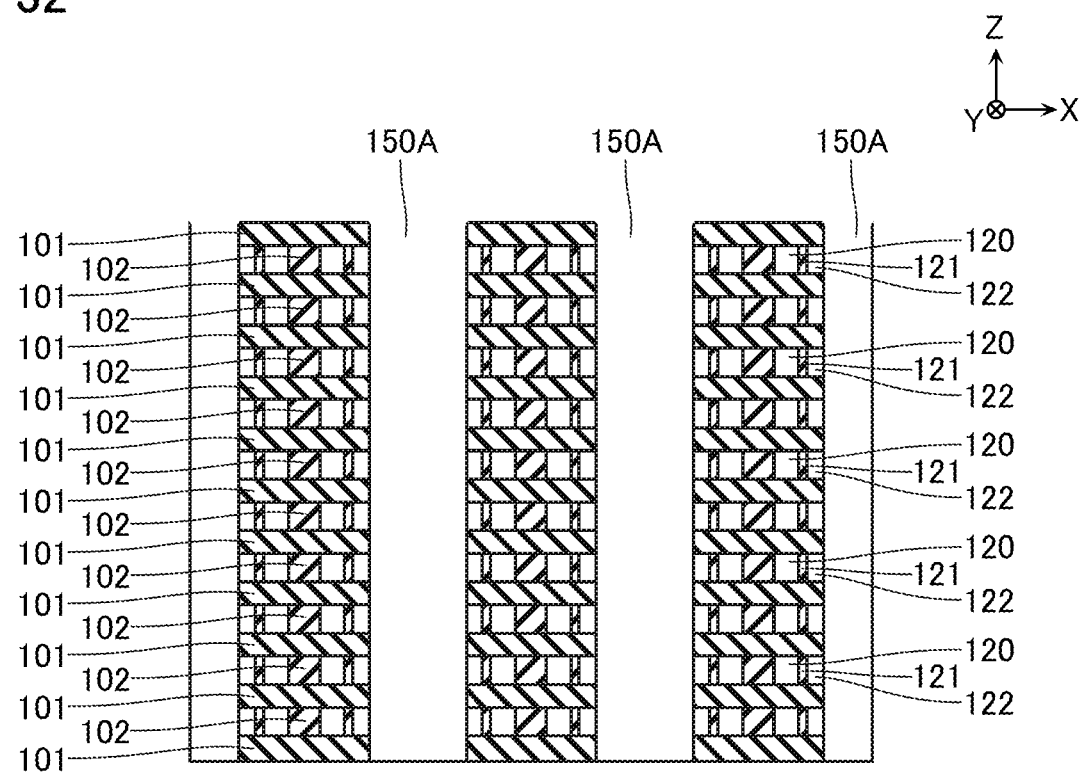
FIG. 32 is a schematic cross-sectional for describing the manufacturing method.

Next, for example, as illustrated in FIGS. 31 and 32, the sacrifice layer 150B is removed. This process is performed, for example, by wet etching or the like.

Figure 33:
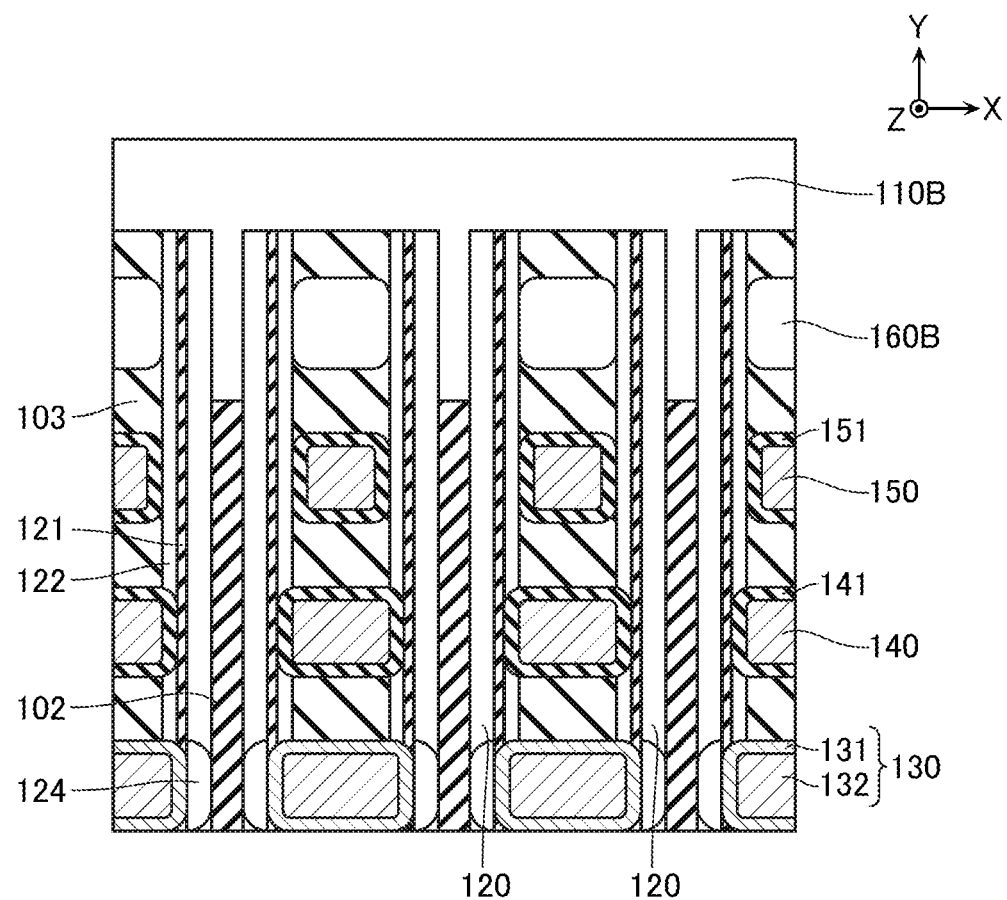
FIG. 33 is a schematic cross-sectional for describing the manufacturing method.
Figure 34:
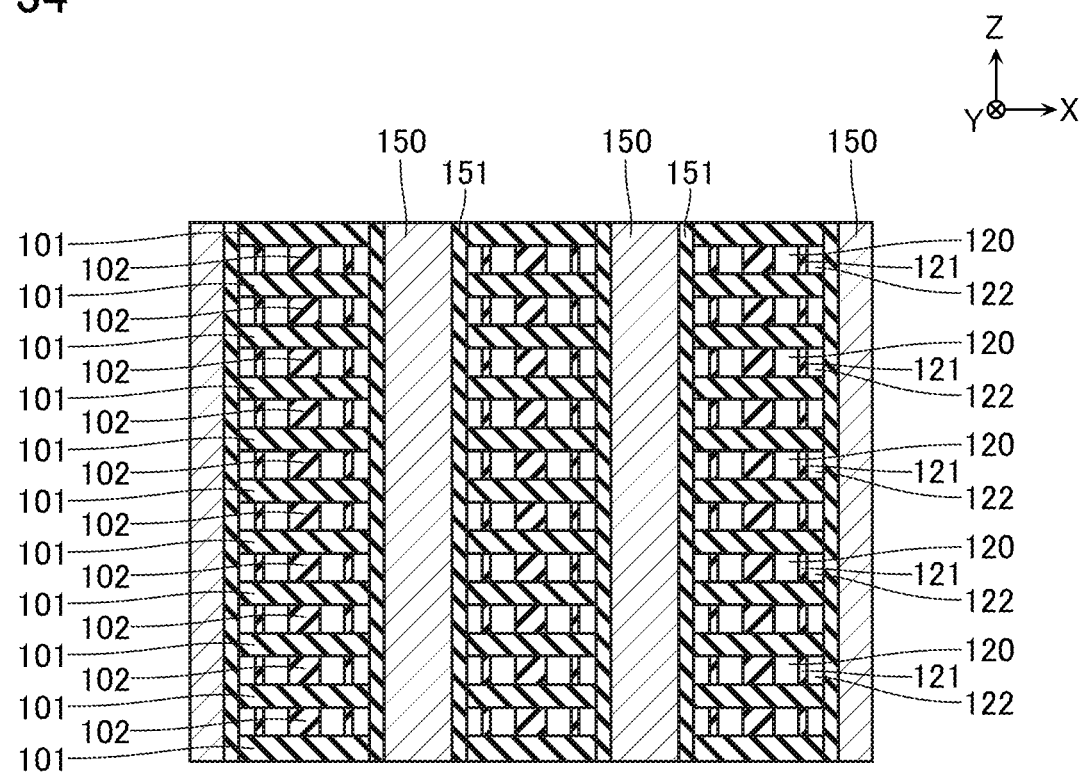
FIG. 34 is a schematic cross-sectional for describing the manufacturing method.

Next, for example, as illustrated in FIGS. 33 and 34, the insulating layer 151 and the electrode 150 are formed. This process is performed, for example, by CVD or the like.

Figure 35:
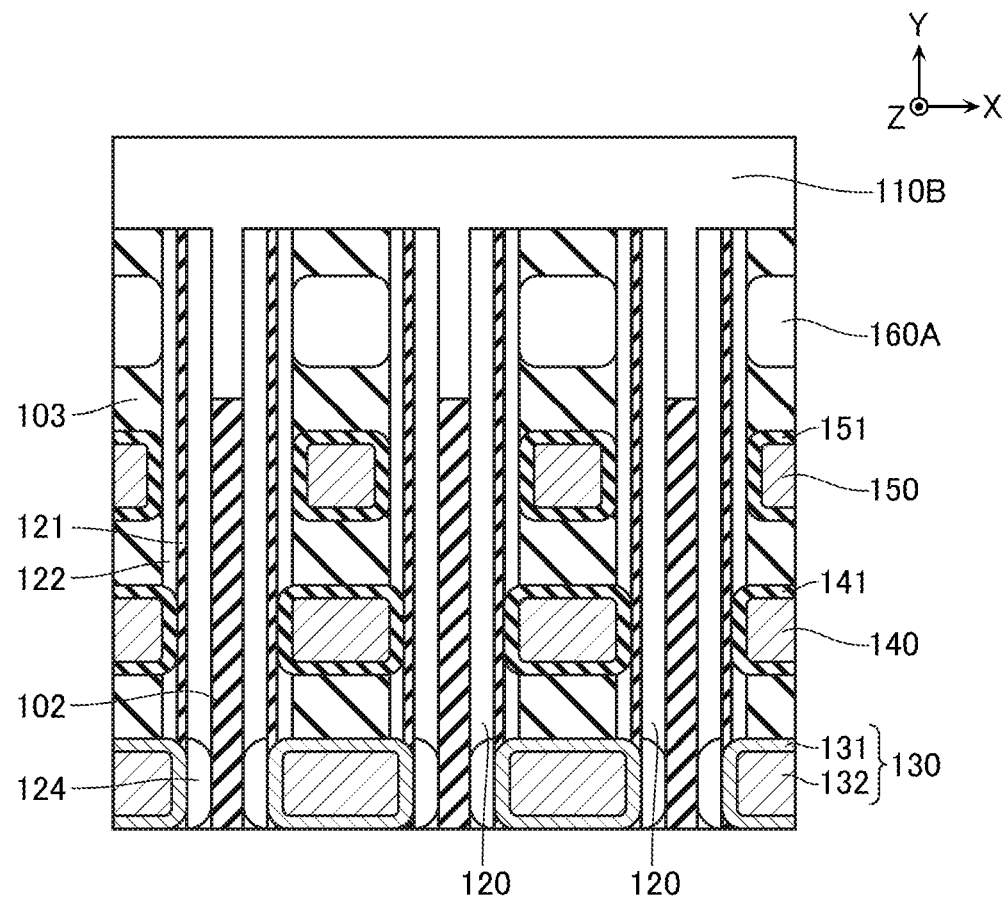
FIG. 35 is a schematic cross-sectional for describing the manufacturing method.
Figure 36:
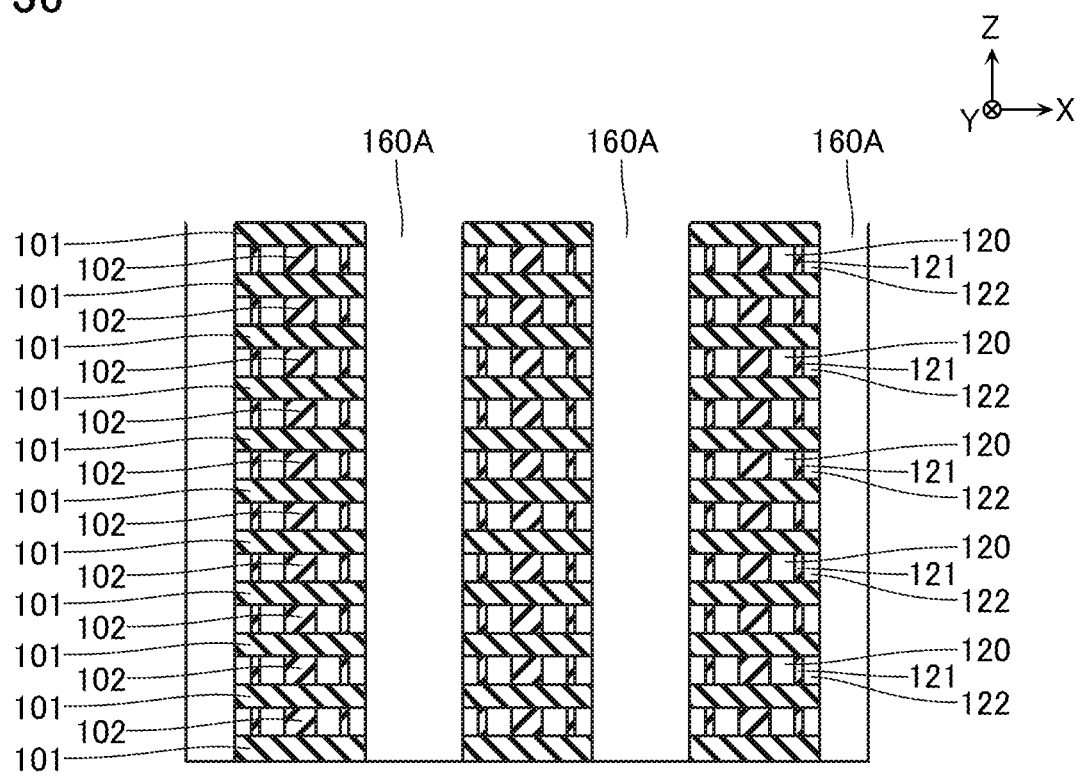
FIG. 36 is a schematic cross-sectional for describing the manufacturing method.

Next, for example, as illustrated in FIGS. 35 and 36, the sacrifice layer 160B is removed. This process is performed, for example, by wet etching or the like.

Figure 37:
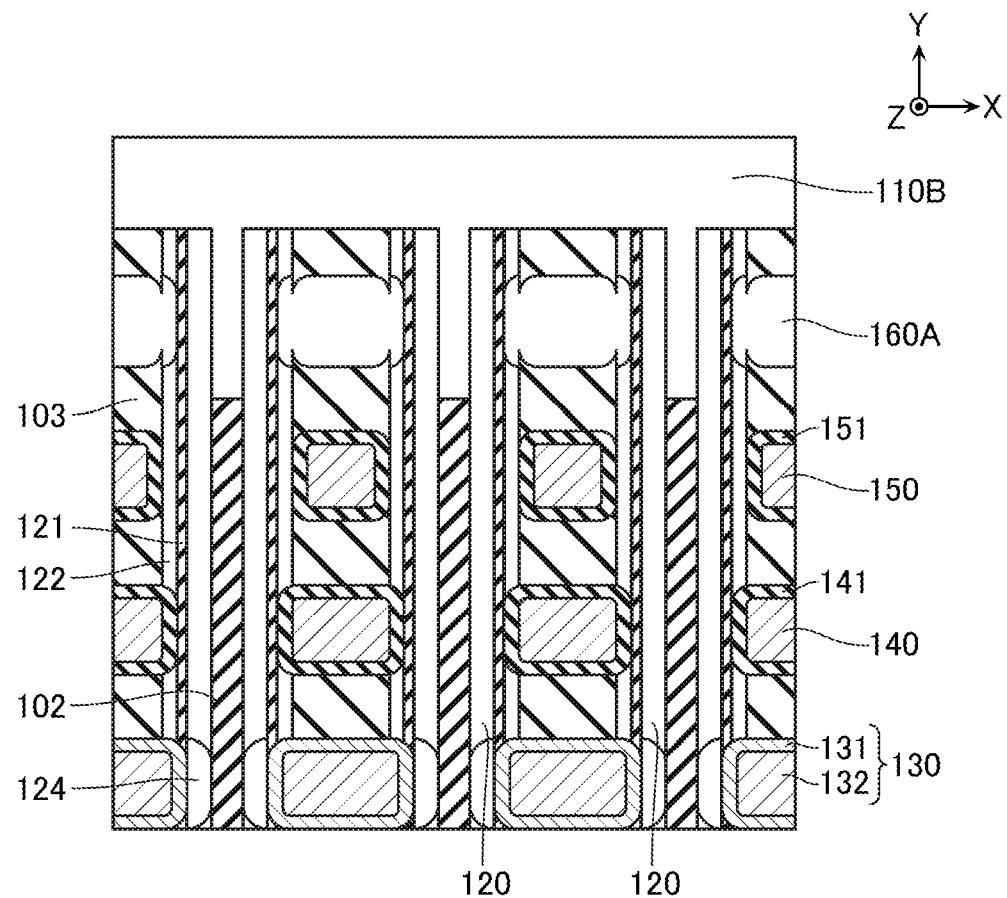
FIG. 37 is a schematic cross-sectional for describing the manufacturing method.
Figure 38:
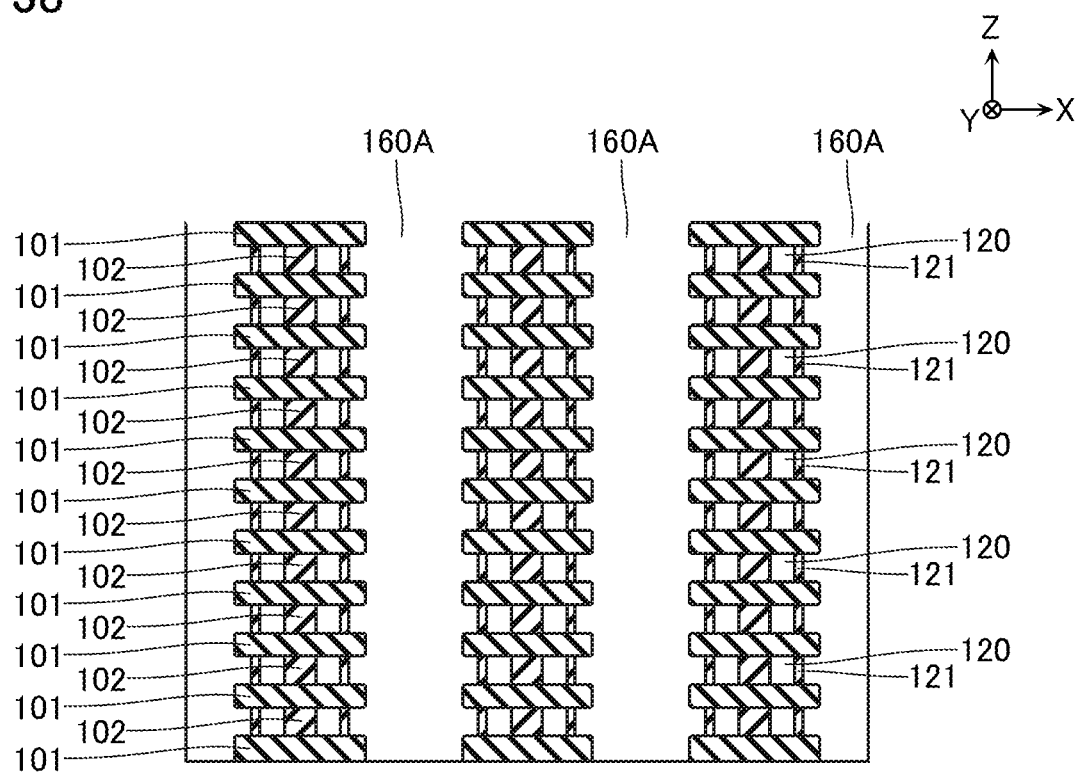
FIG. 38 is a schematic cross-sectional for describing the manufacturing method.

Next, for example, as illustrated in FIGS. 37 and 38, a part of the semiconductor layer 122 is removed, and parts of the upper surface and the lower surface of the insulating layer 101 and the side surface in the X direction of the insulating layer 121 are exposed. This process is performed, for example, by wet etching or the like.

Figure 39:
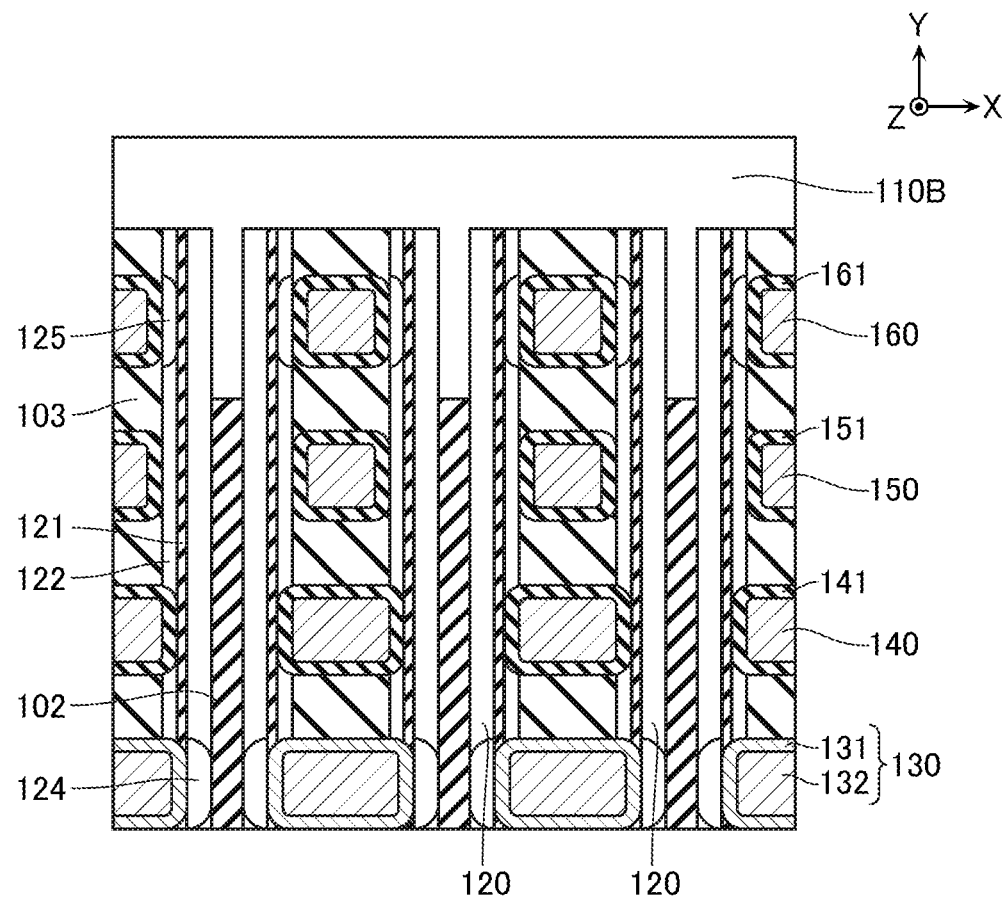
FIG. 39 is a schematic cross-sectional for describing the manufacturing method.
Figure 40:
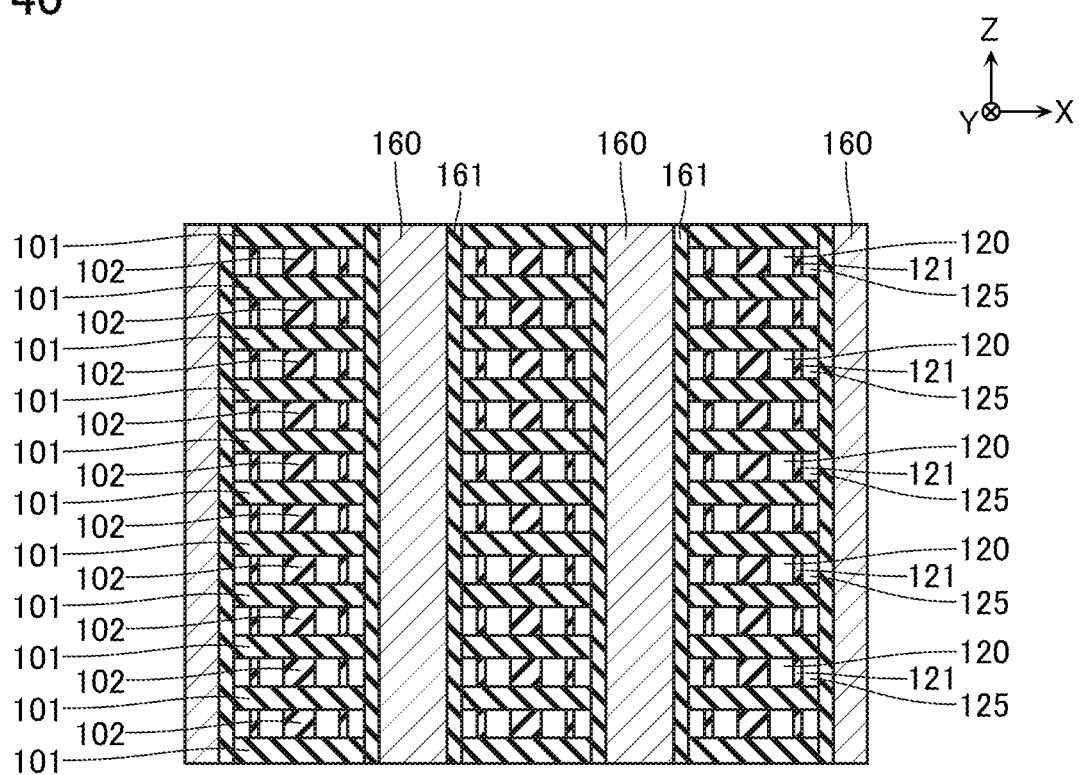
FIG. 40 is a schematic cross-sectional for describing the manufacturing method.

Next, for example, as illustrated in FIGS. 39 and 40, the semiconductor layer 125, the insulating layer 161, and the electrode 160 are formed. This process is performed, for example, by a method such as Atomic Layer Deposition (ALD), CVD, or wet etching.

Next, for example, as illustrated in FIGS. 1 and 2, the conductive layer 110 is formed. In this process, the sacrifice layer 110B is removed, for example, by a method such as wet etching. The conductive layer 110 is formed by a method such as CVD.

Read Operation

Figure 41:
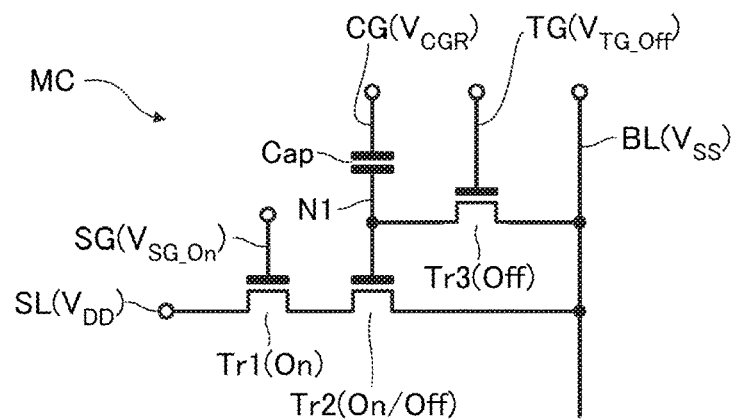
FIG. 41 is a schematic circuit diagram for describing a read operation of the semiconductor memory device according to the first embodiment.

Next, with reference to FIG. 41, the read operation of the semiconductor memory device according to the embodiment is described. FIG. 41 is a schematic circuit diagram for describing the read operation.

In the semiconductor memory device according to the embodiment, electric charge is accumulated in the node N1 corresponding to data stored in the memory cell MC. For example, when data "1" is stored in the memory cell MC, positive electric charge may be accumulated in the node N1. On the other hand, when data "0" is stored in the memory cell MC, electric charge needs not be accumulated, or negative electric charge may be accumulated in the node N1.

In the read operation of the semiconductor memory device according to the embodiment, a ground voltage $V_{ss}$ is applied to the bit line BL.

A voltage $V_{TG\_Off}$ is applied to the transfer gate line TG. A difference between the voltage $V_{TG\_Off}$ and the ground voltage $V_{ss}$ is smaller than a threshold voltage of the transistor Tr3. The voltage $V_{TG\_off}$ may be, for example, a voltage having a magnitude approximately the same as the ground voltage $V_{ss}$ or may be a voltage having a negative polarity. Thus, the transistor Tr3 turns OFF.

A voltage $V_{CGR}$ is applied to the control gate line CG. Thus, when positive electric charge has been accumulated in the node N1, the transistor Tr2 turns ON. On the other hand, when no electric charge has been accumulated in the node N1, the transistor Tr2 turns OFF.

A voltage $V_{SG\_on}$ is applied to the select gate line SG connected to a selected memory cell MC. A difference between the voltage $V_{SG\_on}$ and the ground voltage $V_{ss}$ is larger than a threshold voltage of the transistor Tr1. Thus, the transistor Tr1 in the selected memory cell MC turns ON.

Voltages $V_{SG\_Off}$ are applied to the other select gate lines SG. A difference between the voltage $V_{SG\_Off}$ and the ground voltage $V_{ss}$ is smaller than the threshold voltage of the transistor Tr1. The voltage $V_{SG\_Off}$ may be, for example, a voltage having a magnitude approximately the same as the ground voltage $V_{ss}$ or may be a voltage having a negative polarity. Thus, the transistor Tr1 in an unselected memory cell MC turns OFF.

A voltage $V_{DD}$ is applied to the source line SL. Here, when positive electric charge has been accumulated in the node N1, the transistor Tr2 turns ON, and thus, a current flow through the bit line BL. On the other hand, when no electric charge has been accumulated in the node N1, the transistor Tr2 turns OFF, and thus, the current does not flow in the bit line BL. Therefore, by detecting the current or the voltage of the bit line BL, the data stored in the selected memory cell MC is detectable.

Write Operation

Figure 42:
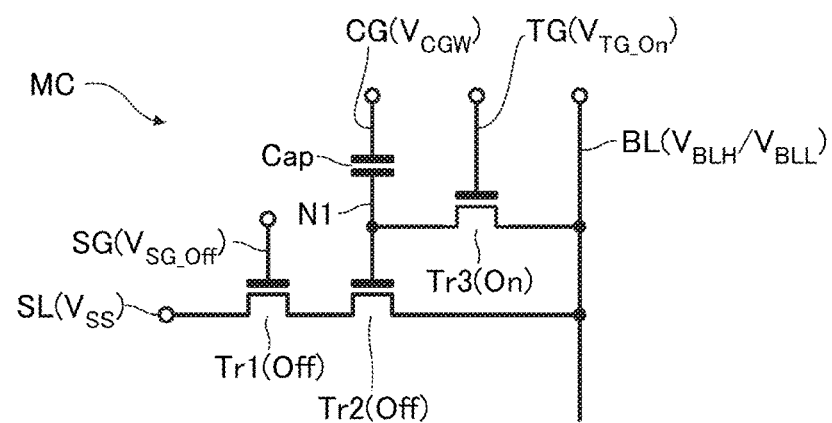
FIG. 42 is a schematic circuit diagram for describing a write operation of the semiconductor memory device according to the first embodiment.

Next, with reference to FIG. 42, the write operation of the semiconductor memory device according to the embodiment is described. FIG. 42 is a schematic circuit diagram for describing the write operation.

In the write operation of the semiconductor memory device according to the embodiment, in storing the data "1" in the memory cell MC, a voltage $V_{BLH}$ is applied to the bit line BL. On the other hand, in storing the data "0" in the memory cell MC, a voltage $V_{BLL}$ is applied to the bit line BL. The voltage $V_{BLL}$ is, for example, smaller than the voltage $V_{BLH}$.

In addition, a voltage $V_{TG\_on}$ is applied to the transfer gate line TG connected to the selected memory cell MC. Differences between the voltage $V_{TG\_on}$ and the voltages $V_{BLH}$ and $V_{BLL}$ are larger than the threshold voltage of the transistor Tr3. Thus, the transistor Tr3 in the selected memory cell MC turns ON.

The voltages $V_{TG\_Off}$ are applied to the other transfer gate lines TG.

A voltage $V_{CGW}$ is applied to the control gate line CG. The voltage $V_{CGW}$ may be, for example, a voltage smaller than the voltage $V_{CGR}$. The voltage $V_{CGW}$ may be, for example, a voltage having a magnitude approximately the same as the voltage $V_{BLL}$ or may be a voltage larger than the voltage $V_{BLL}$ and smaller than the voltage $V_{BLH}$.

Here, when the voltage $V_{BLH}$ has been applied to the bit line BL, electric charge is accumulated in the capacitor Cap. On the other hand, when the voltage $V_{BLL}$ has been applied to the bit line BL, electric charge is not accumulated in the capacitor Cap, or electric charge with a reversed polarity is accumulated in the capacitor Cap.

In addition, the voltage $V_{SG\_Off}$ is applied to the select gate line SG to cause the transistor Tr1 to turn OFF.

Data Inversion Operation

Figure 43:
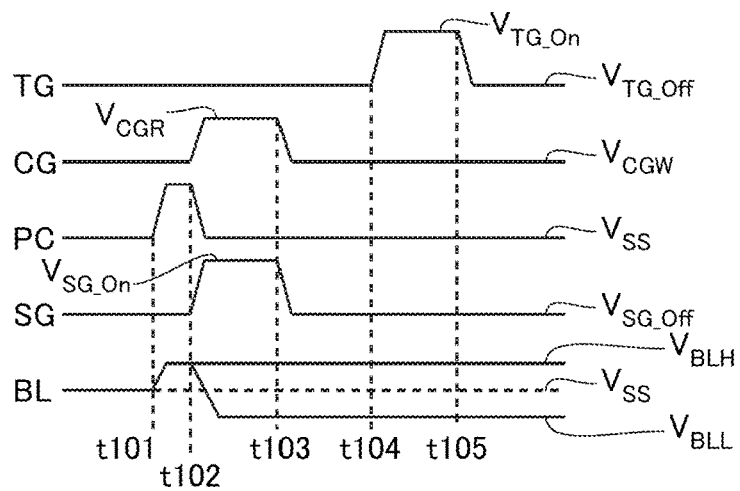
FIG. 43 is a schematic waveform diagram for describing a data inversion operation of the semiconductor memory device according to the first embodiment.
Figure 44:
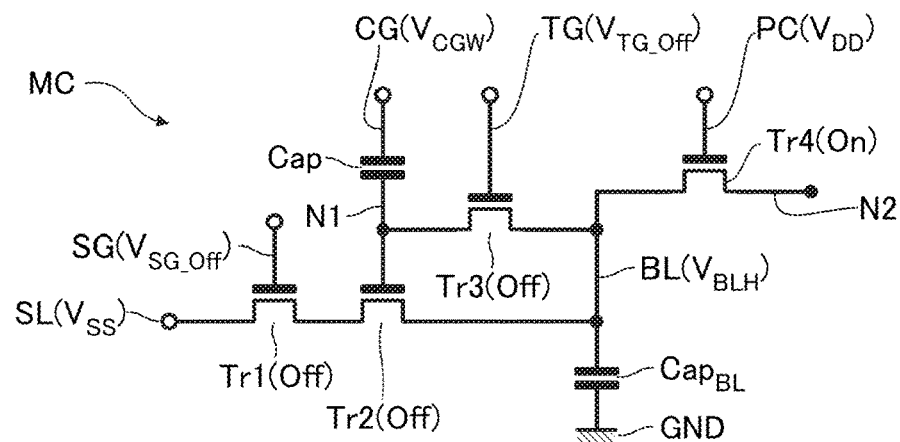
FIG. 44 is a schematic circuit diagram for describing the data inversion operation.
Figure 45:
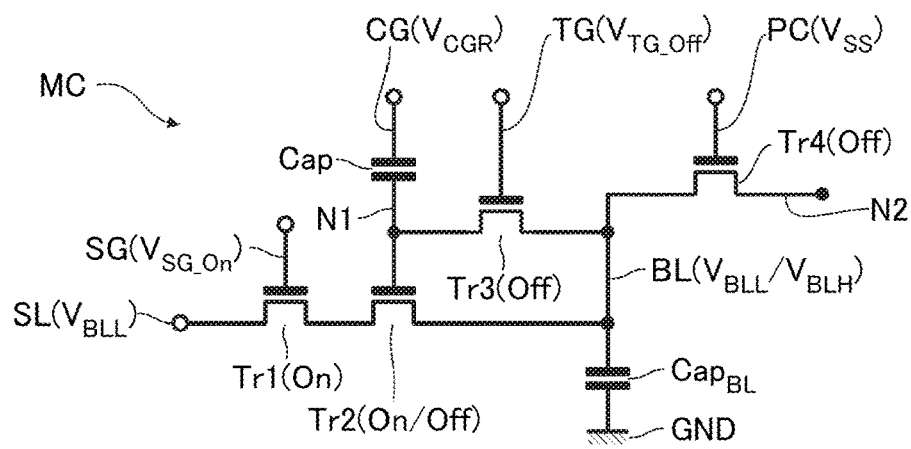
FIG. 45 is a schematic circuit diagram for describing the data inversion operation.
Figure 46:
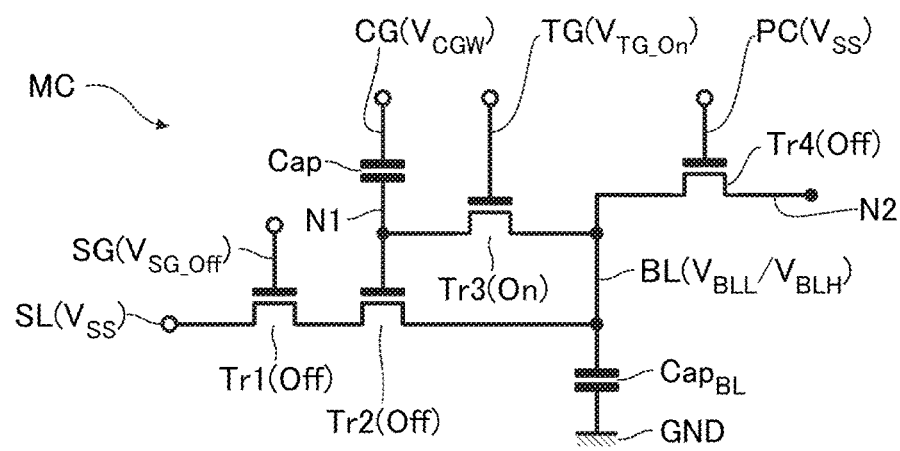
FIG. 46 is a schematic circuit diagram for describing the data inversion operation.

Next, with reference to FIG. 43 to FIG. 46, the data inversion operation of the semiconductor memory device according to the embodiment is described. FIG. 43 is a schematic waveform diagram for describing the data inversion operation. FIG. 44 to FIG. 46 are schematic circuit diagrams for describing the data inversion operation.

In FIG. 44 to FIG. 46, in addition to the configuration in the memory cell MC, a node N2 and a transistor Tr4 are indicated. The node N2 is electrically connected to the bit line BL and a capacitor $Cap_{BL}$ associated with the bit line BL via the transistor Tr4. A signal line PC is connected to a gate electrode of the transistor Tr4.

In the semiconductor memory device according to the embodiment, it is possible to invert the data stored in the memory cell MC without using a sense amplifier circuit, a latch circuit, and the like. That is, it is possible to store the data "0" to the memory cell MC where the data "1" has been stored, and to store the data "1" to the memory cell MC where the data "0" has been stored.

At timing t101 (FIG. 43) of the data inversion operation, as illustrated in in FIG. 44, the voltage $V_{BLH}$ is applied to the node N2. The voltage $V_{DD}$ is applied to the signal line PC. A difference between the voltage $V_{DD}$ and the voltage $V_{BLH}$ is larger than the threshold voltage of the transistor Tr4. Consequently, the transistor Tr4 turns ON, and the voltage of the bit line BL is charged up to the voltage $V_{BLH}$. In addition, the voltage $V_{TG\_Off}$ is applied to the transfer gate line TG to cause the transistor Tr3 to turn OFF. Furthermore, the voltage $V_{CGW}$ is applied to the control gate line CG to cause the transistor Tr2 to turn OFF. In addition, the voltage $V_{SG\_Off}$ is applied to the select gate line SG to cause the transistor Tr1 to turn OFF.

At timing t102 (FIG. 43) of the data inversion operation, as illustrated in in FIG. 45, the voltage $V_{BLL}$ is applied to the source line SL. The voltage $V_{SG\_on}$ is applied to the select gate line SG. A difference between the voltage $V_{SG\_on}$ and the voltage $V_{BLL}$ is larger than the threshold voltage of the transistor Tr1. Consequently, the transistor Tr1 turns ON. In addition, the voltage $V_{CGR}$ is applied to the control gate line CG. Here, when positive electric charge has been accumulated in the node N1, the transistor Tr2 turns ON. On the other hand, when no electric charge has been accumulated in the node N1, the transistor Tr2 turns OFF. Furthermore, the voltage $V_{TG\_Off}$ is applied to the transfer gate line TG to cause the transistor Tr3 to turn OFF. In addition, the ground voltage $V_{ss}$ is applied to the signal line PC to cause the transistor Tr4 to turn OFF.

In such state, when positive electric charge has been accumulated in the node N1, the transistor Tr2 turns ON, and thus, the voltage $V_{BLL}$ is transferred to the bit line BL. On the other hand, when no electric charge has been accumulated in the node N1, the transistor Tr2 turns OFF, and thus, the voltage of the bit line BL is maintained at the voltage $V_{BLH}$.

At timing t103 (FIG. 43) of the data inversion operation, the voltage $V_{SG\_Off}$ is applied to the select gate line SG to cause the transistor Tr1 to turn OFF. Furthermore, the voltage $V_{CGW}$ is applied to the control gate line CG to cause the transistor Tr2 to turn OFF. In addition, the voltage $V_{TG\_Off}$ is applied to the transfer gate line TG to cause the transistor Tr3 to turn OFF. Furthermore, the ground voltage $V_{ss}$ is applied to the signal line PC to cause the transistor Tr4 to turn OFF.

At timing t104 (FIG. 43) of the data inversion operation, as illustrated in FIG. 46, the voltage $V_{SG\_Off}$ is applied to the select gate line SG to cause the transistor Tr1 to turn OFF. Furthermore, the voltage $V_{CGW}$ is applied to the control gate line CG to cause the transistor Tr2 to turn OFF. In addition, the voltage $V_{TG\_on}$ is applied to the transfer gate line TG to cause the transistor Tr3 to turn ON. Furthermore, the ground voltage $V_{ss}$ is applied to the signal line PC to cause the transistor Tr4 to turn OFF.

Here, when positive electric charge has been accumulated in the node N1 at a time point of starting the data inversion operation, the voltage of the bit line BL is the voltage $V_{BLL}$. Consequently, positive electric charge in the node N1 is discharged to the bit line BL. On the other hand, when no electric charge has been accumulated in the node N1 at a time point of starting the data inversion operation, the voltage of the bit line BL is the voltage $V_{BLH}$. Consequently, positive electric charge is accumulated in the node N1.

Self-Refresh Operation

Figure 47:
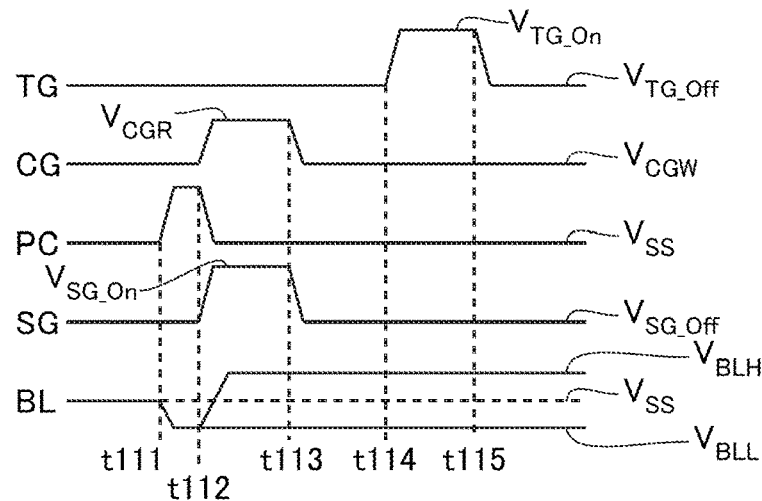
FIG. 47 is a schematic waveform diagram for describing a self-refresh operation of the semiconductor memory device according to the first embodiment
Figure 48:
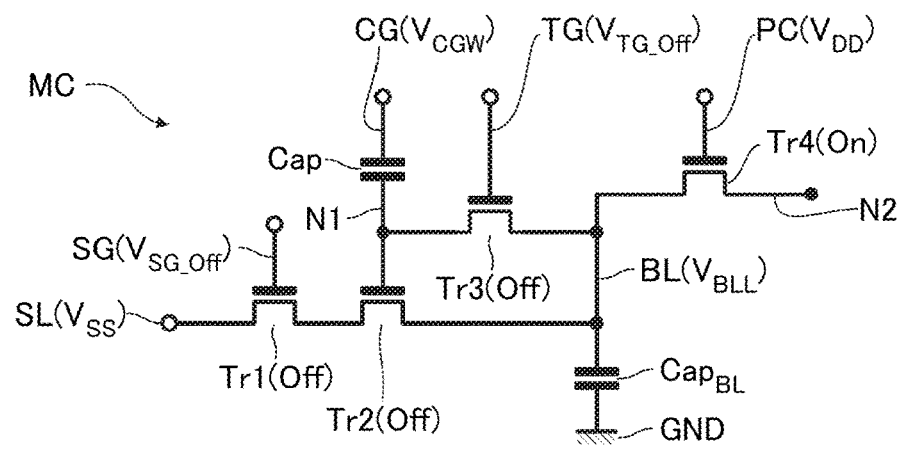
FIG. 48 is a schematic circuit diagram for describing the self-refresh operation.
Figure 49:
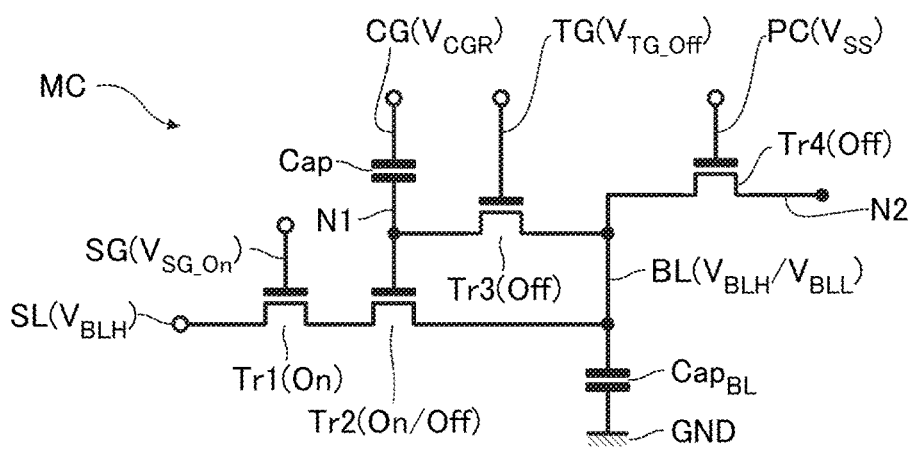
FIG. 49 is a schematic circuit diagram for describing the self-refresh operation.
Figure 50:
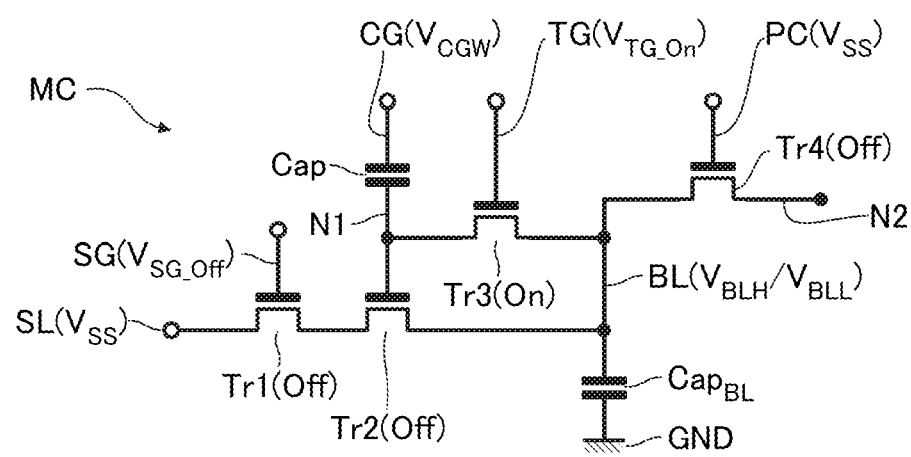
FIG. 50 is a schematic circuit diagram for describing the self-refresh operation.

Next, with reference to FIG. 47 to FIG. 50, the self-refresh operation of the semiconductor memory device according to the embodiment is described. FIG. 47 is a schematic waveform diagram for describing the self-refresh operation. FIG. 48 to FIG. 50 are schematic circuit diagrams for describing the self-refresh operation. In FIG. 48 to FIG. 50, in addition to the configuration of the memory cell MC, the node N2 and the transistor Tr4 are indicated.

The operation at timing t111 (FIG. 47) of the self-refresh operation is basically the same as the operation at timing t101 of the data inversion operation. However, at timing t111, as illustrated in FIG. 48, the voltage $V_{BLL}$ is applied to the node N2 instead of the voltage $V_{BLH}$.

The operation at timing t112 (FIG. 47) of the self-refresh operation is basically the same as the operation at timing t102 of the data inversion operation. However, at timing t112, as illustrated in FIG. 49, the voltage $V_{BLH}$ is applied to the source line SL instead of the voltage $V_{BLL}$.

In such state, when positive electric charge has been accumulated in the node N1, the transistor Tr2 turns ON, and thus, the voltage V BLH is transferred to the bit line BL. On the other hand, when no electric charge has been accumulated in the node N1, the transistor Tr2 turns OFF, and thus, the voltage of the bit line BL is maintained at the voltage $V_{BLL}$.

The operation at timing t113 (FIG. 47) of the self-refresh operation is the same as the operation at timing t103 of the data inversion operation.

The operation at timing t114 (FIG. 47) of the self-refresh operation is, as illustrated in FIG. 50, the same as the operation at timing t104 of the data inversion operation.

Here, when positive electric charge has been accumulated in the node N1 at a time point of starting the self-refresh operation, the voltage of the bit line BL is the voltage $V_{BLH}$. Consequently, positive electric charge is accumulated to the node N1. On the other hand, when no electric charge has been accumulated in the node N1 at a time point of starting the self-refresh operation, the voltage of the bit line BL is the voltage $V_{BLL}$.

Consequently, positive electric charge in the node N1 is discharged to the bit line BL, and the node N1 is maintained at a state of no accumulated electric charge.

Second Embodiment

Configuration

Figure 51:
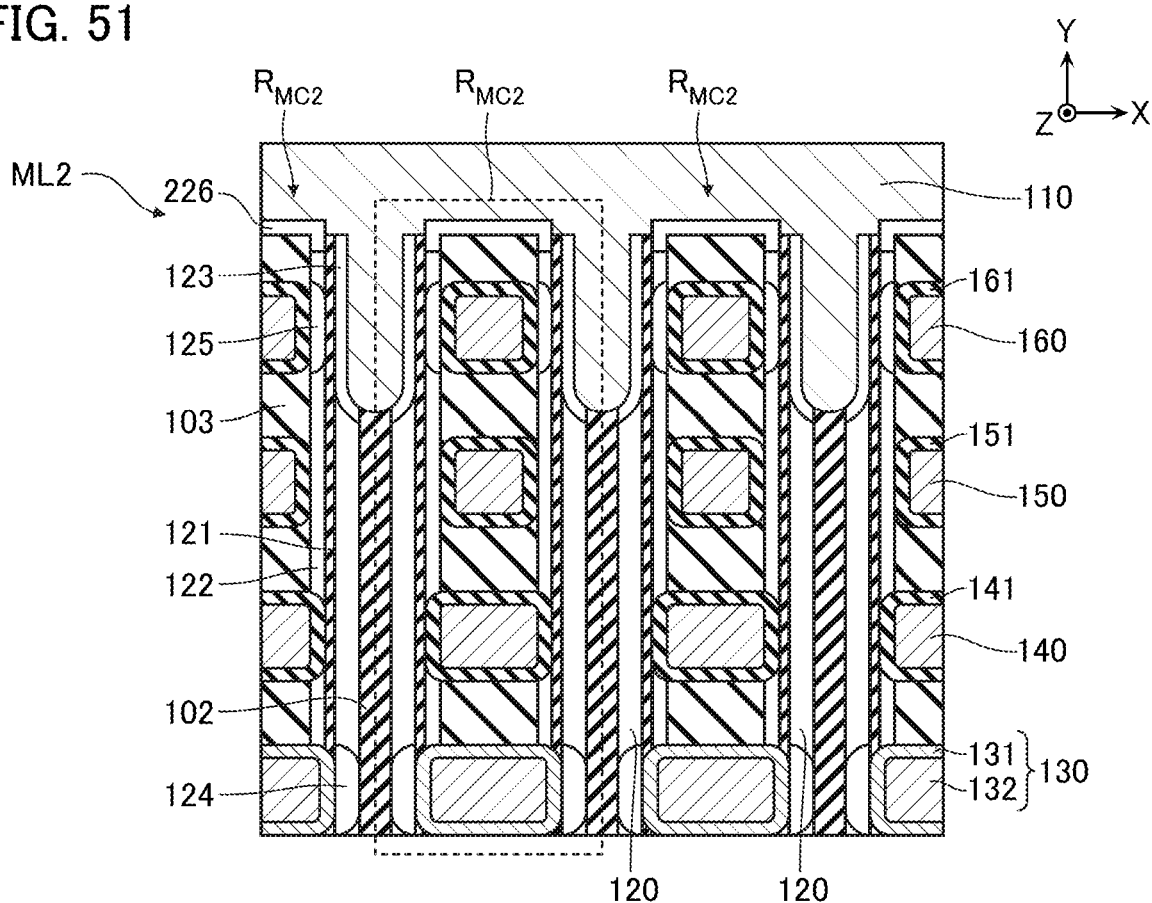
FIG. 51 is a schematic plan view illustrating a part of a configuration of a semiconductor memory device according to a second embodiment.
Figure 52:
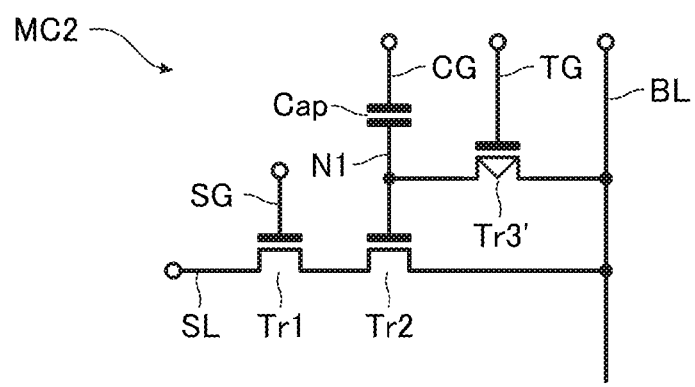
FIG. 52 is a schematic circuit diagram illustrating a part of the configuration of the semiconductor memory device.

FIG. 51 is a schematic plan view illustrating a part of a configuration of a semiconductor memory device according to the second embodiment. FIG. 52 is a schematic circuit diagram illustrating a part of the configuration of the semiconductor memory device according to the embodiment.

The semiconductor memory device according to the second embodiment is basically configured similarly to the semiconductor memory device according to the first embodiment. However, the semiconductor memory device according to the second embodiment includes a memory layer ML2, instead of the memory layer ML.

As illustrated in FIG. 51, the memory layer ML2 is basically configured similarly to the memory layer ML. However, the memory layer ML2 includes a memory cell region $R_{MC2}$, instead of the memory cell region $R_{MC}$. The memory cell region $R_{MC2}$ is basically configured similarly to the memory cell region $R_{MC}$. However, memory cell region $R_{MC2}$ includes an impurity region 226, instead of the impurity region 126. The impurity region 226 is basically configured similarly to the impurity region 126. However, the impurity region 126 contains the N-type impurities such as phosphorus (P). On the other hand, the impurity region 226 contains P-type impurities such as boron (B).

Each configuration in the memory cell region $R_{MC2}$ constitutes a memory cell MC2 as illustrated in FIG. 52. The memory cell MC2 is basically configured similarly to the memory cell MC. However, the memory cell MC2 includes a transistor Tr3", instead of the transistor Tr3. The transistor Tr3" is basically configured similarly to the transistor Tr3. However, While the transistor Tr3 is the N-channel type field effect transistor, the transistor Tr3" is a P-channel type field effect transistor.

Read Operation

Figure 53:
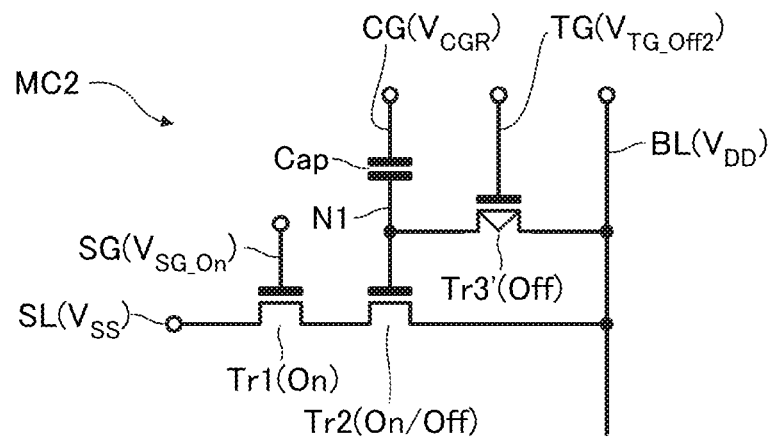
FIG. 53 is a schematic circuit diagram for describing a read operation of the semiconductor memory device according to the second embodiment.

Next, with reference to FIG. 53, the read operation of the semiconductor memory device according to the embodiment is described. FIG. 53 is a schematic circuit diagram for describing the read operation.

The read operation of the semiconductor memory device according to the embodiment is basically executed similarly to the read operation of the semiconductor memory device according to the first embodiment.

However, in the read operation of the semiconductor memory device according to the embodiment, the voltage $V_{DD}$ is applied to the bit line BL, and the ground voltage $V_{ss}$ is applied to the source line SL.

Furthermore, in the read operation of the semiconductor memory device according to the embodiment, a voltage $V_{TG\_off2}$ is applied to the transfer gate line TG. A difference between the voltage $V_{TG\_Off2}$ and the voltage $V_{DD}$ is larger than the threshold voltage of the transistor Tr3'. Thus, the transistor Tr3' turns OFF.

Write Operation

Figure 54:
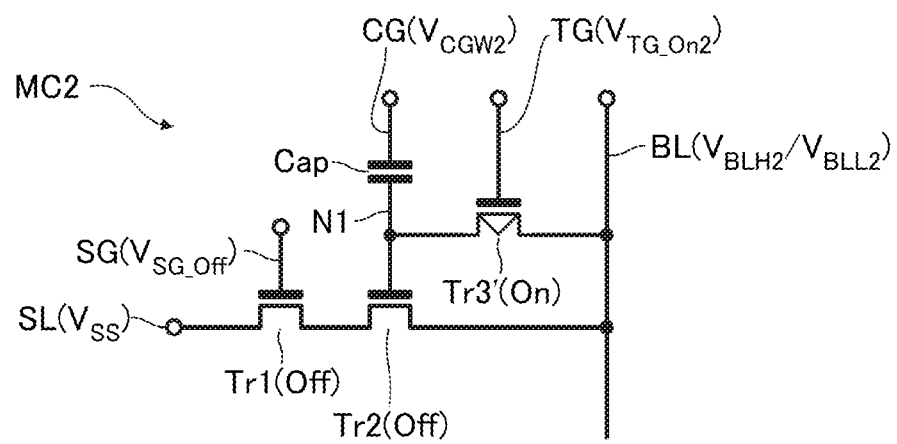
FIG. 54 is a schematic circuit diagram for describing a write operation of the semiconductor memory device according to the second embodiment.

Next, with reference to FIG. 54, the write operation of the semiconductor memory device according to the embodiment is described. FIG. 54 is a schematic circuit diagram for describing the write operation.

The write operation of the semiconductor memory device according to the embodiment is basically executed similarly to the write operation of the semiconductor memory device according to the first embodiment.

However, in the write operation of the semiconductor memory device according to the embodiment, in storing the data "1" in the memory cell MC2, a voltage $V_{BLH2}$ is applied to the bit line BL. On the other hand, in storing the data "0" in the memory cell MC2, a voltage $V_{BLL2}$ is applied to the bit line BL. The voltage $V_{BLL2}$ is, for example, smaller than the voltage $V_{BLH2}$.

A voltage $V_{TG\_on2}$ is applied to the transfer gate line TG connected to a selected memory cell MC2. A difference between the voltage $V_{TG\_on2}$ and the voltages $V_{BLH2}$ and a difference between the voltage $V_{TG\_on2}$ and the voltage $V_{BLL2}$ are equal to or less than a threshold voltage of the transistor Tr3'. Thus, the transistor Tr3' turns ON.

Furthermore, a voltage $V_{CGW2}$ is applied to the control gate line CG. The voltage $V_{CGW2}$ may be, for example, a voltage larger than the voltage $V_{CGR}$ and smaller than the voltage $V_{DD}$. The voltage $V_{CGW2}$ may be, for example, a voltage having a magnitude approximately the same as the voltage $V_{BLL2}$ and may be a voltage larger than the voltage $V_{BLL2}$ and smaller than the voltage $V_{BLH2}$.

Third Embodiment

Configuration

Figure 55:
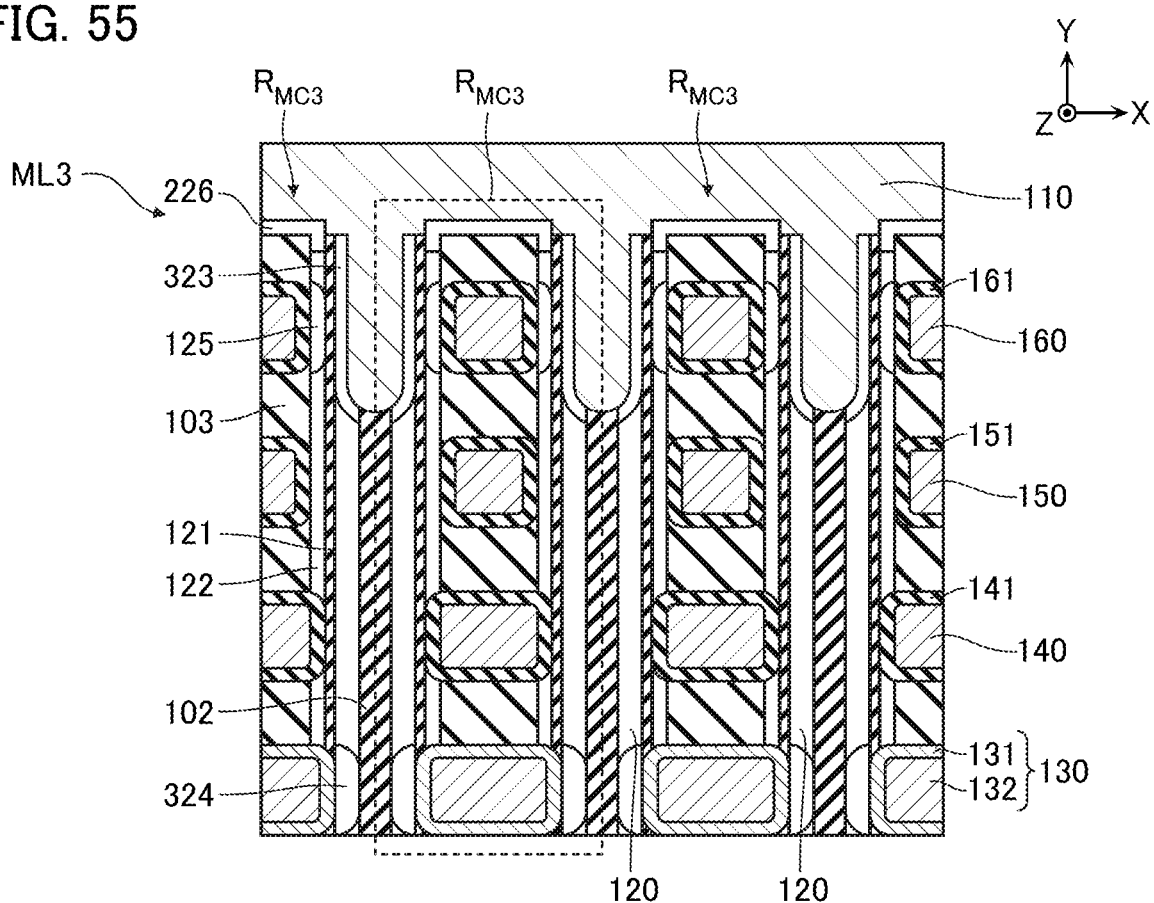
FIG. 55 is a schematic plan view illustrating a part of a configuration of a semiconductor memory device according to a third embodiment.
Figure 56:
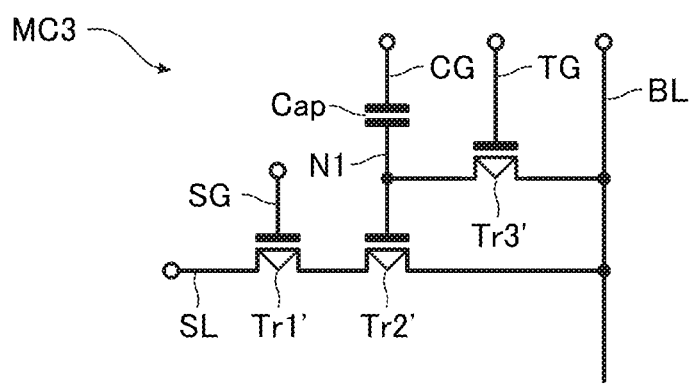
FIG. 56 is a schematic circuit diagram illustrating a part of the configuration of the semiconductor memory device.

FIG. 55 is a schematic plan view illustrating a part of a configuration of a semiconductor memory device according to the third embodiment. FIG. 56 is a schematic circuit diagram illustrating a part of the configuration of the semiconductor memory device according to the embodiment.

The semiconductor memory device according to the third embodiment is basically configured similarly to the semiconductor memory device according to the second embodiment. However, the semiconductor memory device according to the third embodiment includes a memory layer ML3, instead of the memory layer ML2.

As illustrated in FIG. 55, the memory layer ML3 is basically configured similarly to the memory layer ML2. However, the memory layer ML3 includes a memory cell region $R_{MC3}$ f instead of the memory cell region $R_{MC2}$. The memory cell region $R_{MC3}$ is basically configured similarly to the memory cell region $R_{MC2}$. However, the memory cell region $R_{MC3}$ includes impurity regions 323 and 324, instead of the impurity regions 123 and 124. The impurity regions 323 and 324 are basically configured similarly to the impurity regions 123 and 124. However, the impurity regions 123 and 124 contain the N-type impurities such as phosphorus (P). On the other hand, the impurity regions 323 and 324 contain P-type impurities such as boron (B).

Each configuration in the memory cell region $R_{MC3}$ constitutes a memory cell MC3 as illustrated in FIG. 56. The memory cell MC3 is basically configured similarly to the memory cell MC2. However, the memory cell MC3 includes transistors Tr1' and Tr2", instead of the transistors Tr1 and Tr2. The transistors Tr1' and Tr2" are basically configured similarly to the transistors Tr1 and Tr2. However, While the transistors Tr1 and Tr2 are the N-channel type field effect transistors, the transistors Tr1' and Tr2" are a P-channel type field effect transistors.

Read Operation

Figure 57:
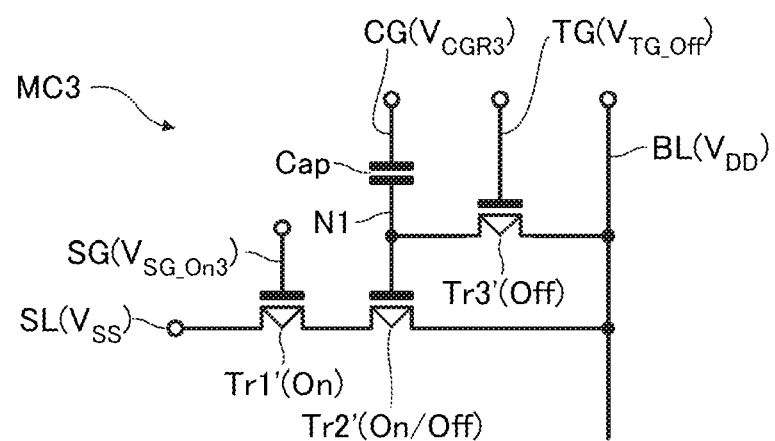
FIG. 57 is a schematic circuit diagram for describing a read operation of the semiconductor memory device according to the third embodiment.

Next, with reference to FIG. 57, the read operation of the semiconductor memory device according to the embodiment is described. FIG. 57 is a schematic circuit diagram for describing the read operation.

The read operation of the semiconductor memory device according to the embodiment is basically executed similarly to the read operation of the semiconductor memory device according to the second embodiment.

However, in the read operation of the semiconductor memory device according to the embodiment, a voltage $V_{CGR3}$ is applied to the control gate line CG. Thus, when positive electric charge has been accumulated in the node N1, the transistor Tr2' turns OFF. On the other hand, when no electric charge has been accumulated in the node N1, the transistor Tr2' turns ON.

In the read operation of the semiconductor memory device according to the embodiment, a voltage $V_{SG\_on3}$ is applied to the select gate line SG connected to a selected memory cell MC3. A difference between the voltage $V_{SG\_on3}$ and the voltage $V_{DD}$ is equal to or less than a threshold voltage of the transistor Tr1'. The voltage $V_{SG\_on3}$ may be, for example, a voltage of a negative polarity. Thus, the transistor Tr1' in the selected memory cell MC3 turns ON. Furthermore, in the read operation of the semiconductor memory device according to the embodiment, voltages $V_{SG\_Off3}$ are applied to the other select gate lines SG. A difference between the voltage $V_{SG\_Off3}$ and the voltage $V_{DD}$ is larger than the threshold voltage of the transistor Tr1'. The voltage $V_{SG\_Off3}$ may be, for example, a voltage having a magnitude approximately the same as the ground voltage $V_{ss}$. Thus, the transistor Tr1' in the selected memory cell MC3 turns OFF.

[Write Operation]

The write operation of the semiconductor memory device according to the embodiment is executed similarly to the write operation of the semiconductor memory device according to the second embodiment.

Fourth Embodiment

[Configuration]

Figure 58:
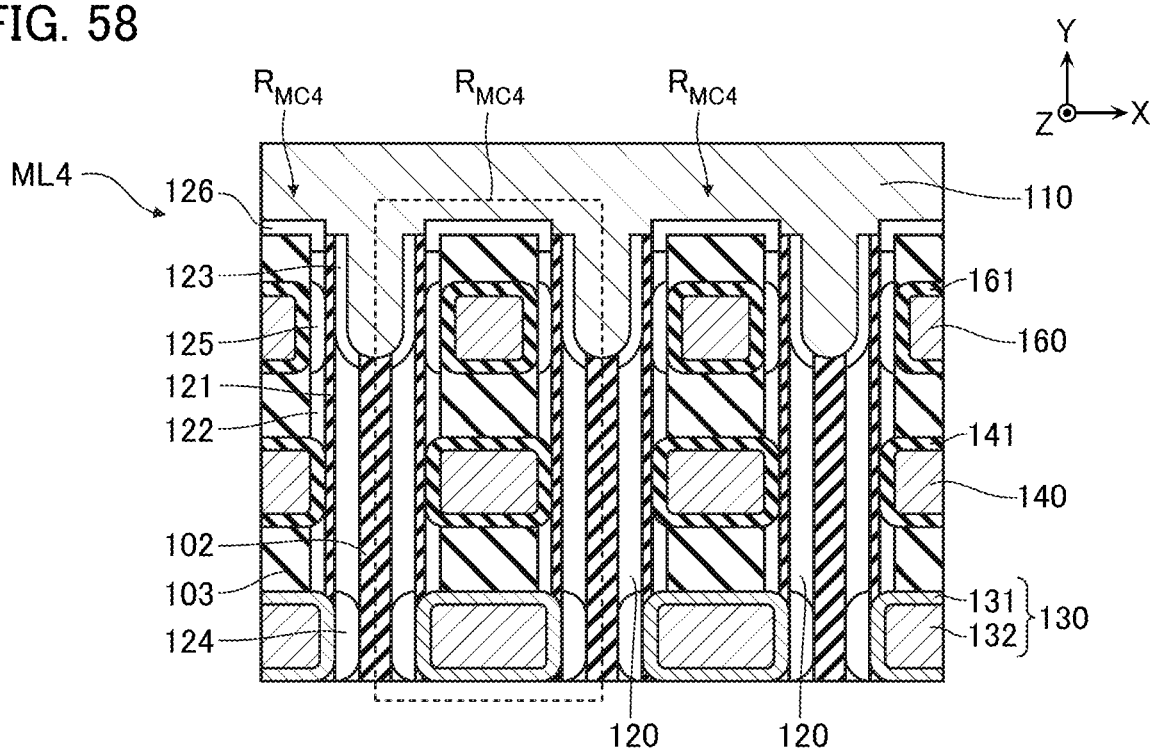
FIG. 58 is a schematic plan view illustrating a part of a configuration of a semiconductor memory device according to a fourth embodiment.
Figure 59:
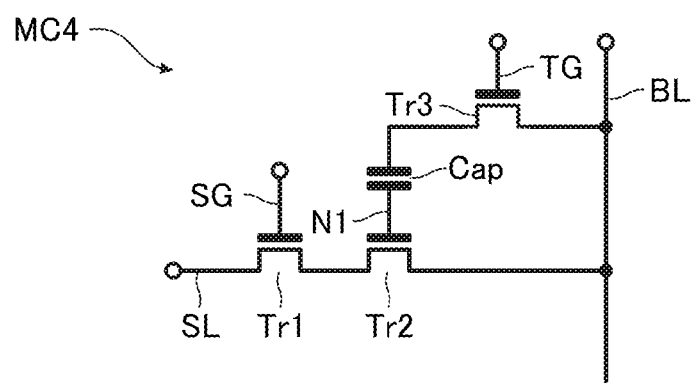
FIG. 59 is a schematic circuit diagram illustrating a part of the configuration of the semiconductor memory device.

FIG. 58 is a schematic plan view illustrating a part of a configuration of a semiconductor memory device according to the fourth embodiment. FIG. 59 is a schematic circuit diagram illustrating a part of the configuration of the semiconductor memory device according to the embodiment.

The semiconductor memory device according to the fourth embodiment is basically configured similarly to the semiconductor memory device according to the first embodiment. However, the semiconductor memory device according to the fourth embodiment includes a memory layer ML4, instead of the memory layer ML.

As illustrated in FIG. 58, the memory layer ML4 includes a plurality of memory cell regions $R_{MC4}$ arranged in the X direction and the conductive layer 110 extending in the X direction along the plurality of memory cell regions $R_{MC4}$. Between two memory cell regions $R_{MC4}$ mutually adjacent in the X direction, the insulating layer 102 of silicon nitride ($Si_3N_4$) or the like is disposed.

The structure in the memory cell region $R_{MC4}$ is basically similar to the structure in the memory cell region $R_{MC}$. However, the electrode 150 and the insulating layer 151 are not disposed in the memory cell region $R_{MC4}$.

Each configuration in the memory cell region $R_{MC4}$ configures a memory cell MC4 as illustrated in FIG. 59. The memory cell MC4 is basically configured similarly to the memory cell MC. However, the memory cell MC4 is not connected to the control gate line CG. In addition, the gate electrode of the transistor Tr2 is connected to the bit line BL via the capacitor Cap and the transistor Tr3.

[Manufacturing Method]

A manufacturing method of the semiconductor memory device according to the fourth embodiment is basically similar to the manufacturing method of the semiconductor memory device according to the first embodiment. However, in the manufacturing method of the semiconductor memory device according to the fourth embodiment, the opening 150A is not formed. In addition, the processes described with reference to FIG. 31 to FIG. 34 are not executed in the process described with reference to FIGS. 13 and 14.

[Operation]

A read operation, a write operation, a data inversion operation, and a self-refresh operation of the semiconductor memory device according to the fourth embodiment are executable similarly to the semiconductor memory device according to the first embodiment.

[Effect]

The semiconductor memory device according to the fourth embodiment does not include the electrode 150 and the insulating layer 151. Therefore, compared with the semiconductor memory device according to the first embodiment, high integration is easily achievable.

Fifth Embodiment

[Configuration]

Figure 60:
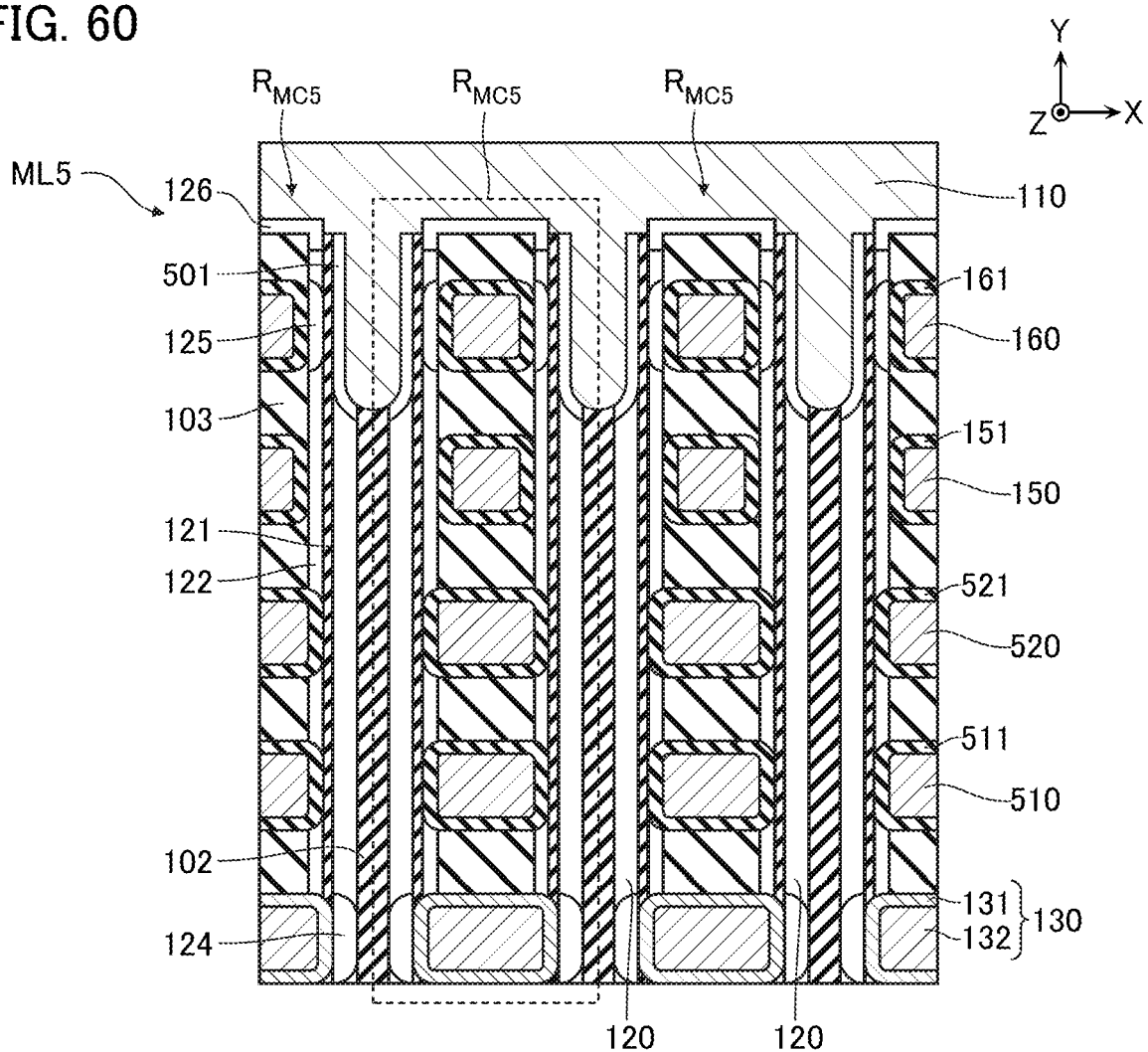
FIG. 60 is a schematic plan view illustrating a part of a configuration of a semiconductor memory device according to a fifth embodiment.

FIG. 60 is a schematic plan view illustrating a part of a configuration of a semiconductor memory device according to the fifth embodiment.

The semiconductor memory device according to the fifth embodiment is basically configured similarly to the semiconductor memory device according to the first embodiment. However, the semiconductor memory device according to the fifth embodiment includes a memory layer ML5, instead of the memory layer ML.

As illustrated in in FIG. 60, the memory layer ML5 includes a plurality of memory cell regions $R_{MC5}$ arranged in the X direction and the conductive layer 110 extending in the X direction along the plurality of memory cell regions $R_{MC5}$. Between two memory cell regions RMCs mutually adjacent in the X direction, the insulating layer 102 of silicon nitride ($Si_3N_4$) or the like is disposed.

The structure in the memory cell region $R_{MC5}$ is basically similar to the structure in the memory cell region $R_{MC}$.

However, between two semiconductor layers 120 of the memory cell region $R_{MC5}$, five electrodes 130, 510, 520, 150, and 160 arranged in the Y direction are disposed. The electrode 510 is closer to the conductive layer 110 than the electrode 130. The electrode 520 is closer to the conductive layer 110 than the electrode 510. The electrode 150 is closer to the conductive layer 110 than the electrode 520. The electrodes 510 and 520 penetrate a plurality of the memory layers ML5 to extend in the Z direction. Insulating layers 511 and 521 are disposed on outer peripheral surfaces of the electrode 510 and 520, respectively.

The electrodes 510 and 520 are configured similarly to the electrode 140 of the semiconductor memory device according to the first embodiment. Furthermore, the insulating layers 511 and 521 are configured similarly to the insulating layer 141 of the semiconductor memory device according to the first embodiment.

In the memory cell region RMCs, at a connecting portion to the conductive layer 110 of the semiconductor layer 120, an impurity region 501 is disposed. The impurity region 501 contains, for example, P-type impurities such as boron (B).

[Manufacturing Method]

A manufacturing method of the semiconductor memory device according to the fifth embodiment is basically similar to the manufacturing method of the semiconductor memory device according to the first embodiment. However, in the manufacturing method of the semiconductor memory device according to the fifth embodiment, the openings 150A are formed at the positions corresponding to the electrodes 510 and 520 in the process described with reference to FIGS. 13 and 14.

[Read Operation]

Figure 61:
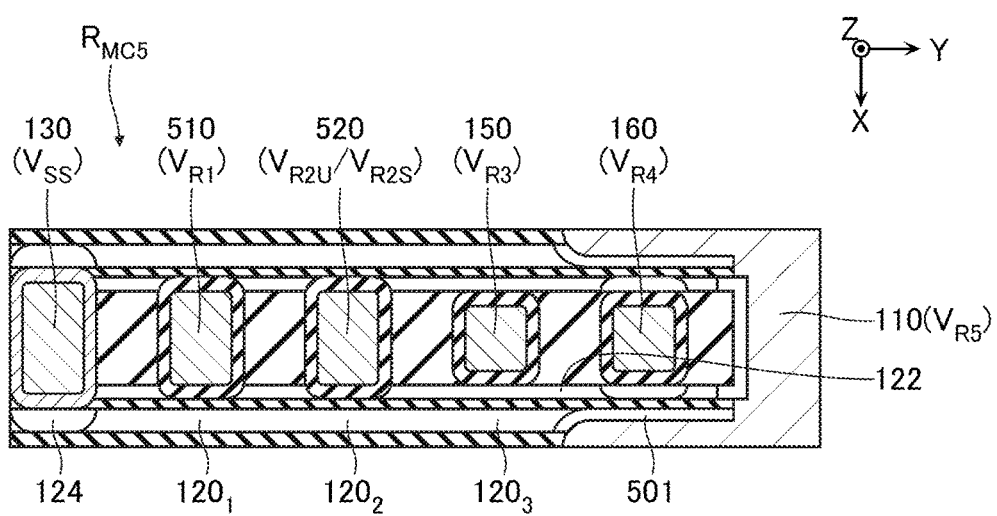
FIG. 61 is a schematic plan view for describing a read operation of the semiconductor memory device according to the fifth embodiment.
Figure 62:
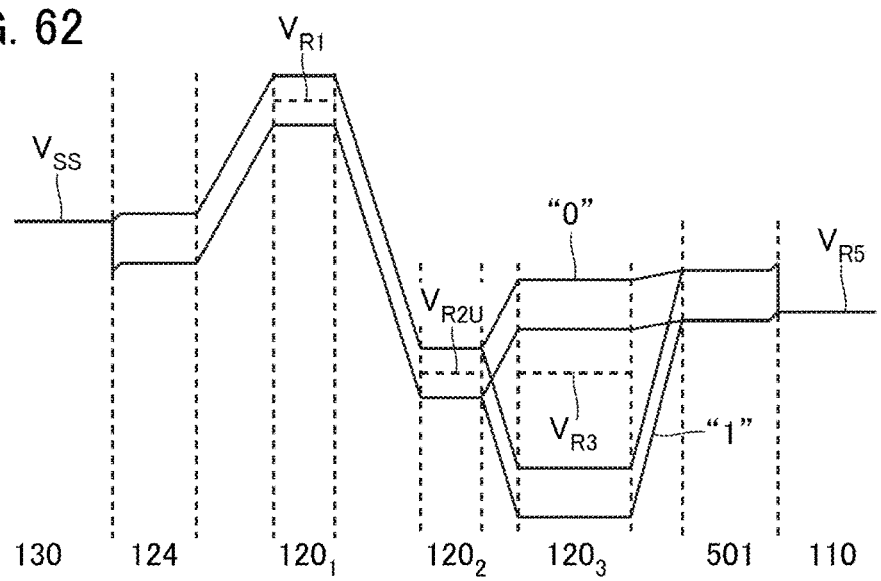
FIG. 62 is a schematic energy band diagram for describing the read operation.
Figure 63:
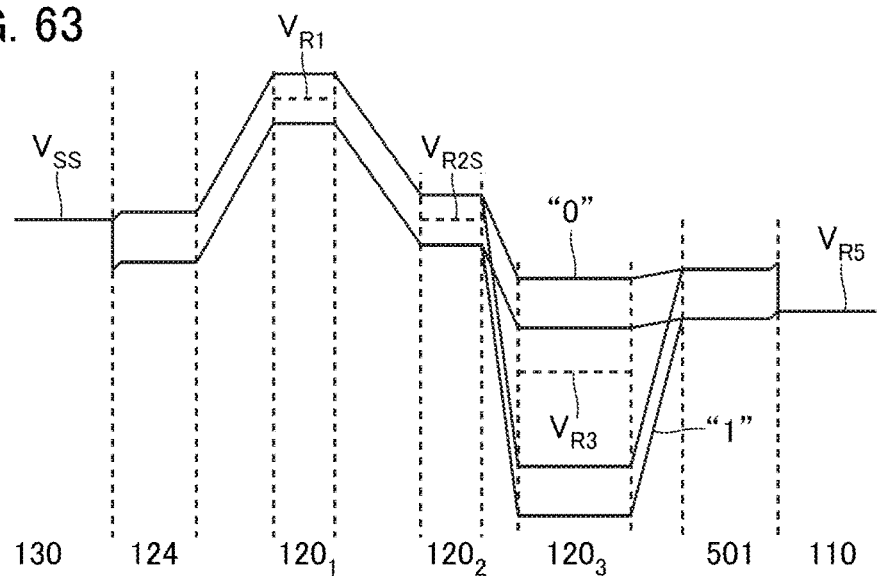
FIG. 63 is a schematic energy band diagram for describing the read operation.

Next, with reference to FIG. 61 to FIG. 63, a read operation of the semiconductor memory device according to the embodiment is described. FIG. 61 is a schematic plan view for describing the read operation. FIGS. 62 and 63 are schematic energy band diagrams for describing the read operation.

In FIG. 61, a region opposed to the electrode 510 of the semiconductor layer 120 is indicated as a region $120_1$. A region opposed to the electrode 520 of the semiconductor layer 120 is indicated as a region $120_2$. A region opposed to the semiconductor layer 122 of the semiconductor layer 120 is indicated as a region $120_3$. In FIGS. 62 and 63, an electric potential at each region in the semiconductor layer 120 is indicated. FIG. 62 corresponds to the semiconductor layer 120 in an unselected memory cell. FIG. 63 corresponds to the semiconductor layer 120 in a selected memory cell.

As illustrated in FIG. 61 to FIG. 63, in the read operation of the semiconductor memory device according to the embodiment, for example, the ground voltage $V_{ss}$ is applied to the electrode 130.

A voltage $V_{R1}$ is applied to the electrode 510. For example, in focusing on the N-channel type field effect transistor where the electrode 510 and the semiconductor layer 120 are set to be the gate electrode and the channel region respectively, a difference between the voltage $V_{R1}$ and the ground voltage $V_{ss}$ is smaller than the threshold voltage of the transistor. Consequently, an electrical potential gradient relative to electrons is formed between the impurity region 124 and the region $120_1$ of the semiconductor layer 120, and an electron channel is not formed in the region $120_1$.

A voltage $V_{R5}$ is applied to the conductive layer 110. The voltage $V_{R5}$ is larger than the ground voltage $V_{ss}$.

A voltage $V_{R4}$ is applied to the electrode 160. For example, in focusing on the N-channel type field effect transistor where the electrode 160 and the semiconductor layer 125 are set to be the gate electrode and the channel region respectively, a difference between the voltage $V_{R4}$ and the voltage $V_{R5}$ is smaller than the threshold voltage of the transistor. Consequently, the semiconductor layer 122 is electrically separated from the conductive layer 110.

A voltage $V_{R3}$ is applied to the electrode 150. For example, the P-channel type field effect transistor where the electrode 150 is set to be the gate electrode, and the semiconductor layer 120 is set to be the channel region is focused. In this case, for example, when the data "0" has been stored in the memory cell, a difference between the voltage $V_{R3}$ and the voltage $V_{R5}$ is smaller than the threshold voltage of the transistor. Consequently, in a part corresponding to the memory cell where the data "0" has been stored, a hole channel is formed in the region $120_3$ of the semiconductor layer 120. On the other hand, for example, when the data "1" is stored in the memory cell, the difference between the voltage $V_{R3}$ and the voltage $V_{R5}$ is larger than the threshold voltage of the transistor. Consequently, in a part corresponding to the memory cell where the data "1" is stored, an electrical potential gradient relative to holes is formed between the impurity region 501 and the region $120_3$ of the semiconductor layer 120, and the hole channel is not formed in the region $120_3$. Therefore, no current flows through the memory cell where the data "1" has been stored.

A voltage $V_{R2U}$ is applied to the electrode 520 connected to the unselected memory cell. For example, in focusing on the P-channel type field effect transistor where the electrode 520 and the semiconductor layer 120 are set to be the gate electrode and the channel region respectively, a difference between the voltage $V_{R2U}$ and the voltage $V_{R5}$ is larger than the threshold voltage of the transistor. Consequently, in a part corresponding to the unselected memory cell where the data "0" has been stored, an electrical potential gradient relative to the holes is formed between the region $120_3$ and the region $120_2$ of the semiconductor layer 120, and the hole channel is not formed in the region $120_2$. Therefore, no current flows through the unselected memory cell.

A voltage $V_{R2S}$ is applied to the electrode 520 connected to the selected memory cell. For example, in focusing on the P-channel type field effect transistor where the electrode 520, and the semiconductor layer 120 are set to be the gate electrode and the channel region respectively, a difference between the voltage $V_{R2S}$ and the voltage $V_{R5}$ is smaller than the threshold voltage of the transistor. Consequently, in a part corresponding to the selected memory cell where the data "0" has been stored, the hole channel is formed in the regions $120_3$ and $120_2$ of the semiconductor layer 120. Thus, the holes supplied from the conductive layer 110 reach the region $120_1$ via the impurity region 501 and the regions $120_3$ and $120_2$ to be accumulated. The accumulated holes raise the electric potential of the region $120_1$, and thus, the electrons flow from the electrode 130 into the region $120_3$ to lower the electric potential of the region $120_3$. In this way, the holes and the electrons perform a positive feedback operation lowering a barrier one another, and thus, finally, the whole semiconductor layer 120 operates as a PIN diode in a forward bias. Therefore, the current flows through the selected memory cell where the data "0" has been stored.

In addition, before execution of the read operation, to the electrode 130, a voltage larger than the ground voltage $V_{ss}$ may be applied. Thus, electric charge accumulated in the semiconductor layer 120 can be discharged to ensure high accuracy of the read operation.

[Write Operation]

Figure 64:
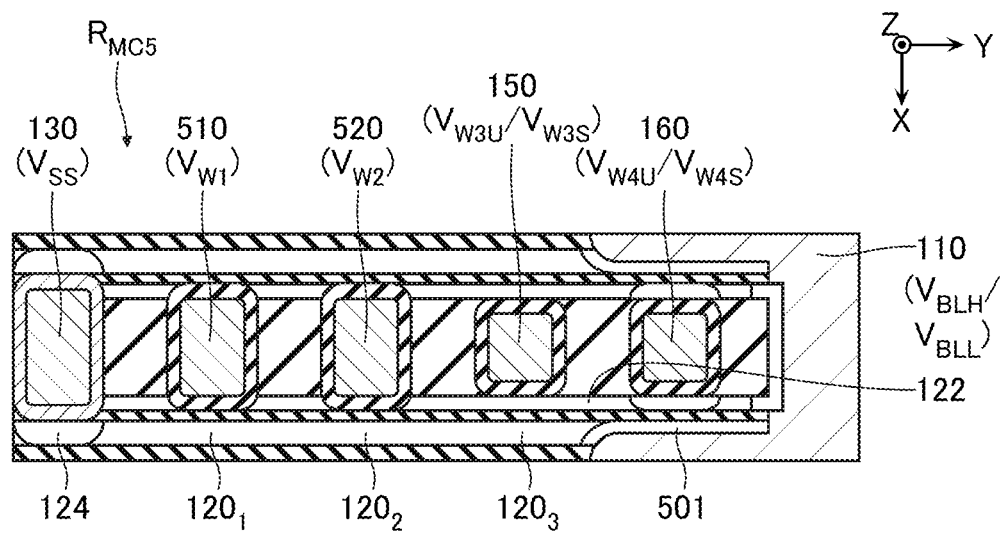
FIG. 64 is a schematic plan view for describing a write operation of the semiconductor memory device according to the fifth embodiment.

Next, with reference to FIG. 64, a write operation of the semiconductor memory device according to the embodiment is described. FIG. 64 is a schematic plan view for describing the write operation.

As illustrated in FIG. 64, in the write operation of the semiconductor memory device according to the embodiment, for example, a voltage $V_{W1}$ is applied to the electrode 510. For example, in focusing on the N-channel type field effect transistor where the electrode 510 is set to be the gate electrode, the voltage $V_{W1}$ is smaller than the threshold voltage of the transistor. Consequently, the electrical potential gradient relative to the electrons is formed between the impurity region 124 and the region $120_1$ of the semiconductor layer 120, no electron channel is formed in the region $120_1$.

Furthermore, in storing the data "1" in the selected memory cell, the voltage $VB_{LH}$ is applied to the conductive layer 110. In storing the data "0" in the selected memory cell, the voltage $V_{BLL}$ is applied to the conductive layer 110.

A voltage $V_{W4S}$ is applied to the electrode 160 connected to the selected memory cell. For example, in focusing on the N-channel type field effect transistor where the electrode 160 is set to be the gate electrode, differences between the voltage $V_{W4S}$ and the voltages $V_{BLH}$ and $V_{BLL}$ are larger than the threshold voltage of the transistor. Consequently, the semiconductor layer 122 is electrically conducted with the conductive layer 110.

Voltages $V_{W4U}$ are applied to the other electrodes 160. For example, in focusing on the N-channel type field effect transistor where the electrode 160 is set to be the gate electrode, differences between the voltage $V_{W4U}$ and the voltages $V_{BLH}$ and $V_{BLL}$ are smaller than the threshold voltage of the transistor. Consequently, the semiconductor layer 122 is electrically separated from the conductive layer 110.

A voltage $V_{W3S}$ is applied to the electrode 150 connected to the selected memory cell. For example, the voltage $V_{W3S}$ may be a voltage having a magnitude approximately the same as the voltage $V_{BLL}$ and may be a voltage larger than the voltage $V_{BLL}$ and smaller than the voltage $V_{BLH}$. In association with this, when the voltage $V_{BLH}$ is applied to the conductive layer 110, positive electric charge is accumulated in a capacitor where the electrode 150 is set to be one electrode and the semiconductor layer 122 is set to be the other electrode. On the other hand, when the voltage $V_{BLL}$ is applied to the conductive layer 110, no electric charge is accumulated, or negative electric charge is accumulated in the capacitor.

Voltage $V_{W3U}$ are applied to the other electrodes 150. The voltage $V_{W3U}$ may be, for example, a voltage having a magnitude approximately the same as the voltage $V_{BLL}$ or may be a voltage having a magnitude approximately the same as the voltage $V_{BLH}$.

A voltage $V_{W2}$ is applied to the electrode 520. For example, in focusing the P-channel type field effect transistor where the electrode 520 is set to be the gate electrode, differences between the voltage $V_{W2}$ and the voltages $V_{BLH}$ and $V_{BLL}$ are larger than the threshold voltage of the transistor. Consequently, the electrical potential gradient relative to the holes is formed between the impurity region 124 and the region $120_1$ of the semiconductor layer 120, no hole channel is formed in the region $120_1$.

[Effect]

In the semiconductor memory device according to the first embodiment, a part of the semiconductor layer 120 (the impurity region 123 in the example in FIG. 2) is opposed to the semiconductor layer 125 via the insulating layer 121. In such configuration, the electron channel is formed in the semiconductor layer 125 at a timing when the voltage is applied to the semiconductor layer 120 in the read operation, and electric charge in the semiconductor layer 122 is sometimes discharged. Thus, the data stored in the memory cell MC (FIG. 3) is sometimes corrupted.

In order to reduce such phenomenon, for example, it is conceivable that the electric potential of the semiconductor layer 122 during the read operation is raised to increase an energy barrier between the semiconductor layer 122 and the semiconductor layer 125 by adjusting an impurity concentration in the semiconductor layer 122 or raising the voltage of the electrode 150 during the read operation. However, when the electric potential of the semiconductor layer 122 during the read operation is raised, the N-channel type field effect transistor (the transistor Tr2 in FIG. 3) where the region $120_3$ of the semiconductor layer 120 is set to be the channel region easily turns ON. In such case, in a selected memory cell MC where the data "0" has been stored, a leakage current is possibly generated. In order to reduce such leakage current, for example, it is conceivable that the threshold voltage of the N-channel type field effect transistor (the transistor Tr2 in FIG. 3) is increased by doping P-type impurities such as boron (B) into the semiconductor layer 120 and relatively increasing a concentration of the impurities. However, in such case, the current flowing in the selected memory cell where the data "1" has been stored decreases, and determination of the data possibly becomes difficult.

Thus, in the semiconductor memory device according to the fifth embodiment, as described with reference to FIG. 60, the conductive layer 110 is connected to the semiconductor layer 120 via the impurity region 501 containing the P-type impurities, and the electrode 130 is connected to the semiconductor layer 120 via the impurity region 124 containing the N-type impurities. Furthermore, the two electrodes 510 and 520 are arranged between the electrodes 130 and 150. In such configuration, a positive feedback operation where an electron current and a hole current amplify with one other occurs in the selected memory cell during the read operation. Thus, it is possible to flow the relatively large current to the selected memory cell. It is possible to preferably reduce the leakage current in an unselected memory cell by preferably/appropriately adjusting the electric potentials of the regions $120_1$ and $120_2$ of the semiconductor layer 120 by the two electrodes 510 and 520. Therefore, the semiconductor memory device that can easily determine the data of the selected memory cell to preferably operate can be achieved.

Sixth Embodiment

[Configuration]

Figure 65:
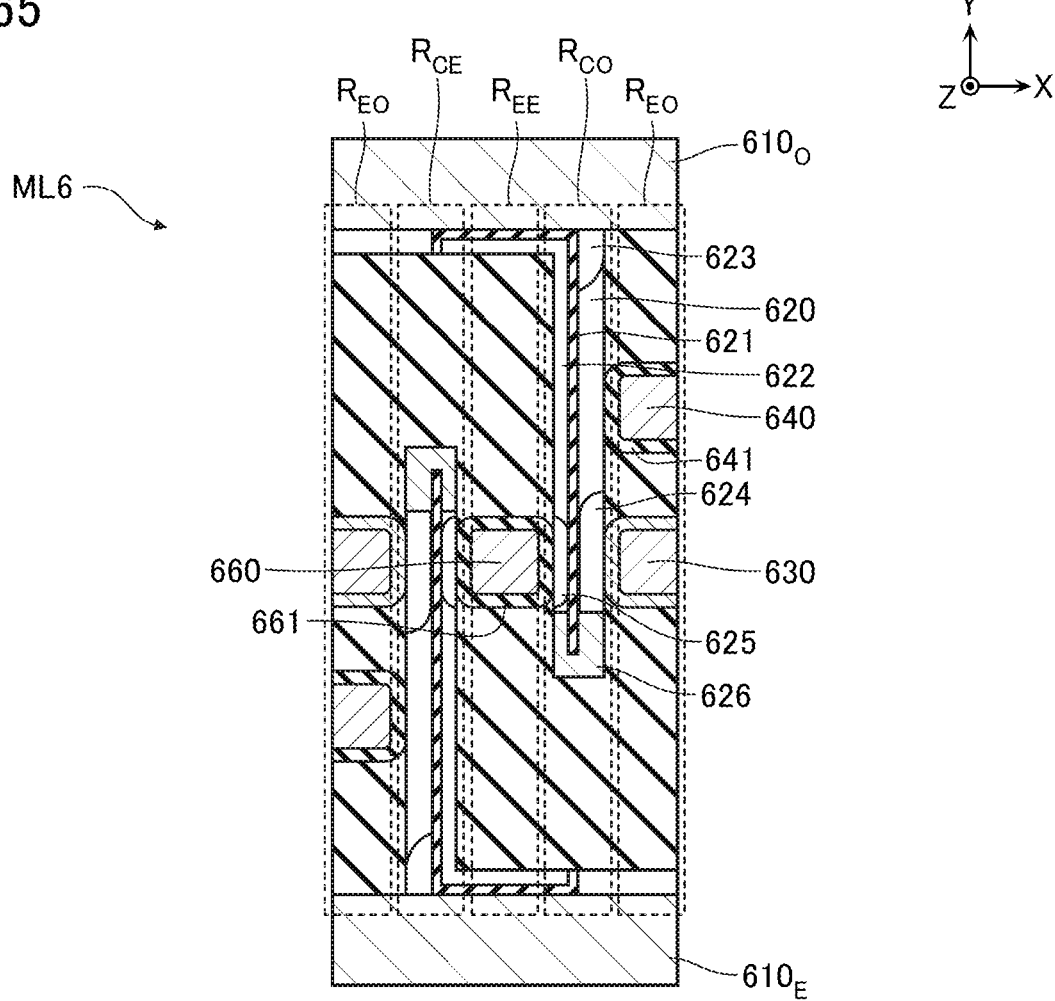
FIG. 65 is a schematic plan view illustrating a part of a configuration of a semiconductor memory device according to a sixth embodiment.
Figure 66:
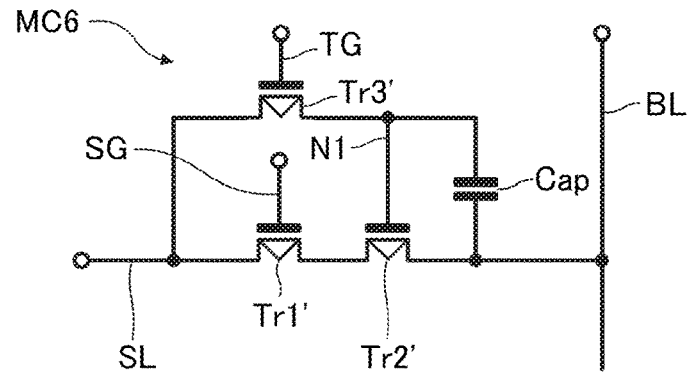
FIG. 66 is a schematic circuit diagram illustrating a part of the configuration of the semiconductor memory device.

FIG. 65 is a schematic plan view illustrating a part of a configuration of a semiconductor memory device according to the sixth embodiment. FIG. 66 is a schematic circuit diagram illustrating a part of the configuration of the semiconductor memory device according to the embodiment.

The semiconductor memory device according to the sixth embodiment is basically configured similarly to the semiconductor memory device according to the first embodiment. However, the semiconductor memory device according to the sixth embodiment includes a memory layer ML6 instead of the memory layer ML.

As illustrated in FIG. 65, the memory layer ML6 includes a pair of conductive layers $610_O$ and $610_E$ extending in the X direction and arranged in the Y direction. The memory layer ML6 includes a plurality of channel semiconductor regions $R_{CE}$ and $R_{CO}$ alternately arranged in the X direction in the region between them. Between the two channel semiconductor regions $R_{CE}$ and $R_{CO}$ mutually adjacent in the X direction, an electrode region $R_{EO}$ or an electrode region $R_{EE}$ is disposed. The electrode regions $R_{EO}$ and $R_{EE}$ are alternately arranged in the X direction.

In the channel semiconductor region $R_{CO}$, the memory layer ML6 includes a semiconductor layer 620 extending in the Y direction. The memory layer ML6 includes an insulating layer 621 disposed on a side surface in the X direction of the semiconductor layer 620 and a semiconductor layer 622 disposed on a side surface in the X direction of the insulating layer 621. The semiconductor layer 620 has one end portion in the Y direction where an impurity region 623 is disposed. The semiconductor layer 620 is connected to the conductive layer $610_O$ via the impurity region 623. The semiconductor layer 620 has the other end portion in the Y direction where an impurity region 624 is disposed. The semiconductor layer 622 has one end portion in the Y direction insulated from the semiconductor layer 620 via the insulating layer 621. The semiconductor layer 622 has the other end portion in the Y direction where a semiconductor layer 625 is disposed. At the other end portions of the semiconductor layers 620 and 622, a conductive layer 626 connected to them is disposed. The semiconductor layer 620 is connected to the conductive layer 626 via the impurity region 624. The semiconductor layer 622 is connected to the conductive layer 626 via the semiconductor layer 625.

The configuration of the memory layer ML6 in the channel semiconductor region $R_{CE}$ is basically similar to the configuration of the memory layer ML6 in the channel semiconductor region $R_{CO}$. However, the semiconductor layer 620 in the channel semiconductor region $R_{CE}$ is connected to the conductive layer $610_E$, not to the conductive layer $610_O$.

In the electrode region $R_{EO}$, two electrodes 630 and 640 arranged in the Y direction are disposed. On an outer peripheral surface of the electrode 640, an insulating layer 641 is disposed. The electrode 630 is connected to the impurity region 624 of the semiconductor layer 620. The electrode 640 is opposed to semiconductor layer 620 via the insulating layer 641. The electrodes 630 and 640 penetrate a plurality of the memory layers ML6 and extend in the Z direction.

In the electrode region $R_{EE}$, an electrode 660 is disposed. On an outer peripheral surface of the electrode 660, an insulating layer 661 is disposed. The electrode 660 is opposed to two semiconductor layers 625 arranged in the X direction, via the insulating layer 661. In the X direction, the electrode 660 is arranged with the electrode 630, the impurity region 624 of the semiconductor layer 620, and the semiconductor layer 625. The electrode 660 penetrates the plurality of memory layers ML6 and extends in the Z direction.

The conductive layers $610_O$ and $610_E$ are configured similarly to the conductive layer 110. The semiconductor layer 620 is basically configured similarly to the semiconductor layer 120. However, the impurity regions 623 and 624 of the semiconductor layer 620 may contain N-type impurities such as phosphorus (P) or may contain P-type impurities such as boron (B). The insulating layer 621 is configured similarly to the insulating layer 121. The semiconductor layer 622 is configured similarly to the semiconductor layer 122. The semiconductor layer 625 is configured similarly to the semiconductor layer 125. The electrodes 630, 640, and 660 are configured similarly to the electrodes 130, 140, and 160. The insulating layers 641 and 661 are configured similarly to the insulating layers 141 and 161.

Each configuration in the channel semiconductor region $R_{CE}$ or the channel semiconductor region $R_{CO}$ and each configuration in the pair of electrode regions $R_{EO}$ and $R_{EE}$ mutually adjacent to them configure a memory cell MC6 as illustrated in FIG. 66. The memory cell MC6 includes the transistor Tr1' and Tr2" connected in series between the bit line BL and the source line SL. A gate electrode of the transistor Tr1' is connected to the select gate line SG. The memory cell MC6 includes the node $N_1$ connected to a gate electrode of the transistor Tr2", the transistor Tr3" connected between the node $N_1$ and the source line SL, and the capacitor Cap connected between the node $N_1$ and the bit line BL. A gate electrode of the transistor Tr3" is connected to the transfer gate line TG.

[Read Operation]

Figure 67:
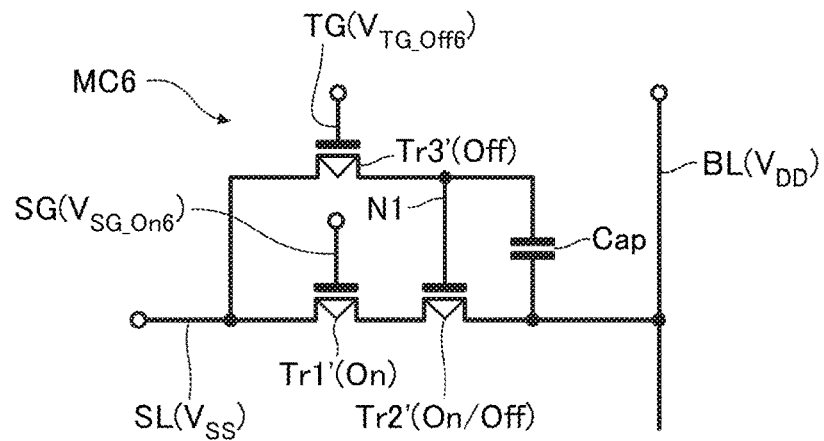
FIG. 67 is a schematic circuit diagram for describing a read operation of the semiconductor memory device according to the sixth embodiment.

Next, with reference to FIG. 67, a read operation of the semiconductor memory device according to the embodiment is described. FIG. 67 is a schematic circuit diagram for describing the read operation.

In the read operation of the semiconductor memory device according to the embodiment, the voltage $V_{DD}$ is applied to the bit line BL.

When positive electric charge has been accumulated in the node $N_1$, the transistor Tr2" turns OFF. On the other hand, when no electric charge has been accumulated in the node $N_1$, the transistor Tr2" turns ON.

A voltage $V_{SG\_on6}$ is applied to the select gate line SG connected to a selected memory cell MC6. A difference between the voltage $V_{SG\_on6}$ and the voltage $V_{DD}$ is smaller than the threshold voltage of the transistor Tr1". Thus, the transistor Tr1" in the selected memory cell MC6 turns ON.

Voltage $V_{SG\_off6}$ are applied to the other select gate lines SG. A difference between the voltage $V_{SG\_off6}$ and the voltage $V_{DD}$ is larger than the threshold voltage of the transistor Tr1". Thus, the transistor Tr1" in an unselected memory cell MC6 turns OFF.

The ground voltage $V_{ss}$ is applied to the source line SL.

A voltage $V_{TG\_off6}$ is applied to the transfer gate line TG. A difference between the voltage $V_{TG\_off6}$ and the ground voltage $V_{ss}$ is larger than the threshold voltage of the transistor Tr3". Thus, the transistor Tr3" turns OFF.

[Write Operation]

Figure 68:
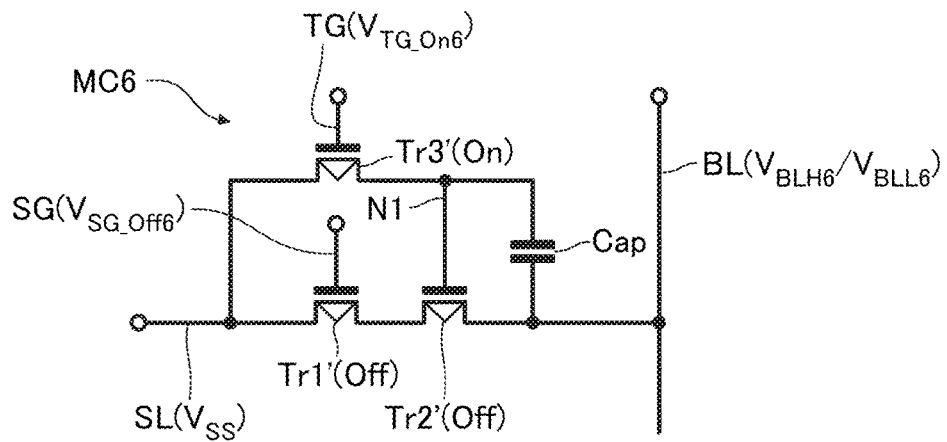
FIG. 68 is a schematic circuit diagram for describing a write operation of the semiconductor memory device according to the sixth embodiment.

Next, with reference to FIG. 68, the write operation of the semiconductor memory device according to the embodiment is described. FIG. 68 is a schematic circuit diagram for describing the write operation.

In the write operation of the semiconductor memory device according to the embodiment, in storing the data "1" in the memory cell MC6, a voltage $V_{BLL6}$ is applied to the bit line BL. On the other hand, in storing the data "0" in the memory cell MC6, a voltage $V_{BLH6}$ is applied to the bit line BL. The voltage $V_{BLL6}$ is, for example, smaller than the voltage $V_{BLH6}$.

The voltage $V_{SG\_off6}$ is applied to the select gate line SG to turn OFF the transistor Tr1'.

The ground voltage $V_{ss}$ is applied to the source line SL.

A voltage $V_{TG\_on6}$ is applied to the transfer gate line TG connected to the selected memory cell MC6. A difference between the voltage $V_{TG\_On6}$ and the ground voltage $V_{ss}$ is smaller than the threshold voltage of the transistor Tr3'. Thus, the transistor Tr3' in the selected memory cell MC6 turns ON.

The voltages $V_{TG\_Off6}$ are applied to the other transfer gate lines TG to turn OFF the transistor Tr3' in an unselected memory cell MC6.

Here, when the voltage $V_{BLL6}$ has been applied to the bit line BL, electric charge is accumulated in the capacitor Cap between the node $N_1$ and the bit line BL (between the semiconductor layers 620 and 622 in FIG. 65). On the other hand, when the voltage $V_{BLH6}$ has been applied to the bit line BL, no electric charge is accumulated in the capacitor Cap, or electric charge of the reversed polarity is accumulated in the capacitor Cap.

[Effect]

As described above, in the semiconductor memory device (FIG. 2) according to the first embodiment, the electron channel is formed in the semiconductor layer 125 at the timing when the voltage is applied to the semiconductor layer 120 in the read operation, and the data stored in the memory cell is sometimes corrupted.

Thus, in the semiconductor memory device according to the sixth embodiment, as described with reference to FIG. the side surface of one side in the X direction of the semiconductor layer 625 is opposed to the electrode 660, and the side surface of the other side in the X direction of the semiconductor layer 625 is opposed to the impurity region 624 of the semiconductor layer 620. In such configuration, for example, by applying the ground voltage $V_{ss}$ to the electrode 660 in the read operation, the formation of the channel in the semiconductor layer 625 can be reduced in the read operation. Therefore, the semiconductor memory device that preferably operates can be achieved.

[others]

The semiconductor memory devices according to the first embodiment to the sixth embodiment have been described above. However, these configurations are merely examples, and the specific configuration is adjustable, as necessary.

For example, the semiconductor memory device according to the third embodiment may include the impurity region 126 similar to the first embodiment, instead of the impurity region 226 similar to the second embodiment.

Furthermore, for example, the semiconductor memory device according to the fourth embodiment may include the impurity region 226 similar to the second embodiment, instead of the impurity region 126 similar to the first embodiment. The semiconductor memory device according to the fourth embodiment may include the impurity regions 323 and 324 similar to the third embodiment, instead of the impurity regions 123 and 124 similar to the first embodiment.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a bit line;
   a source line;
   a first transistor and a second transistor connected in series between the bit line and the source line;
   a first wiring connected to a gate electrode of the second transistor;
   a third transistor connected between the first wiring and the bit line;
   a capacitor connected to the first wiring;
   a first signal line connected to a gate electrode of the first transistor;
   a second signal line connected to the capacitor; and
   a third signal line connected to a gate electrode of the third transistor, wherein at a first timing:
   a first voltage is applied to the bit line,
   a second voltage is applied to the first signal line,
   a third voltage is applied to the second signal line, and
   a fourth voltage is applied to the third signal line, at a second timing:

a fifth voltage different from the first voltage is applied to the source line,
a sixth voltage larger than the second voltage is applied to the first signal line,
a seventh voltage larger than the third voltage is applied to the second signal line, and
the fourth voltage is applied to the third signal line, and
at a third timing:
the second voltage is applied to the first signal line,
the third voltage is applied to the second signal line, and
an eighth voltage larger than the fourth voltage is applied to the third signal line, wherein
the fifth voltage is smaller than the first voltage.

2. The semiconductor memory device according to claim 1, wherein when data stored before the first timing is assumed to be first data, and data stored after the third timing is assumed to be third data,
the third data is data obtained by inversing the first data.

3. The semiconductor memory device according to claim 1, wherein in a read operation:
a ninth voltage is applied to the source line,
the sixth voltage is applied to the first signal line,
a tenth voltage is applied to the bit line,
the ninth voltage is different from the tenth voltage, and
the sixth voltage is larger than a smaller voltage of the ninth voltage and the tenth voltage.

4. The semiconductor memory device according to claim 1, wherein in a read operation:
a ninth voltage is applied to the source line,
the sixth voltage is applied to the first signal line,
a tenth voltage is applied to the bit line,
the ninth voltage is different from the tenth voltage, and
the sixth voltage is smaller than a larger voltage of the ninth voltage and the tenth voltage.

5. The semiconductor memory device according to claim 2, wherein in a write operation:
the first voltage is applied to the bit line,
the eighth voltage is applied to the third signal line, and
the eighth voltage is larger than the first voltage.

6. The semiconductor memory device according to claim 1, wherein in a write operation:
the first voltage is applied to the bit line,
the eighth voltage is applied to the third signal line, and
the eighth voltage has a magnitude equal to or less than the first voltage.

7. The semiconductor memory device according to claim 1, comprising a fourth transistor disposed between the source line and the first transistor.

8. The semiconductor memory device according to claim 7, wherein in a read operation:
an eleventh voltage is applied to the source line,
a twelfth voltage is applied to a gate electrode of the fourth transistor,
a thirteenth voltage is applied to the first signal line,
a fourteenth voltage is applied to the bit line,
the fourteenth voltage is larger than the thirteenth voltage and the eleventh voltage, and
the twelfth voltage is smaller than the thirteenth voltage and the eleventh voltage.

9. The semiconductor memory device according to claim 1, wherein a channel region of the third transistor includes an oxide semiconductor.

10. The semiconductor memory device according to claim 9, wherein
the oxide semiconductor includes at least one of indium gallium zinc oxide (InGaZnO), indium oxide (InO), indium zinc oxide (InZnO), zinc oxide (ZnO), indium gallium silicon oxide (InGaSiO), indium aluminum zinc oxide (InAlZnO), indium tungsten oxide (InWO), indium tin oxide (InSnO), tin oxide (SnO), copper oxide (CuO), titanium oxide (TiO), and tungsten oxide (WO).

11. A semiconductor memory device comprising:
a bit line;
a source line;
a first transistor and a second transistor connected in series between the bit line and the source line;
a first wiring connected to a gate electrode of the second transistor;
a third transistor connected between the first wiring and the bit line;
a capacitor connected to the first wiring;
a first signal line connected to a gate electrode of the first transistor;
a second signal line connected to the capacitor; and
a third signal line connected to a gate electrode of the third transistor, wherein at a first timing:
a first voltage is applied to the bit line,
a second voltage is applied to the first signal line,
a third voltage is applied to the second signal line, and
a fourth voltage is applied to the third signal line,
at a second timing:
a fifth voltage different from the first voltage is applied to the source line,
a sixth voltage larger than the second voltage is applied to the first signal line,
a seventh voltage larger than the third voltage is applied to the second signal line, and
the fourth voltage is applied to the third signal line, and
at a third timing:
the second voltage is applied to the first signal line,
the third voltage is applied to the second signal line, and
an eighth voltage larger than the fourth voltage is applied to the third signal line, wherein
the fifth voltage is larger than the first voltage.

12. The semiconductor memory device according to claim 11, wherein when data stored before the first timing is assumed to be first data, and data stored after the third timing is assumed to be third data,
the third data coincides with the first data.

13. The semiconductor memory device according to claim 11, wherein in a read operation:
a ninth voltage is applied to the source line,
the sixth voltage is applied to the first signal line,
a tenth voltage is applied to the bit line,
the ninth voltage is different from the tenth voltage, and
the sixth voltage is larger than a smaller voltage of the ninth voltage and the tenth voltage.

14. The semiconductor memory device according to claim 11, wherein in a read operation:
a ninth voltage is applied to the source line,
the sixth voltage is applied to the first signal line,
a tenth voltage is applied to the bit line,
the ninth voltage is different from the tenth voltage, and
the sixth voltage is smaller than a larger voltage of the ninth voltage and the tenth voltage.

15. The semiconductor memory device according to claim 11, wherein in a write operation:
the first voltage is applied to the bit line,
the eighth voltage is applied to the third signal line, and
the eighth voltage is larger than the first voltage.

16. The semiconductor memory device according to claim 11, wherein in a write operation:
the first voltage is applied to the bit line,
the eighth voltage is applied to the third signal line, and
the eighth voltage has a magnitude equal to or less than the first voltage.

17. The semiconductor memory device according to claim 11, comprising a fourth transistor disposed between the source line and the first transistor.

18. The semiconductor memory device according to claim 17, wherein in a read operation:
an eleventh voltage is applied to the source line,
a twelfth voltage is applied to a gate electrode of the fourth transistor,
a thirteenth voltage is applied to the first signal line,
a fourteenth voltage is applied to the bit line,
the fourteenth voltage is larger than the thirteenth voltage and the eleventh voltage, and
the twelfth voltage is smaller than the thirteenth voltage and the eleventh voltage.

19. The semiconductor memory device according to claim 11, wherein a channel region of the third transistor includes an oxide semiconductor.

20. The semiconductor memory device according to claim 19, wherein
the oxide semiconductor includes at least one of indium gallium zinc oxide (InGaZnO), indium oxide (InO), indium zinc oxide (InZnO), zinc oxide (ZnO), indium gallium silicon oxide (InGaSiO), indium aluminum zinc oxide (InAlZnO), indium tungsten oxide (InWO), indium tin oxide (InSnO), tin oxide (SnO), copper oxide (CuO), titanium oxide (TiO), and tungsten oxide (WO).

* * * * *